US011699719B2

(12) United States Patent
Koga

(10) Patent No.: US 11,699,719 B2

(45) **Date of Patent: *Jul. 11, 2023**

(54) IMAGING ELEMENT, STACKED IMAGING ELEMENT, AND SOLID-STATE IMAGING DEVICE

(71) Applicant: SONY SEMICONDUCTOR SOLUTIONS CORPORATION, Kanagawa (JP)

(72) Inventor: Fumihiko Koga, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 115 days.

This patent is subject to a terminal disclaimer.

(21) Appl. No.: 17/308,455

(22) Filed: May 5, 2021

(65) Prior Publication Data

US 2021/0280629 A1 Sep. 9, 2021

Related U.S. Application Data

(63) Continuation of application No. 16/499,916, filed as application No. PCT/JP2018/005955 on Feb. 20, 2018, now Pat. No. 11,037,979.

(30) Foreign Application Priority Data

Apr. 11, 2017 (JP) ................................ 2017-078236

(51) Int. Cl.
*H01L 27/146* (2006.01)

(52) U.S. Cl.
CPC .. *H01L 27/14647* (2013.01); *H01L 27/14607* (2013.01); *H01L 27/14614* (2013.01); *H01L 27/14636* (2013.01); *H01L 27/1464* (2013.01)

(58) Field of Classification Search
CPC ......... H01L 27/14647; H01L 27/14607; H01L 27/14614; H01L 27/14636; H01L 27/1464
See application file for complete search history.

(56) References Cited

U.S. PATENT DOCUMENTS 10,050,070 B2 8/2018 Otake et al.
10,141,367 B2 11/2018 Tashiro
(Continued)

FOREIGN PATENT DOCUMENTS

JP H01050558 A 2/1989
JP S64-050558 2/1989
(Continued)

OTHER PUBLICATIONS

International Search Report and Written Opinion for International (PCT) Patent Application No. PCT/JP2018/005955, dated May 1, 2018, 9 pages.

(Continued)

*Primary Examiner* — Fernando L Toledo
*Assistant Examiner* — Neil R Prasad
(74) *Attorney, Agent, or Firm* — Sheridan Ross P.C.

(57) ABSTRACT

An imaging element has at least a photoelectric conversion section, a first transistor $TR_1$, and a second transistor $TR_2$, the photoelectric conversion section includes a photoelectric conversion layer 13, a first electrode 11, and a second electrode 12, the imaging element further has a first photoelectric conversion layer extension section 13A, a third electrode 51, and a fourth electrode 51C, the first transistor $TR_1$ includes the second electrode 12 that functions as one source/drain section, the third electrode that functions as a gate section 51, and the first photoelectric conversion layer extension section 13A that functions as the other source/drain section, and the first transistor $TR_1$ ($TR_{rst}$) is provided adjacent to the photoelectric conversion section.

13 Claims, 67 Drawing Sheets

(56) References Cited

U.S. PATENT DOCUMENTS

| | | | |
|---|---|---|---|
| 10,728,471 | B2 | 7/2020 | Tashiro |
| 11,037,979 | B2 * | 6/2021 | Koga ................ H01L 27/14607 |
| 2011/0049333 | A1 | 3/2011 | Yamashita |
| 2013/0033628 | A1 | 2/2013 | Yamaguchi |
| 2013/0083897 | A1 | 4/2013 | Ohta et al. |
| 2016/0037098 | A1 | 2/2016 | Lee et al. |
| 2017/0162617 | A1 | 6/2017 | Takahashi et al. |
| 2017/0294486 | A1 | 10/2017 | Yamaguchi |
| 2017/0338263 | A1 | 11/2017 | Yamaguchi |

FOREIGN PATENT DOCUMENTS

| | | | |
|---|---|---|---|
| JP | H05-063173 | | 3/1993 |
| JP | 2011049240 | A | 3/2011 |
| JP | 2011-138927 | | 7/2011 |
| JP | 2017055085 | A | 3/2017 |
| JP | 2017-108101 | | 6/2017 |
| KR | 20150106400 | A | 9/2015 |
| WO | WO 2014/112279 | | 7/2014 |

OTHER PUBLICATIONS

Notice of Allowance for U.S. Appl. No. 16/499,916, dated Jan. 27, 2021, 8 pages.

* cited by examiner

TR1rst
90
83
11
13
12
51B (12A)
51A
51
51D (82)
13A
51C
82
81
70
71
72
76
52B
52A
52C
53B
53A
53C
62
52
53
TR1SEL
TR1amp TR1 rst
TR1 amp
51A
51C
70B
70A
51
51D (82)
51B (12A)
13A
90
83
41
42
43
11
13
12
44
45C
45
TR2 trs
46A
46C
46
TR3 trs
52 (12B)
13B'
13B
52A
52D (82)
53B
53A
53C
53
TR1 SEL
82
81
75
74
73
70
71
72
76

POTENTIAL OF OTHER SOURCE/ DRAIN SECTION 53C
POTENTIAL OF CHANNEL FORMATION REGION 53A
POTENTIAL OF OTHER SOURCE/ DRAIN SECTION 52C
POTENTIAL OF CHANNEL FORMATION REGION 52A
POTENTIAL OF OTHER SOURCE/ DRAIN SECTION 51B
POTENTIAL OF CHANNEL FORMATION REGION 51A
TIME OF RESET
TIME OF CHARGE ACCUMULATION
TIME OF SIGNAL READING

F I G . 3 3
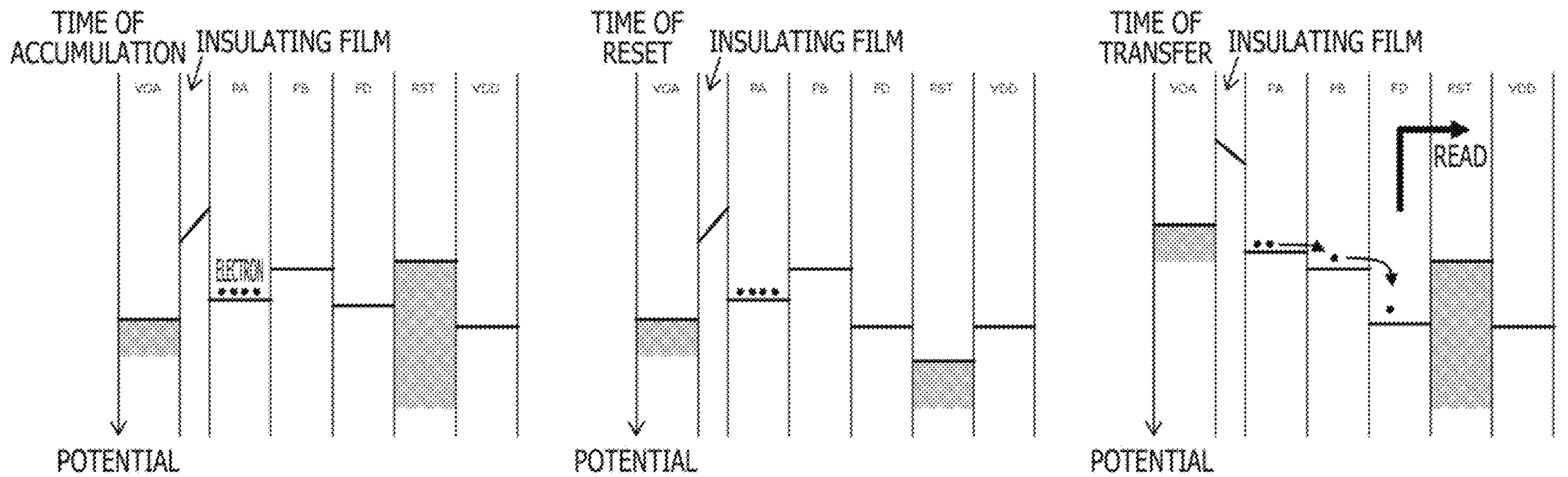
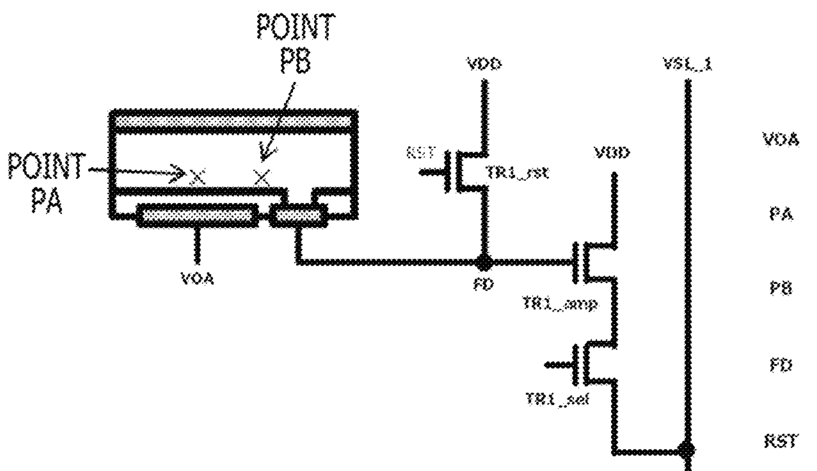
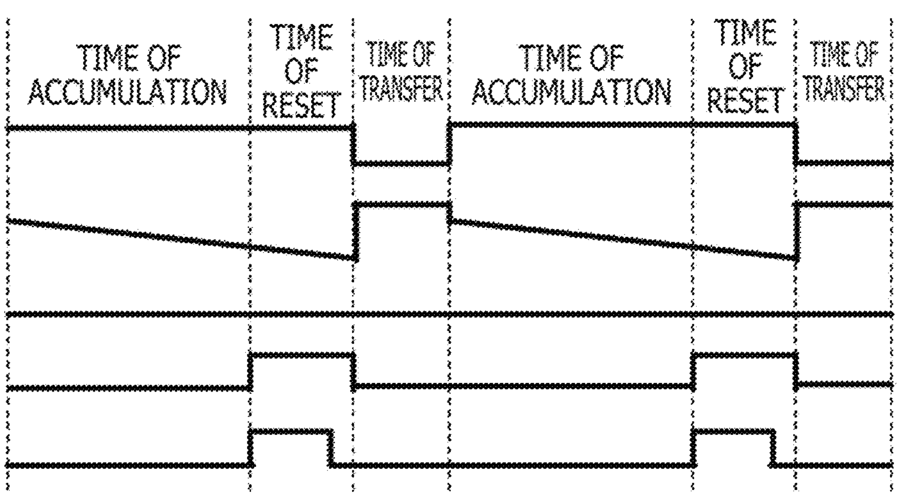

TIME OF ACCUMULATION
INSULATING FILM
ELECTRON
POTENTIAL
TIME OF RESET
INSULATING FILM
POTENTIAL
TIME OF TRANSFER
INSULATING FILM
READ
POTENTIAL
POINT PA
POINT PB
POINT PC
VOU
VOA
VOT
RST
VDD
TR1_rst
FD
VDD
TR1_amp
TR1_sel
VSL_1
TIME OF ACCUMULATION
TIME OF RESET
TIME OF TRANSFER
TIME OF ACCUMULATION
TIME OF RESET
TIME OF TRANSFER
VOA
VOT
PA
PB
PC
FD
RST

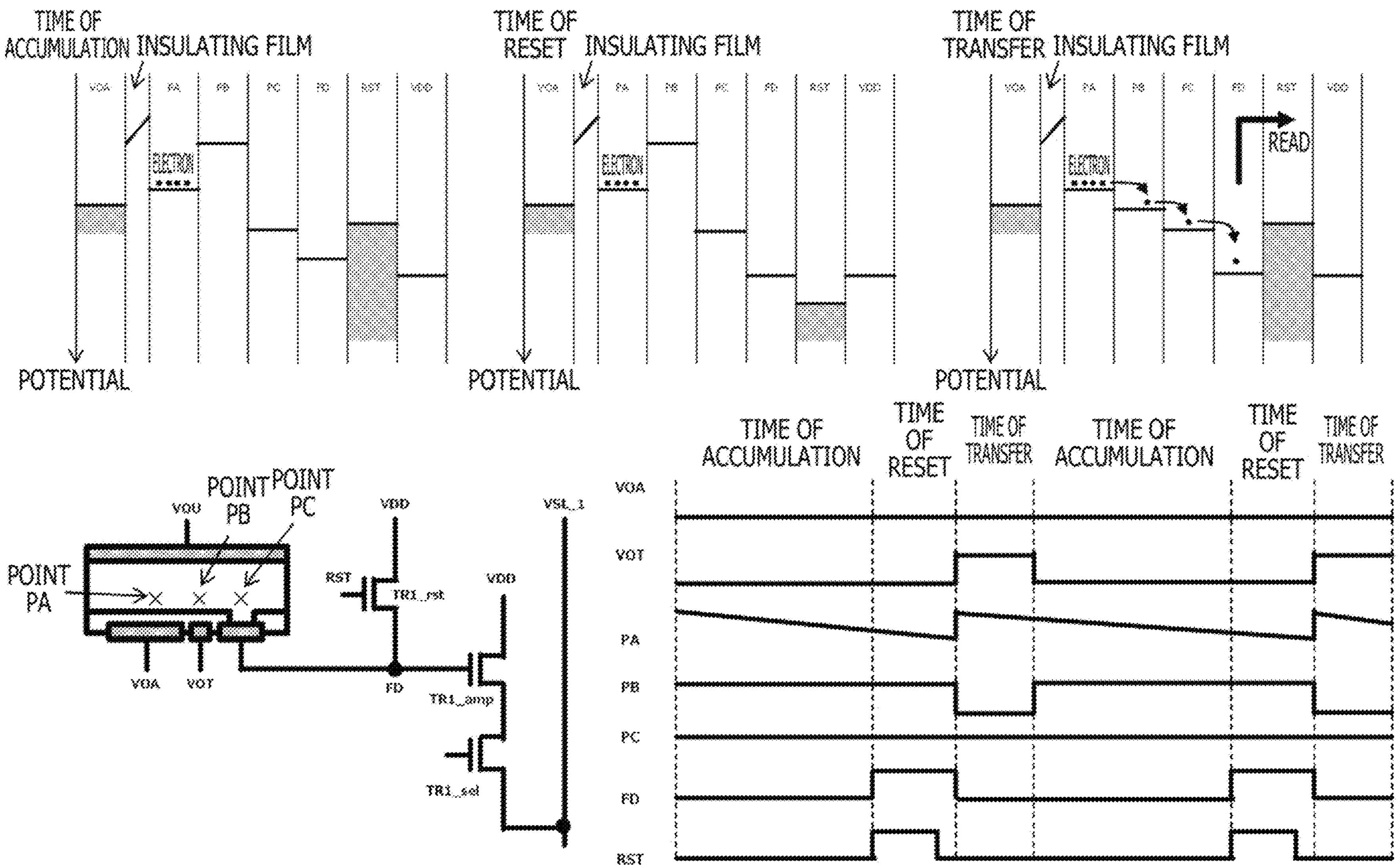
FIG. 44
TIME OF ACCUMULATION
INSULATING FILM
ELECTRON
POTENTIAL
TIME OF RESET
INSULATING FILM
ELECTRON
POTENTIAL
TIME OF TRANSFER
INSULATING FILM
ELECTRON
READ
POTENTIAL
POINT PA
POINT PB
POINT PC
VOU
VOA
VOT
RST
VDD
TR1_rst
FD
VDD
TR1_amp
TR1_sel
VSL_1
TIME OF ACCUMULATION
TIME OF RESET
TIME OF TRANSFER
TIME OF ACCUMULATION
TIME OF RESET
TIME OF TRANSFER
VOA
VOT
PA
PB
PC
FD
RST TIME OF TRANSFER
INSULATING FILM
READ
POTENTIAL
TIME OF ACCUMULATION
TIME OF RESET
TIME OF TRANSFER
POINT PA
POINT PB
POINT PC
POINT PD
VOU
VOA-C
VOA-A
VOA-B
VDD
RST
TR1_rst
FD
TR1_amp
TR1_sel
VSL_1
VOA1
VOA2
VOA3
PA
PB
PC
FD
RST

IMAGING ELEMENT, STACKED IMAGING ELEMENT, AND SOLID-STATE IMAGING DEVICE

CROSS REFERENCE TO RELATED APPLICATIONS

This application is a continuation of U.S. patent application Ser. No. 16/499,916, filed Oct. 1, 2019, which is a national stage application under 35 U.S.C. 371 and claims the benefit of PCT Application No. PCT/JP2018/005955, having an international filing date of 20 Feb. 2018, which designated the United States, which PCT application claimed the benefit of Japanese Patent Application No. 2017-078236, filed 11 Apr. 2017, the entire disclosures of each of which are incorporated herein by reference.

TECHNICAL FIELD

The present disclosure relates to an imaging element, a stacked imaging element, and a solid-state imaging device.

BACKGROUND ART

An imaging element that uses an organic semiconductor material in a photoelectric conversion layer can photoelectrically convert a specific color (wavelength range). In addition, for the reason of exhibiting such a feature, in a case of using the imaging element as that in a solid-state imaging device, it is possible to obtain a subpixel stacked structure (stacked imaging element) in which a combination of an on-chip color filter (OCCF) and the imaging element configures one subpixel and subpixels are arranged in two dimensions, and which is impossible to achieve by a conventional solid-state imaging device (refer to, for example, Japanese Patent Laid-open No. 2011-138927). Furthermore, because of no need of demosaicing, it is advantageously possible to prevent occurrence of a false color. In the following description, an imaging element having a photoelectric conversion section that is provided either on or above a semiconductor layer (for example, semiconductor substrate) will be often referred to as "first type imaging element" for the sake of convenience, the photoelectric conversion section that configures the first type imaging element will be often referred to as "first type photoelectric conversion section" for the sake of convenience, an imaging element that is provided within the semiconductor layer (for example, semiconductor substrate) will be often referred to as "second type imaging element" for the sake of convenience, and the photoelectric conversion section that configures the second type imaging element will be often referred to as "second type photoelectric conversion section" for the sake of convenience.

FIG. 67 depicts an example of a structure of a conventional stacked imaging element (stacked solid-state imaging device). In the example depicted in FIG. 67, a third photoelectric conversion section 331 and a second photoelectric conversion section 321 that are second type photoelectric conversion sections and that configure a third imaging element 330 and a second imaging element 320, which are second type imaging elements, are formed to be stacked within a semiconductor layer (which is specifically a semiconductor substrate) 370. Furthermore, a first photoelectric conversion section 310' that is a first type photoelectric conversion section is disposed above the semiconductor substrate 370 (specifically, disposed above the second imaging element 320). Here, the first photoelectric conversion section 310' has a second electrode 312, a photoelectric conversion layer 313 including an organic material, and a first electrode 311, and configures a first imaging element 310 that is a first type imaging element. The second photoelectric conversion section 321 and the third photoelectric conversion section 331 photoelectrically convert, for example, blue light and red light, respectively due to a difference in absorption coefficient. In addition, the first photoelectric conversion section 310' photoelectrically converts, for example, green light.

Charges generated by photoelectric conversion by the second photoelectric conversion section 321 and the third photoelectric conversion section 331 are temporarily accumulated in the second photoelectric conversion section 321 and the third photoelectric conversion section 331, then transferred to a second floating diffusion layer (Floating Diffusion) $FD_2$ and a third floating diffusion layer $FD_3$ by a vertical transistor (denoted as gate section 322) and a transfer transistor (denoted as gate section 332), and further output to an external readout circuit (not depicted). These transistors and the floating diffusion layers $FD_2$ and $FD_3$ are also formed in the semiconductor substrate 370.

Charges generated by photoelectric conversion by the first photoelectric conversion section 310' are accumulated in a first floating diffusion layer $FD_1$ formed in the semiconductor substrate 370 via a contact hole section 361 and an interconnection layer 362. Moreover, the first photoelectric conversion section 310' is also connected to a gate section 318 of an amplification transistor that converts a charge amount into a voltage via the contact hole section 361 and the interconnection layer 362. In addition, the first floating diffusion layer $FD_1$ configures part of a reset transistor (denoted as a gate section 317). It is noted that the reference number 371 denotes an element isolation region, the reference number 372 denotes an oxide film formed on a surface of the semiconductor substrate 370, the reference numbers 376 and 381 denote interlayer insulating layers, the reference number 383 denotes a protection layer, and the reference number 390 denotes an on-chip microlens.

Moreover, a solid-state imaging device having a structure in which a readout transistor is provided to be adjacent to a photodiode (photoelectric conversion section) provided above a semiconductor substrate is well known from Japanese Patent Laid-open No. 2011-049240. This readout transistor is configured from a gate, an n-type diffusion layer that configures the photodiode, and an n-type diffusion layer that configures a floating diffusion layer. In addition, an amplification transistor, a selection transistor, and a reset transistor are provided in the semiconductor substrate. Furthermore, providing the n-type diffusion layer that configures the floating diffusion layer above the semiconductor substrate makes it possible to suppress kTC noise.

CITATION LIST

Patent Literature

[PTL 1]
Japanese Patent Laid-Open No. 2011-138927
[PTL 2]
Japanese Patent Laid-Open No. 2011-049240

SUMMARY

Technical Problems

However, in the solid-state imaging device disposed in JP-A-2011-049240, an amplification transistor, a selection transistor, and a reset transistor that configure a signal scanning circuit are disposed in a semiconductor substrate section that is disposed separately from a photoelectric conversion section. This produces a problem that a structure of connecting a readout signal to the signal scanning circuit is complicated. In addition, the number of transistors in the semiconductor substrate section is large, which makes it difficult to achieve miniaturization of transistors.

An object of the present disclosure is, therefore, to provide an imaging element having a simpler configuration and a simpler structure, a stacked imaging element configured from such an imaging element, and a solid-state imaging device including such imaging elements or stacked imaging elements.

Solution to Problems

To achieve the above object, an imaging element according to a first aspect of the present disclosure is an imaging element having at least a photoelectric conversion section; a first transistor; and a second transistor, in which the photoelectric conversion section includes:

a photoelectric conversion layer that has a first surface and a second surface opposed to the first surface and on which light is incident from a first surface side;

a first electrode that is provided to adjoin the first surface of the photoelectric conversion layer; and a second electrode that is provided to adjoin the second surface of the photoelectric conversion layer, the imaging element further has a first photoelectric conversion layer extension section that extends from the photoelectric conversion layer;

a third electrode that is formed to be opposed to a second surface of the first photoelectric conversion layer extension section via an insulating film, the second surface of the first photoelectric conversion layer extension section being on a same side as a side of the second surface of the photoelectric conversion layer; and a fourth electrode that is provided to adjoin the second surface of the first photoelectric conversion layer extension section, the first transistor includes the second electrode that functions as one source/drain section, the third electrode that functions as a gate section, the fourth electrode that functions as other source/drain section and that is connected to a power supply section, and the first photoelectric conversion layer extension section that functions as a channel formation region, a gate section of the second transistor is connected to the second electrode, and one source/drain section of the second transistor is connected to the power supply section.

It is noted that the imaging element according to the first aspect of the present disclosure can be formed such that the imaging element further has:

a third transistor, in which one source/drain section of the third transistor is connected to other source/drain section of the second transistor, and other source/drain section of the third transistor is connected to a signal line.

To achieve the above object, an imaging element according to a second aspect of the present disclosure is an imaging element having:

at least a photoelectric conversion section; a second transistor; and a third transistor, in which the photoelectric conversion section includes a photoelectric conversion layer that has a first surface and a second surface opposed to the first surface and on which light is incident from a first surface side;

a first electrode that is provided to adjoin the first surface of the photoelectric conversion layer; and a second electrode that is provided to adjoin the second surface of the photoelectric conversion layer, the imaging element further has a first photoelectric conversion layer extension section that extends from the photoelectric conversion layer;

a second electrode extension section that is formed on a second surface of the first photoelectric conversion layer extension section via an insulating film, the second surface of the first photoelectric conversion layer extension section being on a same side as a side of the second surface of the photoelectric conversion layer; and a third electrode and a fourth electrode that are provided to adjoin the second surface of the first photoelectric conversion layer extension section, the second transistor includes the third electrode that functions as one source/drain section and that is connected to a power supply section, the second electrode extension section that functions as a gate section, the fourth electrode that functions as the other source/drain section, and the first photoelectric conversion layer extension section that functions as a channel formation region, one source/drain section of the third transistor is connected to the fourth electrode, and other source/drain section of the third transistor is connected to a signal line.

It is noted that the imaging element according to the second aspect of the present disclosure can be formed such that the imaging element further has:

a first transistor, in which one source/drain section of the first transistor is connected to the second electrode, and other source/drain section of the first transistor is connected to the power supply section.

To achieve the above object, an imaging element according to a third aspect of the present disclosure is an imaging element having:

at least a photoelectric conversion section; a second transistor; and a third transistor, in which the photoelectric conversion section includes a photoelectric conversion layer that has a first surface and a second surface opposed to the first surface and on which light is incident from a first surface side;

a first electrode that is provided to adjoin the first surface of the photoelectric conversion layer; and a second electrode that is provided to adjoin the second surface of the photoelectric conversion layer, the imaging element further has a channel formation region that is configured from a same material as a material of the photoelectric conversion layer and that is provided to be apart from the photoelectric conversion layer;

a fourth electrode that is formed on a surface of the channel formation region via an insulating film, the surface of the channel formation region being on a same side as a side of the second surface of the photoelectric conversion layer; and a third electrode and a fifth electrode that are provided to adjoin a surface of a channel formation region extension section that is on the same side as the side of the second surface of the photoelectric conversion layer, a gate section of the second transistor is connected to the second electrode, one source/drain section of the second transistor is connected to a power supply section, other source/drain section of the second transistor is connected to the third electrode that configures one source/drain section of the third transistor, a gate section of the third transistor is configured from the fourth electrode, and the fifth electrode that configures other source/drain section of the third transistor is connected to a signal line.

It is noted that the imaging element according to the third aspect of the present disclosure can be formed such that the imaging element further has:

a first transistor, in which one source/drain section of the first transistor is connected to the second electrode, and other source/drain section of the first transistor is connected to the power supply section.

To achieve the above object, a stacked imaging element according to the present disclosure has at least one of imaging elements according to the first to third aspects of the present disclosure including the above preferable forms.

To achieve the above object, a solid-state imaging device according to the first aspect of the present disclosure has a plurality of imaging elements according to the first to third aspects of the present disclosure including the above preferable forms. Furthermore, to achieve the above object, a solid-state imaging device according to the second aspect of the present disclosure has a plurality of the stacked imaging elements according to the present disclosure.

Advantageous Effects of Invention

The imaging element according to each of the first to third aspects of the present disclosure, the imaging element according to each of the first to third aspects of the present disclosure configuring the stacked imaging element according to the present disclosure, or the imaging element according to any of the first to third aspects of the present disclosure configuring any of the solid-state imaging devices according to the first and second aspects of the present disclosure has a configuration and a structure of having at least two transistors out of the three transistors of the first, second, and third transistors; thus, it is possible to achieve simplification of the configuration and the structure of each imaging element. In addition, at least one transistor is provided to be adjacent to the photoelectric conversion layer; thus, it is possible to achieve reduction in an area of the imaging element, improvement in a resolution of the imaging element, and further simplification of the configuration and the structure of the imaging element. Furthermore, it is possible to achieve shortening and simplification of interconnections within the imaging element; thus, it is possible to achieve improvement in charge-to-voltage conversion efficiency of pixels and that in an S/N ratio of the imaging element. It is noted that the advantages described in the present specification are given as an example only and advantages are not limited to those described in the present specification and may include additional advantages.

BRIEF DESCRIPTION OF DRAWINGS

FIG. 33 is a schematic diagram of potential states of sites at time of an operation of the imaging element of the seventh embodiment.

FIG. 44 is a schematic diagram of potential states of sites at time of another operation of the imaging element of the tenth embodiment.

DESCRIPTION OF EMBODIMENTS

Figure 1A:
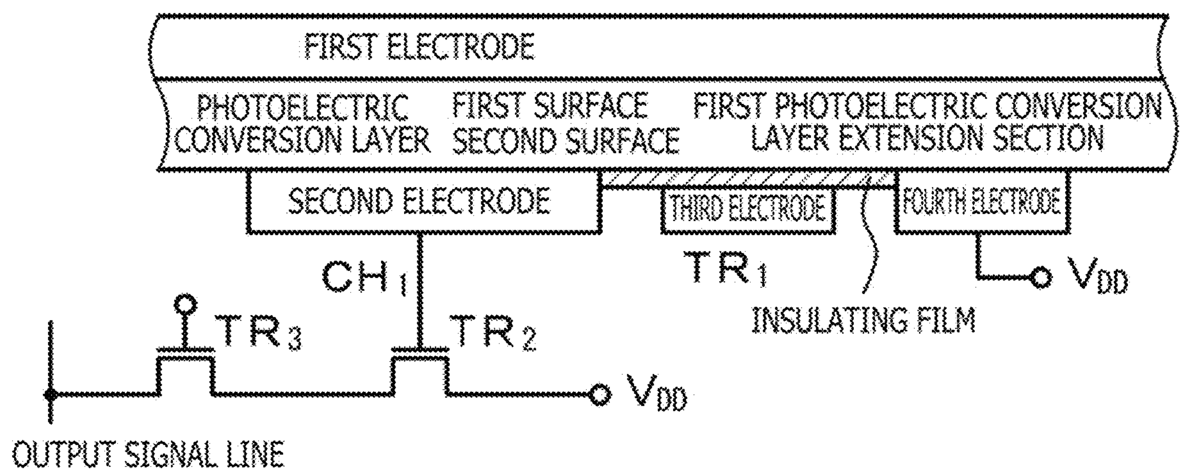
FIGS. 1A and 1B are a conceptual diagram of an imaging element of a first embodiment and an equivalent circuit diagram of an imaging element according to each of first to third aspects of the present disclosure.

While the present disclosure will be described on the basis of embodiments hereinafter with reference to the drawings, the present disclose is not limited to the embodiments and various numeric values and materials in the embodiments are given by way of example. It is noted that description will be given in the following order.

1. General description related to imaging elements according to first to third aspects of the present disclosure, stacked imaging element according to the present disclosure, and solid-state imaging devices according to the first and second aspects of the present disclosure
2. First embodiment (imaging element according to the first aspect of the present disclosure [imaging element according to A of the first aspect (aspect 1-A) of the present disclosure], stacked imaging element according to the present disclosure, and solid-state imaging devices according to the first and second aspects of the present disclosure)
3. Second embodiment (modification of the first embodiment [imaging element according to B of the first aspect (aspect 1-B) of the present disclosure])
4. Third embodiment (modification of the second embodiment [imaging element according to C of the first aspect (aspect 1-C) of the present disclosure])
5. Fourth embodiment (imaging element according to the second aspect of the present disclosure [imaging element according to A of the second aspect (aspect 2-A) of the present disclosure])
6. Fifth embodiment (modification of the fourth embodiment [imaging element according to B of the second aspect (aspect 2-B) of the present disclosure])
7. Sixth embodiment (imaging element according to the third aspect of the present disclosure [imaging element according to A of the third aspect (aspect 3-A) of the present disclosure])
8. Seventh embodiment (modification of the first to sixth embodiments, imaging element having charge accumulation electrode)
9. Eighth embodiment (modification of the seventh embodiment)
10. Ninth embodiment (modification of the seventh and eighth embodiments)
11. Tenth embodiment (modification of the seventh to ninth embodiments, imaging element having transfer control electrode).
12. Eleventh embodiment (modification of the seventh to tenth embodiments, imaging element having charge emitting electrode)
13. Twelfth embodiment (modification of the seventh to eleventh embodiments, imaging element having a plurality of charge accumulation electrode segments)
14. Others <General Description Related to Imaging Elements According to the First to Third Aspects of the Present Disclosure, Stacked Imaging Element According to the Present Disclosure, and Solid-State Imaging Devices According to the First and Second Aspects of the Present Disclosure>

In a transistor formed above a semiconductor layer in any of imaging elements according to first to third aspects of the present disclosure, any of the imaging elements according to the first to third aspects of the present disclosure configuring a stacked imaging element according to the present disclosure, or any of solid-state imaging devices according to the first and second aspects of the present disclosure, a source/drain section is configured from a source/drain region or a source/drain electrode, as described hereinafter. The source/drain section corresponds to the source/drain electrode in a case in which the source/drain section is configured from an electrode; otherwise, the source/drain section corresponds to the source/drain region.

The imaging element according to the first aspect of the present disclosure including the preferable form described above can be formed such that the photoelectric conversion layer includes an organic photoelectric conversion material.

Alternatively, the imaging element according to the first aspect of the present disclosure including the preferable form described above can be formed such that at least the first photoelectric conversion layer extension section has a stacked structure of a lower semiconductor layer and an upper photoelectric conversion layer from a second surface side. In addition, in this case, the imaging element according to the second aspect of the present disclosure including the preferable form described above can be formed such that the photoelectric conversion section and the first photoelectric conversion layer extension section have the stacked structure of the lower semiconductor layer and the upper photoelectric conversion layer from the second surface side. Moreover, in these forms, the imaging element is preferably formed such that a semiconductor material configuring the lower semiconductor layer has band gap energy equal to or higher than 3.0 eV from the viewpoint of preventing absorption of visible light into the lower semiconductor layer.

Furthermore, the imaging element according to the first aspect of the present disclosure including various preferable forms described above is preferably formed such that a thickness of part of the first photoelectric conversion layer extension section is smaller than a thickness of the photoelectric conversion layer.

Moreover, the imaging element according to the first aspect of the present disclosure having the third transistor and including the various preferable forms described above can be configured such that the imaging element further has a semiconductor layer, the second transistor and the third transistor are formed in the semiconductor layer, the photoelectric conversion section and the first transistor are formed above the semiconductor layer, and the gate section of the second transistor is connected to the second electrode via a first contact hole section. It is noted that the imaging element having such a configuration will be often referred to as "imaging element according to the aspect 1-A of the present disclosure" for the sake of convenience.

In addition, the imaging element according to the aspect 1-A of the present disclosure can be configured such that the imaging element further has:

a second photoelectric conversion layer extension section that extends from the photoelectric conversion layer;

a second electrode extension section that is formed on a second surface of the second photoelectric conversion layer extension section via the insulating film, the second surface of the second photoelectric conversion layer extension section being on the same side as the side of the second surface of the photoelectric conversion layer; and a fifth electrode and a sixth electrode that are provided to adjoin the second surface of the second photoelectric conversion layer extension section, and that the second transistor is formed above the semiconductor layer instead of being formed in the semiconductor layer, the gate section of the second transistor is configured from the second electrode extension section instead of being connected to the second electrode, the one source/drain section (source/drain electrode) of the second electrode is configured from the fifth electrode, and the other source/drain section (source/drain electrode) of the second transistor is configured from the sixth electrode and connected to the one source/drain section of the third transistor. It is noted that the imaging element having such a configuration will be often referred to as "imaging element according to the aspect 1-B of the present disclosure" for the sake of convenience.

The imaging element according to the aspect 1-B of the present disclosure can be configured such that the second photoelectric conversion layer extension section has a stacked structure of a lower semiconductor layer and an upper photoelectric conversion layer from a second surface side. In addition or alternatively, the imaging element according to the aspect 1-B of the present disclosure can be configured such that a thickness of part of the second photoelectric conversion layer extension section is smaller than a thickness the photoelectric conversion layer.

In addition, the imaging element according to the aspect 1-B of the present disclosure can be configured such that the imaging element further has:

a third photoelectric conversion layer extension section that extends from the photoelectric conversion layer;

a seventh electrode that is formed to be opposed to a second surface of the third photoelectric conversion layer extension section via the insulating film, the second surface of the third photoelectric conversion layer extension section being on the same side as the side of the second surface of the photoelectric conversion layer; and an eighth electrode that is provided to adjoin the second surface of the third photoelectric conversion layer extension section, and that the third transistor is formed above the semiconductor layer instead of being formed in the semiconductor layer, the one source/drain section (source/drain electrode) of the third transistor is commonly configured from the sixth electrode instead of being connected to the sixth electrode via the second contact hole section, a gate section of the third transistor is configured from the seventh electrode, and the other source/drain section (source/drain electrode) of the third transistor is configured from the eighth electrode and connected to the signal line via a third contact hole section. It is noted that the imaging element having such a configuration will be often referred to as "imaging element according to the aspect 1-C of the present disclosure" for the sake of convenience.

The imaging element according to the aspect 1-C of the present disclosure can be configured such that the third photoelectric conversion layer extension section has a stacked structure of a lower semiconductor layer and an upper photoelectric conversion layer from a second surface side. In addition or alternatively, the imaging element according to the aspect 1-C of the present disclosure can be configured such that a thickness of part of the third photoelectric conversion layer extension section is smaller than a thickness the photoelectric conversion layer.

The imaging element according to the second aspect of the present disclosure including the preferable form can be also formed such that at least the first photoelectric conversion layer extension section has a stacked structure of a lower semiconductor layer and an upper photoelectric conversion layer from a second surface side. In addition, in this case, the imaging element according to the second aspect of the present disclosure including the preferable form described above can be formed such that the photoelectric conversion section and the first photoelectric conversion layer extension section have the stacked structure of the lower semiconductor layer and the upper photoelectric conversion layer from the second surface side. Moreover, in these forms, the imaging element is preferably formed such that a semiconductor material configuring the lower semiconductor layer has band gap energy equal to or higher than 3.0 eV from the viewpoint of preventing absorption of visible light into the lower semiconductor layer.

Furthermore, the imaging element according to the second aspect of the present disclosure including various preferable forms described above is preferably formed such that a thickness of part of the first photoelectric conversion layer extension section is smaller than a thickness of the photoelectric conversion layer.

The imaging element according to the second aspect of the present disclosure having the first transistor can be configured such that the imaging element further has a semiconductor layer, and that the first transistor and the third transistor are formed in the semiconductor layer, the photoelectric conversion section and the second transistor are formed above the semiconductor layer, the one source/drain section of the first transistor is connected to the second electrode via a first contact hole section, and the one source/drain section of the third transistor is connected to the fourth electrode via a second contact hole section. It is noted that the imaging element having such a configuration will be often referred to as "imaging element according to the aspect 2-A of the present disclosure" for the sake of convenience.

In addition, the imaging element according to the aspect 2-A of the present disclosure can be configured such that the imaging element further has:

a second photoelectric conversion layer extension section that extends from the photoelectric conversion layer;

a fifth electrode that is formed to be opposed to a second surface of the second photoelectric conversion layer extension section via the insulating film, the second surface of the second photoelectric conversion layer extension section being on a same side as a side of the second surface of the photoelectric conversion layer; and a sixth electrode that is provided to adjoin the second surface of the second photoelectric conversion layer extension section, and that the third transistor is formed above the semiconductor layer instead of being formed in the semiconductor layer, the one source/drain section (source/drain electrode) of the third transistor is commonly configured from the fourth electrode instead of being connected to the fourth electrode via the second contact hole section, a gate section of the third transistor is configured from the fifth electrode, and the other source/drain section (source/drain electrode) of the third transistor is configured from the sixth electrode and connected to the signal line via a third contact hole section. It is noted that the imaging element having such a configuration will be often referred to as "imaging element according to the aspect 2-B of the present disclosure" for the sake of convenience.

The imaging element according to the aspect 2-B of the present disclosure can be configured such that the second photoelectric conversion layer extension section has a stacked structure of a lower semiconductor layer and an upper photoelectric conversion layer from a second surface side. In addition or alternatively, the imaging element according to the aspect 2-B of the present disclosure can be configured such that a thickness of part of the second photoelectric conversion layer extension section is smaller than a thickness the photoelectric conversion layer.

The imaging element according to the third aspect of the present disclosure including the preferable form described above can be also formed such that the third photoelectric conversion layer extension section, the channel formation region, and the channel formation region extension section have a stacked structure of a lower semiconductor layer and an upper photoelectric conversion layer from a second surface side. Moreover, in such a form, the imaging element is preferably formed such that a semiconductor material configuring the lower semiconductor layer has band gap energy equal to or higher than 3.0 eV from the viewpoint of preventing absorption of visible light into the lower semiconductor layer.

The imaging element according to the third aspect of the present disclosure having the first transistor can be configured such that the imaging element further has a semiconductor layer, and that the first transistor and the second transistor are formed in the semiconductor layer, the photoelectric conversion section and the third transistor are formed above the semiconductor layer, the one source/drain section of the first transistor and the gate section of the second transistor are connected to the second electrode via a first contact hole section, the other source/drain section (source/drain region) of the second transistor is connected to the third electrode via a second contact hole section, and the other source/drain section (source/drain electrode) of the third transistor is connected to the signal line via a third contact hole section. It is noted that the imaging element having such a configuration will be often referred to as "imaging element according to the aspect 3-A of the present disclosure" for the sake of convenience.

Each of the imaging elements according to the first to third aspects of the present disclosure including the various preferable forms and configurations described above can be applied to an imaging element that configures the stacked imaging element according to the present disclosure and an imaging element that configures the solid-state imaging devices according to the first and second aspects of the present disclosure. It is noted that each of these imaging elements will be often generically referred to as "imaging element or the like according to the present disclosure."

In the imaging element or the like according to the present disclosure, the first electrode located on a light incidence side may be common to a plurality of imaging elements. In other words, the first electrode can be used as a so-called solid electrode. The photoelectric conversion layer may be common to a plurality of imaging elements, that is, one photoelectric conversion layer may be formed in the plurality of imaging elements, or may be provided per imaging element.

While light is incident from the first electrode side in the imaging element or the like according to the present disclosure, it is preferable to form a light shielding layer to prevent the light from being incident on various transistors (particularly channel formation regions of the various transistors) formed above the semiconductor layer. Alternatively, an on-chip microlens is provided above the first electrode, and the imaging element is preferably configured such that light incident on the on-chip microlens is not incident on the various transistors provided above the semiconductor layer. Here, the light shielding layer may be arranged above a light incidence side surface of the first electrode or provided on the light incidence side surface of the first electrode. The light shielding layer may be formed on the first electrode according to circumstances. As examples of a material that configures the light shielding layer, chromium (Cr), copper (Cu), aluminum (Al), tungsten (W), a resin that does not transmit light (for example, polyimide resin) can be cited.

Specifically, as examples of the imaging element or the like according to the present disclosure, an imaging element (referred to as "first type blue light imaging element" for the sake of convenience) having a photoelectric conversion layer (referred to as "first type blue light photoelectric conversion layer" for the sake of convenience) that absorbs blue light (light at 425 to 495 nm) and sensitive to the blue light, an imaging element (referred to as "first type green light imaging element" for the sake of convenience) having a photoelectric conversion layer (referred to as "first type green light photoelectric conversion layer" for the sake of convenience) that absorbs green light (light at 495 to 570 nm) and sensitive to the green light, and an imaging element (referred to as "first type red light imaging element" for the sake of convenience) having a photoelectric conversion layer (referred to as "first type red light photoelectric conversion layer" for the sake of convenience) that absorbs green light (light at 620 to 750 nm) and sensitive to the red light can be cited. Furthermore, an imaging element that is a conventional imaging element and that is sensitive to blue light will be referred to as "second type blue light imaging element" for the sake of convenience, an imaging element that is a conventional imaging element and that is sensitive to green light will be referred to as "second type green light imaging element" for the sake of convenience, an imaging element that is a conventional imaging element and that is sensitive to red light will be referred to as "second type red light imaging element" for the sake of convenience, a photoelectric conversion layer that configures the second type blue light imaging element will be referred to as "second type blue light photoelectric conversion layer" for the sake of convenience, a photoelectric conversion layer that configures the second type green light imaging element will be referred to as "second type green light photoelectric conversion layer" for the sake of convenience, and a photoelectric conversion layer that configures the second type red light imaging element will be referred to as "second type red light photoelectric conversion layer" for the sake of convenience.

While the stacked imaging element according to the present disclosure has at least one imaging element (photoelectric conversion element) according to any one of the first to third aspects of the present disclosure, the following can be cited as specific examples of the stacked imaging element.

[A] A stacked imaging element configured and structured such that the first type blue light photoelectric conversion section, the first type green light photoelectric conversion section, and the first type red light photoelectric conversion section are stacked in a perpendicular direction, and that control sections of the first type blue light imaging element, the first type green light imaging element, and the first type red light imaging element are provided in, for example, the semiconductor layer.

[B] A stacked imaging element configured and structured such that the first type blue light photoelectric conversion section and the first type green light photoelectric conversion section are stacked in the perpendicular direction, the second type red light photoelectric conversion layer is disposed below the two first type photoelectric conversion sections, and that control sections of the first type blue light imaging element, the first type green light imaging element, and the second type red light imaging element are provided in, for example, the semiconductor layer.

[C] A stacked imaging element configured and structured such that the second type blue light photoelectric conversion section and the second type red light photoelectric conversion section are disposed below the first type green light photoelectric conversion section, and that control sections of the first type green light imaging element, the second type blue light imaging element, and the second type red light imaging element are provided in, for example, the semiconductor layer.

[D] A stacked imaging element configured and structured such that the second type green light photoelectric conversion section and the second type red light photoelectric conversion section are disposed below the first type blue light photoelectric conversion section, and that control sections of the first type blue light imaging element, the second type green light imaging element, and the second type red light imaging element are provided in, for example, the semiconductor layer.

It is noted that the photoelectric conversion sections of these imaging elements in the perpendicular direction are disposed preferably in an order of the blue light photoelectric conversion section, the green light photoelectric conversion section, and the red light photoelectric conversion section from a light incidence direction, or in an order of the green light photoelectric conversion section, the blue light photoelectric conversion section, and the red light photoelectric conversion section from the light incidence direction. This is because light at a shorter wavelength is absorbed on the incidence surface side more efficiently. Since the red light has the longest wavelength among the three colors, it is preferable to locate the red light photoelectric conversion section on the lowermost layer in a view from a light incidence surface. A stacked structure of these imaging elements configures one pixel. Moreover, the stacked imaging element may have the first type photoelectric conversion section. It is preferable here that the photoelectric conversion layer of the first type infrared photoelectric conversion section is configured from, for example, an organic material, is the lowermost layer in the stacked structure of the first type imaging elements, and is disposed above the second type imaging elements. Alternatively, the stacked imaging element may have the second type infrared photoelectric conversion section below the first type photoelectric conversion sections.

In the first type imaging element, the second electrode is formed, for example, on an interlayer insulating layer provided on the semiconductor layer. The imaging elements (second type imaging elements) formed in the semiconductor layer have the same configuration and the same structure as those of the conventional imaging elements, and can be used as back irradiation type imaging elements or surface irradiation type imaging elements. As an example of the semiconductor layer, a silicon semiconductor substrate or a silicon layer in an SOI substrate can be cited.

In a case of configuring the photoelectric conversion layer from the organic material, the photoelectric conversion layer can be configured from any of the following four types:

(1) a p-type organic semiconductor.

(2) an n-type organic semiconductor.

(3) a stacked structure of a p-type organic semiconductor film/an n-type organic semiconductor film. a stacked structure of a p-type organic semiconductor film/a mixture layer (bulk hetero structure) of a p-type organic semiconductor and an n-type organic semiconductor/an n-type organic semiconductor film. a stacked structure of a p-type organic semiconductor film/a mixture layer (bulk hetero structure) of a p-type organic semiconductor and an n-type organic semiconductor. a stacked structure of an n-type organic semiconductor film/a mixture layer (bulk hetero structure) of a p-type organic semiconductor and an n-type organic semiconductor.

(4) a mixture (bulk hetero structure) of a p-type organic semiconductor and an n-type organic semiconductor.

It is noted, however, that an order of stacking can be changed arbitrarily.

As examples of the p-type organic semiconductor, naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes having heterocyclic compounds as ligands, polythiophene derivatives, polybenzothiadiazole derivatives, and polyfluorene derivatives can be cited. As examples of the n-type organic semiconductor, fullerenes and fullerene derivatives (for example, fullerenes (higher fullerenes) such as C60, C70, and C74 and endohedral fullerenes) or fullerene derivatives (for example, fullerene fluorides, PCBM fullerene compounds, and fullerene multimers), organic semiconductors higher (deeper) in HOMO and LUMO than p-type organic semiconductors, transparent inorganic metal oxides can be cited. As specific examples of the n-type organic semiconductor, organic molecules and organometallic complexes having, as portions of a molecular frame, heterocyclic compounds containing nitrogen atoms, oxygen atoms, and sulfur atoms, examples of which include pyridine derivatives, pyrazine derivatives, pyrimidine derivatives, triazine derivatives, quinoline derivatives, quinoxaline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, poly-benzothiadiazole derivatives, and polyfluorene derivatives, and subphthalocyanine derivatives can be cited. As examples of a group or the like contained in the fullerene derivatives, halogen atoms; straight-chain, branched-chain, or cyclic alkyl groups or phenyl groups; groups having a straight-chain or condensed-ring aromatic compound; groups having a halide; partially fluorinated alkyl groups; perfluoroalkyl groups; silylalkyl groups; silylalkoxy groups; arylsilyl groups;

arylsulfanyl groups; alkylsulfanyl groups; arylsulfonyl groups; alkylsulfonyl groups; arylsulfide groups; alkylsulfide groups; amino groups; alkylamino groups; arylamino group; hydroxy groups; alkoxy groups; acylamino groups; acyloxy groups; carbonyl groups; carboxy groups; carboxamido groups; carboalkoxy groups; acyl groups; sulfonyl groups; cyano groups; nitro groups; groups having a chalcogenide; phosphine groups; phosphonic groups; and derivatives thereof can be cited. While a thickness of the photoelectric conversion layer configured from the organic material (often referred to as "organic photoelectric conversion layer") is not limited, $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m, most preferably $1\times10^{-7}$ m to $1.8\times10^{-7}$ m can be cited as examples of the thickness. While the organic semiconductor is often classified into a p-type or an n-type, the p-type means that the organic semiconductor can easily transport holes, and the n-type means that the organic semiconductor can easily transport electrons; thus, interpretation of the organic semiconductor is not limited to that the organic semiconductor has holes or electrons as thermally excited majority carriers unlike an inorganic semiconductor.

Alternatively, as examples of a material that configures the organic photoelectric conversion layer photoelectrically converting green light, rhodamine-based pigments, merocyanine-based pigments, quinacridone derivatives, and subphthalocyanine-based pigments (subphthalocyanine derivatives) can be cited; as examples of a material that configures the organic photoelectric conversion layer photoelectrically converting blue light, coumaric acid pigments, tris(8-hydroxyquinoline)aluminum (Alq3), and merocyanine-based pigments can be cited; and as examples of a material that configures the organic photoelectric conversion layer photoelectrically converting red light, phthalocyanine-based pigments and subphthalocyanine-based pigments (subphthalocyanine derivatives) can be cited.

Alternatively, as examples of an inorganic material that configures the photoelectric conversion layer, compound semiconductors of crystalline silicon, amorphous silicon, microcrystalline silicon, amorphous selenium, and chalcopyrite-based compounds such as CIGS (CuInGaSe), CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, and $AgInSe_2$, group III-V compounds such as GaAs, InP, AlGaAs, InGaP, AlGaInP, and InGaAsP, as well as CdSe, CdS, $In_2Se_3$, $InzS_3$, $Bi_2Se_3$, $Bi_2S_3$, ZnSe, ZnS, PbSe, and PbS can be cited. In addition, quantum dots including these materials can be used for the photoelectric conversion layer.

As described above, the photoelectric conversion layer can be formed into a stacked structure of a lower semiconductor layer and an upper photoelectric conversion layer. Providing the lower semiconductor layer in this way makes it possible to prevent recombination during charge accumulation, to increase transfer efficiency for transferring charges accumulated in the photoelectric conversion layer to the second electrode, and to suppress generation of a dark current. Furthermore, providing the lower semiconductor layer makes it possible to optimize channel formation regions of transistors formed above the semiconductor layer. A material that configures the upper photoelectric conversion layer is only required to be selected as appropriate from among the various materials configuring the photoelectric conversion layer described above. On the other hand, as a semiconductor material that configures the lower semiconductor layer, it is preferable to use a material having a large band gap value (for example, band gap value equal to or greater than 3.0 eV) and having a higher mobility than that of the material configuring the photoelectric conversion layer. Specifically, as examples of the semiconductor material, oxide semiconductor materials such as IGZO; transition metal dichalcogenides; silicon carbides; diamond; graphene; carbon nanotubes; semiconductor materials such as Si, Ge, and GaAs; organic semiconductor materials such as condensed polycyclic hydrocarbon compounds and condensed heterocyclic compounds can be cited. Alternatively, as examples of the semiconductor material that configures the lower semiconductor layer, materials having a lower ionization potential than an ionization potential of the material that configures the photoelectric conversion layer can be cited in a case in which charges to be accumulated are holes, and materials that have higher electron affinity than that of the material that configures the photoelectric conversion layer can be cited in a case in which the charges to be accumulated are electrons. Alternatively, it is preferable that an impurity concentration of the semiconductor material that configures the lower semiconductor layer is equal to or lower than $1\times10^{18}$ $cm^{-3}$. The lower semiconductor layer may have a single-layer configuration or a multi-layer configuration. Moreover, a material of a portion of the lower semiconductor layer that configures the channel formation regions of the various transistors formed above the semiconductor layer may differ from a material of a portion of the lower semiconductor layer that is located on the second electrode.

The imaging element or the like according to the present disclosure can be formed such that the photoelectric conversion section further has a charge accumulation electrode that is disposed to be apart from the second electrode and that is disposed to be opposed to the photoelectric conversion layer via the insulating layer. It is noted that the imaging element or the like according to the present disclosure in such a form will be referred to as "imaging element having the charge accumulation electrode" for the sake of convenience.

Having the charge accumulation electrode that is disposed apart from the second electrode and that is disposed to be opposed to the photoelectric conversion section via the insulating layer in this way makes it possible to control a quantity of the charges accumulated in the photoelectric conversion section by the charge accumulation electrode when the photoelectric conversion section is radiated with light and performs photoelectric conversion. Owing to this, it is possible to further ensure that the charge accumulation section is completely depleted and the charges are eliminated at a time of starting exposure. As a result, it is possible to more reliably suppress occurrence of a phenomenon that kTC noise grows and random noise aggravates, resulting in deterioration in an imaging quality.

The imaging element having the charge accumulation electrode can be formed such that the second electrode extends within an opening portion provided in the insulating layer and is connected to the photoelectric conversion layer. Alternatively, the imaging element having the charge accumulation electrode can be formed such that the photoelectric conversion layer extends within the opening portion provided in the insulating layer and is connected to the second electrode, and in this case, the imaging element having the charge accumulation electrode can be formed such that an edge portion of a top surface of the second electrode is covered with the insulating layer, the second electrode is exposed to a bottom surface of the opening portion, and when it is assumed that a surface of the insulating layer adjoining the top surface of the second electrode is a first surface and a surface of the insulating layer adjoining a portion of the photoelectric conversion layer opposed to the charge accumulation electrode is a second surface, a side surface of the opening portion has an inclination spreading from the first surface to the second surface, and the imaging element having the charge accumulation electrode can be furthermore formed such that the side surface of the opening portion having the inclination spreading from the first surface to the second surface is located closer to the charge accumulation electrode. It is noted that this form encompasses a form in which another layer is formed between the photoelectric conversion layer and the second electrode (for example, a form in which a material layer suited for charge accumulation is formed between the photoelectric conversion layer and the second electrode).

The imaging element having the charge accumulation electrode can be formed such that the imaging element having the charge accumulation electrode further has a control section that has a drive circuit, and that the second electrode and the charge accumulation electrode are connected to the drive circuit, a potential $V_{11}$ is applied from the drive circuit to the second electrode, a potential $V_{12}$ is applied therefrom to the charge accumulation electrode, and charges are accumulated in the photoelectric conversion layer in a charge accumulation period, and a potential $V_{21}$ is applied from the drive circuit to the second electrode, a potential $V_{22}$ is applied therefrom to the charge accumulation electrode, and the charges accumulated in the photoelectric conversion layer are read to the control section by way of the second electrode in a charge transfer period. It is noted that in a case in which the potential of the second electrode is higher than a potential of the first electrode, $$V_{12} \geq V_{11} \text{ and } V_{22} < V_{21}, \text{ and}$$

in a case in which the potential of the second electrode is lower than the potential of the first electrode, $$V_{12} \leq V_{11} \text{ and } V_{22} > V_{21}.$$

Furthermore, the imaging element having the charge accumulation electrode and including the various preferable forms and configurations described above can be formed such that the imaging element having the charge accumulation electrode further has a transfer control electrode (charge transfer electrode) that is disposed between the second electrode and the charge accumulation electrode to be apart from the second electrode and the charge accumulation electrode and that is disposed to be opposed to the photoelectric conversion layer via the insulating layer. It is noted that each of the imaging element or the like according to the present disclosure in such a form will be referred to as "imaging element having the transfer control electrode" for the sake of convenience.

The imaging element having the transfer control electrode can be formed such that the imaging element having the transfer control electrode further has a control section that has a drive circuit, and that the second electrode and the transfer control electrode are connected to the drive circuit, a potential $V_{11}$ is applied from the drive circuit to the second electrode, a potential $V_{12}$ is applied therefrom to the charge accumulation electrode, a potential $V_{13}$ is applied therefrom to the transfer control electrode, and charges are accumulated in the photoelectric conversion layer in a charge accumulation period, and a potential $V_{21}$ is applied from the drive circuit to the second electrode, a potential $V_{22}$ is applied therefrom to the charge accumulation electrode, a potential $V_{23}$ is applied therefrom to the transfer control electrode, and the charges accumulated in the photoelectric conversion section are read to the control section via the second electrode in a charge transfer period. It is noted that in a case in which the potential of the second electrode is higher than a potential of the first electrode, $$V_{12} > V_{13} \text{ and } V_{22} \leq V_{23} \leq V_{21}, \text{ and}$$

in a case in which the potential of the second electrode is lower than the potential of the first electrode, $$V_{12} < V_{13} \text{ and } V_{22} \geq V_{23} \geq V_{21}.$$

Moreover, the imaging element having the charge accumulation electrode and including the various preferable forms and configurations described above can be formed such that the imaging element having the charge accumulation electrode further has a charge emitting electrode that is connected to the photoelectric conversion layer and that is disposed to be apart from the second electrode and the charge accumulation electrode. It is noted that the imaging element having the charge accumulation electrode in such a form will be referred to as "imaging element having the charge emitting electrode" for the sake of convenience. In addition, the imaging element having the charge emitting electrode can be formed such that the charge emitting electrode is disposed to surround the entire transistors formed above the semiconductor layer (that is, in a frame fashion). The charge emitting electrode can be shared among (common to) a plurality of imaging elements. In addition, in this case, the imaging element having the charge emitting electrode can be formed such that the photoelectric conversion layer extends within a second opening portion provided in the insulating layer and is connected to the charge emitting electrode, an edge portion of a top surface of the charge emitting electrode is covered with the insulating layer, the charge emitting electrode is exposed to a bottom surface of the second opening portion, and when it is assumed that a surface of the insulating layer adjoining the top surface of the charge emitting electrode is a third surface and a surface of the insulating layer adjoining a portion of the photoelectric conversion layer opposed to the charge accumulation electrode is a second surface, a side surface of the second opening portion has an inclination spreading from the third surface to the second surface.

Moreover, the imaging element having the charge emitting electrode can be formed such that the imaging element having the charge emitting electrode further has a control section that has a drive circuit, and that the second electrode, the charge accumulation electrode, and the charge emitting electrode are connected to the drive circuit, a potential $V_{11}$ is applied from the drive circuit to the second electrode, a potential $V_{12}$ is applied therefrom to the charge accumulation electrode, a potential $V_{14}$ is applied therefrom to the charge emitting electrode, and charges are accumulated in the photoelectric conversion layer in a charge accumulation period, and a potential $V_{21}$ is applied from the drive circuit to the second electrode, a potential $V_{22}$ is applied therefrom to the charge accumulation electrode, a potential $V_{24}$ is applied therefrom to the charge emitting electrode, and the charges accumulated in the photoelectric conversion layer are read to the control section via the second electrode in a charge transfer period. It is noted that in a case in which the potential of the second electrode is higher than a potential of the first electrode, $V_{14}>V_{11}$ and $V_{24}<V_{21}$, and in a case in which the potential of the second electrode is lower than the potential of the first electrode, $V_{14}<V_{11}$ and $V_{24}>V_{21}$.

Moreover, the imaging element having the charge accumulation electrode and including the various preferable forms and configurations described above can be formed such that the charge accumulation electrode is configured from a plurality of charge accumulation electrode segments. It is noted that the imaging element having the charge accumulation electrode in such a form will be referred to as "imaging element having a/the plurality of charge accumulation electrode segments" for the sake of convenience. The number of the charge accumulation electrode segments may be equal to or greater than 2. In addition, the imaging element having the plurality of charge accumulation electrode segments can be formed such that in a case in which the potential of the second electrode is higher than the potential of the first electrode, a potential applied to the charge accumulation electrode segment located in a location closest to the second electrode is higher than a potential applied to the charge accumulation electrode segment located in a location farthest from the second electrode in the charge transfer period, and in a case in which the potential of the second electrode is lower than the potential of the first electrode, the potential applied to the charge accumulation electrode segment located in the location closest to the second electrode is lower than the potential applied to the charge accumulation electrode segment located in the location farthest from the second electrode in the charge transfer period.

Furthermore, the imaging element having the charge accumulation electrode and including the various preferable forms and configurations described above can be formed such that a magnitude of the charge accumulation electrode is larger than a magnitude of the second electrode. When it is assumed that an area of the charge accumulation electrode is $S_1'$ and an area of the second electrode is $S_1$, the areas of the charge accumulation electrode and the second electrode preferably satisfy the following relationship although not being limited thereto:

$4 \leq S_1'/S_1$.

Moreover, the imaging element having the charge accumulation electrode and including the various preferable forms and configurations described above can be formed such that light is incident from the first electrode side and light is not incident on the second electrode (or on the second electrode and the transfer control electrode according to circumstances), and in this case, the imaging element can be configured such that a light shielding layer is formed on a light incidence side closer to the first electrode and above the second electrode (or above the second electrode and the transfer control electrode according to circumstances), or that an on-chip microlens is provided above the charge accumulation electrode and the first electrode, and light incident on the on-chip microlens is concentrated onto the charge accumulation electrode. Here, the light shielding layer may be arranged above a light incident side surface of the first electrode or provided on the light incident side surface of the first electrode. The light shielding layer may be formed in the first electrode according to circumstances.

The solid-state imaging device according to any of the first and second aspects of the present disclosure can configure a single-plate color solid-state imaging device.

In the solid-state imaging device according to the second aspect of the present disclosure having the stacked imaging element, imaging elements sensitive to light at a plurality of types of wavelengths are stacked in a light incidence direction within the same pixel to configure one pixel, unlike a solid-state imaging device having imaging elements in a Bayer array (that is, without dispersing light into blue light, green light, and red light using a color filter); thus, it is possible to improve sensitivity and a pixel density per unit volume. Furthermore, since the organic material has a high absorption coefficient, a thickness of the organic photoelectric conversion layer can be reduced, compared with that of a conventional Si-based photoelectric conversion layer; thus, light leakage from adjacent pixels can be mitigated and a restriction on a light incident angle can be relaxed. Moreover, a false color is generated since the conventional Si-based imaging elements creates a color signal by performing an interpolation process among the pixels of three colors; however, the solid-state imaging device having the stacked imaging elements according to the second aspect of the present disclosure can suppress generation of the false color. Since the organic photoelectric conversion layer also functions per se as a color filter, color separation can be performed without providing a color filter.

On the other hand, by using the color filter, the solid-state imaging device according to the first aspect of the present disclosure can relax requirements to spectral characteristics for blue, green, and red and exhibit high mass productivity. As examples of an array of the imaging elements in the solid-state imaging device according to the first aspect of the present disclosure, not only the Bayer array but also an interline array, a G stripe RB checkered array, a G stripe RB completely checkered array, a checkered complementary color array, a stripe array, a diagonal stripe array, a primary color difference array, a field color difference sequential array, a frame color difference sequential array, an MOS-type array, an improved MOS-type array, a frame interleaved array, and a field interleaved array can be cited. Here, one pixel (or one subpixel) is configured with one imaging element.

A pixel region in which a plurality of imaging elements according to the present disclosure or a plurality of stacked imaging elements according to the present disclosure is arranged is configured from a plurality of pixels arranged regularly in a two-dimensional array. The image region is normally configured from an effective pixel region for actually receiving light, amplifying signal charges generated by photoelectric conversion, and reading the signal charges to a drive circuit, and a black reference pixel region for outputting optical black that serves as a reference of a black level. The black reference pixel region is normally disposed in an outer peripheral portion of the effective pixel region.

In the imaging element or the like according to the present disclosure including the various preferable forms and configurations described above, the photoelectric conversion layer is irradiated with light, photoelectric conversion is generated in the photoelectric conversion layer, and carriers are separated into holes and electrons. In addition, an electrode from which holes are extracted is defined as a positive electrode and an electrode from which electrons are extracted is defined as a negative electrode. The second electrode configures the positive electrode and the first electrode configures the negative electrode in one form, and conversely, the second electrode configures the negative electrode and the first electrode configures the positive electrode in another form.

In a case of configuring the stacked imaging element, the first electrode, the second electrode, the third electrode, the fourth electrode, the fifth electrode, the sixth electrode, the seventh electrode, the eighth electrode, the charge accumulation electrode, the transfer control electrode, and the charge emitting electrode can be each configured from a transparent conductive material. It is noted that various electrodes except for the first electrode are often generally referred to as "second electrode and the like." Alternatively, in a case in which the imaging element is provided on a plane surface in, for example, the Bayer array, the imaging element can be configured such that the first electrode includes a transparent conductive material and the second electrode and the like include a metal material. Specifically, in this case, the imaging element can be configured such that the first electrode located on the light incidence side includes the transparent conductive material and the second electrode and the like include, for example, Al—Nd (alloy of aluminum and neodymium) or ASC (alloy of aluminum, samarium, and copper alloy). It is noted that the electrode including the transparent conductive material will be often referred to as "transparent electrode." It is desirable herein that band gap energy of the transparent conductive material is equal to or higher than 2.5 eV, preferably equal to or higher than 3.1 eV. As examples of the transparent conductive material that configures the transparent electrode, a conductive metal oxide can be cited; specifically, examples of the conductive metal oxide include an indium oxide, an indium-tin oxide (ITO, Sn-doped $In_2O_3$, including a crystalline ITO and an amorphous ITO), an indium-zinc oxide (IZO) obtained by adding indium as a dopant to a zinc oxide, an Indium-gallium oxide (IGO) obtained by adding indium as a dopant to a gallium oxide, an indium-gallium-zinc oxide (IGZO, In—$GaZnO_4$) obtained by adding indium and gallium as dopants to a zinc oxide, an indium-tin-zinc oxide (ITZO) obtained by adding indium and tin as dopants to a zinc oxide, an IFO (F-doped $In_2O_3$), a tin oxide ($SnO_2$), an ATO (Sb-doped $SnO_2$), an FTO (F-doped $SnO_2$), a zinc oxide (including ZnO doped with another element), an aluminum-zinc oxide (AZO) obtained by adding aluminum as a dopant to a zinc oxide, a gallium-zinc oxide (GZO) obtained by adding gallium as a dopant to a zinc oxide, a titanium oxide ($TiO_2$), a niobium-titanium oxide (TNO) obtained by adding niobium as a dopant to a titanium oxide, an antimony oxide, a spinel-type oxide, and an oxide having a $YbFe_2O_4$ structure. Alternatively, a transparent electrode having a gallium oxide, a titanium oxide, a niobium oxide, a nickel oxide, or the like as a base layer can be cited. As examples of a thickness of the transparent electrode, $2\times10^{-8}$ to $2\times10^{-7}$ m, preferably, $3\times10^{-8}$ to $1\times10^{-7}$ m can be cited.

Alternatively, in a case in which transparency is unnecessary, it is preferable that a conductive material configuring the positive electrode that functions as the electrode for extracting holes is a conductive material having a high work function (for example, $\phi$=4.5 to 5.5 eV)). Specifically, as examples of the conductive material, gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te) can be cited. On the other hand, it is preferable that a conductive material configuring the negative electrode that functions as the electrode for extracting electrons is a conductive material having a low work function (for example, $\phi$=3.5 to 4.5 eV). Specifically, as examples of the conductive material, an alkali metal (for example Li, Na, and K) and a fluoride thereof or an oxide thereof, an alkaline earth metal (for example, Mg and Ca) and a fluoride thereof or an oxide thereof, aluminum (Al), zinc (Zn), tin (Sn), thallium (Tl), a sodium potassium alloy, an aluminum lithium alloy, a magnesium silver alloy, indium, a rare earth metal such as ytterbium, and alloys thereof can be cited. Alternatively, as examples of the material configuring the positive electrode and the negative electrode, metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo), alloys containing these metal elements, conductive particles including these metals, conductive particles of alloys containing these metals, and conductive materials such as polysilicon containing impurities, carbon-based materials, oxide semiconductors, carbon nanotubes, and graphene can be cited, and a stacked structure of layers containing these elements can be used. Furthermore, as examples of the material configuring the positive electrode and the negative electrode, an organic material (conductive polymer) such as poly(3,4-ethylenedioxythiophene)/polystyrene sulfonic acid [PEDOT/PSS] can be cited. Moreover, a paste or ink obtained by mixing the conductive material with a binder (polymer) may be cured and used as electrodes.

As a film formation method of forming the second electrode and the like and the first electrode (positive electrode or negative electrode), a dry method or a wet method can be used. As examples of the dry method, a physical vapor deposition (PVD) method and a chemical vapor deposition (CVD) method can be cited. As examples of the film formation method using a principle of the PVD method, a vacuum vapor deposition method using resistance heating or radio frequency heating, an EB (electron beam) vapor deposition method, various sputtering methods (a magnetron sputtering method, an RF-DC coupled bias sputtering method, an ECR sputtering method, a facing target sputtering method, and a radio frequency sputtering method), an ion plating method, a laser ablation method, a molecular beam epitaxy method, and a laser transfer method can be cited. Furthermore, as examples of the CVD method, a plasma CVD method, a thermal CVD method, a metalorganic (MO) CVD method, and a photo-induced CVD method can be cited. On the other hand, as examples of the wet method, an electroplating method and an electroless plating method, a spin coating method, an inkjet method, a spray coating method, a stamping method, a micro-contact printing method, a flexographic printing method, an offset printing method, a gravure printing method, and a dipping method can be cited. As examples of the patterning method, chemical etching such as shadow masking, laser transfer, and photolithography, and physical etching with ultraviolet light, a laser, and the like can be cited. As a planarization technique for planarizing the second electrode and the like and the first electrode, a laser planarization method, a reflow method, a CMP (Chemical Mechanical Polishing) method, or the like can be used.

As examples of a material configuring the insulating film and the insulating layer, not only inorganic insulating materials, examples of which include metal oxide high dielectric insulating materials such as a silicon oxide-based material; a silicon nitride ($SiN_Y$); an aluminum oxide ($Al_2O_3$), a hafnium oxide ($HfO_2$), and a zirconium oxide ($ZrO_2$), but also polymethyl methacrylate (PMMA); polyvinyl phenol (PVP); polyvinyl alcohol (PVA); polyimide; polycarbonate (PC); polyethylene terephthalate (PET); polystyrene; silanol derivatives (silane coupling agents) such as N-(2-aminoethyl)-3-aminopropyltrimethoxysilane (AEAPTMS), 3-mercaptopropyl trimethoxysilane (MPTMS), and octadecyltrichlorosilane (OTS); a novolak type phenolic resin; a fluorine-based resin; and organic insulating materials (organic polymers), examples of which include a straight-chain hydrocarbon having, on one end, a functional group bondable to an electrode such as octadecanethiol and dodecyl isocyanate can be cited, and a combination thereof can be used. It is noted that, as examples of a silicon oxide-based material, a silicon oxide ($SiO_X$), BPSG, PSG, BSG, AsSG, PbSG, a silicon oxynitride (SiON), an SOG (spin-on-glass), and a low dielectric material (for example, polyaryl ether, cyclo perfluorocarbon polymer and benzocyclobutene, a cyclic fluorine resin, polytetrafluoroethylene, an aryl ether fluoride, a polyimide fluoride, an amorphous carbon, and an organic SOG) can be cited. Materials configuring various interlayer insulating layers is only required to be also selected from among these materials as appropriate.

The various transistors are connected to the control section as needed. Configurations and structures of the various transistors formed in the semiconductor layer can be made similar to those of conventional transistors. The drive circuit configuring the control section can have a well-known configuration and a well-known structure.

As examples of a material configuring the contact hole sections, polysilicon doped with impurities, high melting point metals and metal silicides such as tungsten, Ti, Pt, Pd, Cu, TiW, TiN, TiNW, $WSi_2$, and $MoSi_2$, and a stacked structure (for example, Ti/TiN/W) of layers including these materials can be cited.

A first carrier blocking layer may be provided between the organic photoelectric conversion layer and the first electrode, and a second carrier blocking layer may be provided between the organic photoelectric conversion layer and the second electrode. In addition, a first charge injection layer may be provided between the first carrier blocking layer and the first electrode, and a second charge injection layer may be provided between the second carrier blocking layer and the second electrode. As examples of a material configuring the electrode injection layer, alkali metals such as lithium (Li), sodium (Na), and potassium (K) as well as fluorides thereof and oxides thereof, and alkaline earth metals such as magnesium (Mg) and calcium (Ca) as well as fluorides thereof and oxides thereof can be cited.

As examples of a film formation method of forming various organic layers, a dry film formation method and a wet film formation method can be cited. As examples of the dry film formation method, a vacuum vapor deposition method using resistance heating, radio frequency heating, or electron beam heating, a flash vapor deposition method, a plasma vapor deposition method, an EB vapor deposition method, various sputtering methods (a 2-pole sputtering method, a direct-current sputtering method, a direct-current magnetron sputtering method, a radio frequency sputtering method, a magnetron sputtering method, an RF-DC coupled bias sputtering method, an ECR sputtering method, a facing target sputtering method, a radio frequency sputtering method, and an ion beam sputtering method), a DC (direct-current) method, an RF method, a multiple cathode method, an activation reaction method, an electric field vapor deposition method, various ion plating methods such as a radio frequency ion plating method and a reactive ion plating method, a laser ablation method, a molecular beam epitaxy method, a laser transfer method, and a molecular beam epitaxy (MBE) method can be cited. In addition, as examples of the CVD method, a plasma CVD method, a thermal CVD method, an MOCVD method, and a photo-induced CVD method can be cited. On the other hand, as examples of the wet method, specifically, a spin coating method; an immersion method; a casting method; a micro-contact printing method; a drop-casting method; various printing methods such as a screen printing method, an inkjet printing method, an offset printing method, a gravure printing method, and a flexographic printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method can be cited. It is noted that as for the coating methods, as examples of a solvent, non-polar or low-polar organic solvents such as toluene, chloroform, hexane, and ethanol can be cited. As examples of the patterning method, chemical etching such as shadow masking, laser transfer, and photolithography, and physical etching with ultraviolet light, a laser, and the like can be cited. As the planarization technique for planarizing various organic layers, a laser planarization method, a reflow method, or the like can be used.

As described above, in the imaging element or the solid-state imaging device, the on-chip microlens and the light shielding layer may be provided as needed, and the drive circuit for driving the imaging element and interconnections are provided. A shutter for controlling incidence of light on the imaging element may be provided as needed, and the solid-state imaging device is sufficient to have an optical cut-off filter according to a purpose thereof.

For example, in a case of stacking the solid-state imaging device and a read-out integrated circuit (ROIC), a driving substrate in which the read-out integrated circuit and a connection section including copper (Cu) are formed and the imaging element in which a connection section is formed are superimposed so that the connection sections are joined to each other, thereby making it possible to stack the solid-state imaging device and the read-out integrated circuit (ROIC). Alternatively, the connection sections may be joined using a solder bump or the like. Alternatively, the imaging element or the solid-state imaging device can be configured such that a drive circuit chip is disposed in a peripheral region of the semiconductor layer and that driving lines and signal lines for driving the various transistors provided in the semiconductor layer are electrically connected to a drive circuit provided in the drive circuit chip. It is noted that as examples of electrical connection, a method using a solder bump (method based on a chip-on-chip scheme) can be cited or a method using a through-chip via (TCV) or a through-silicon via (TSV) may be adopted.

First Embodiment

Figure 1B:
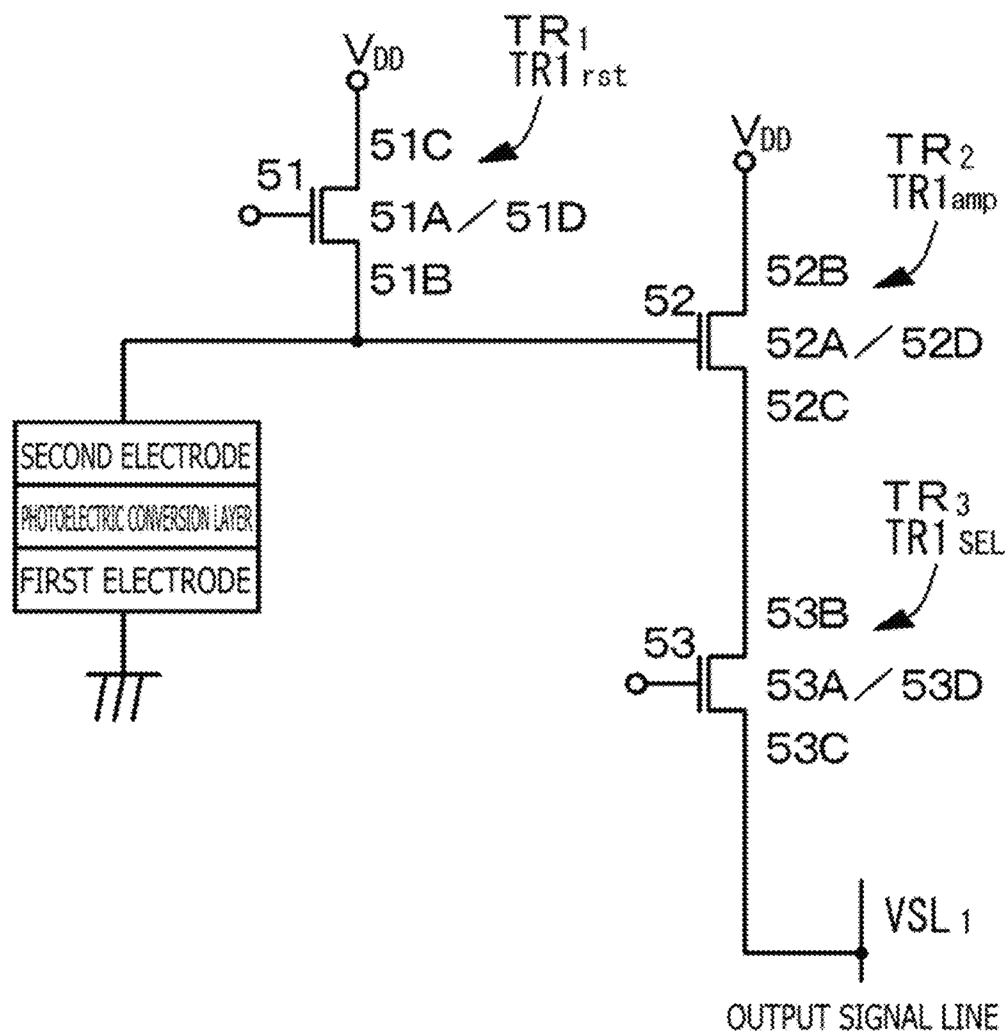
Figure 5:
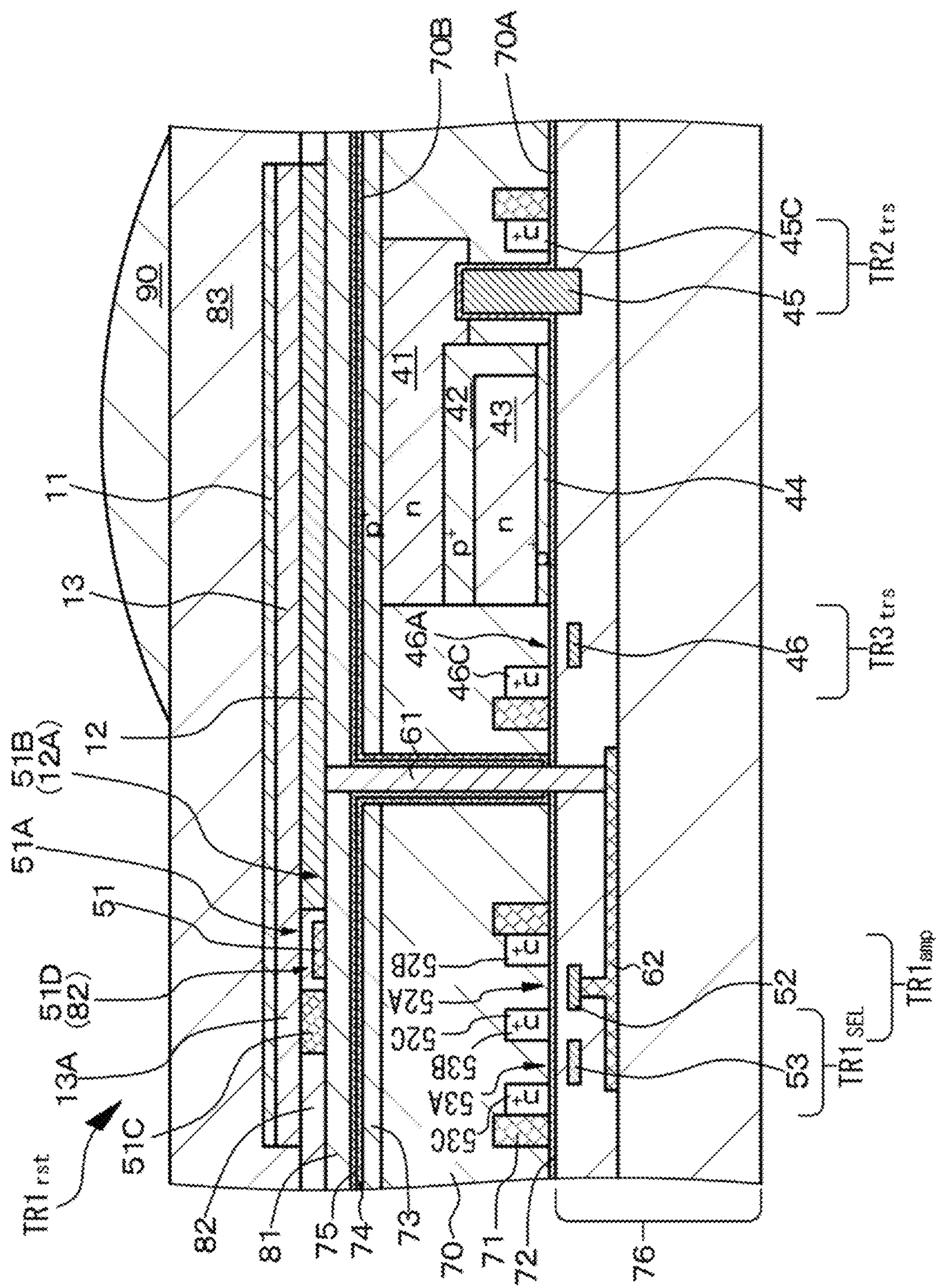
FIG. 5 is a schematic partial cross-sectional view of the imaging element or a stacked imaging element of the first embodiment, taken along an arrow X-X of FIG. 6.
Figure 6:
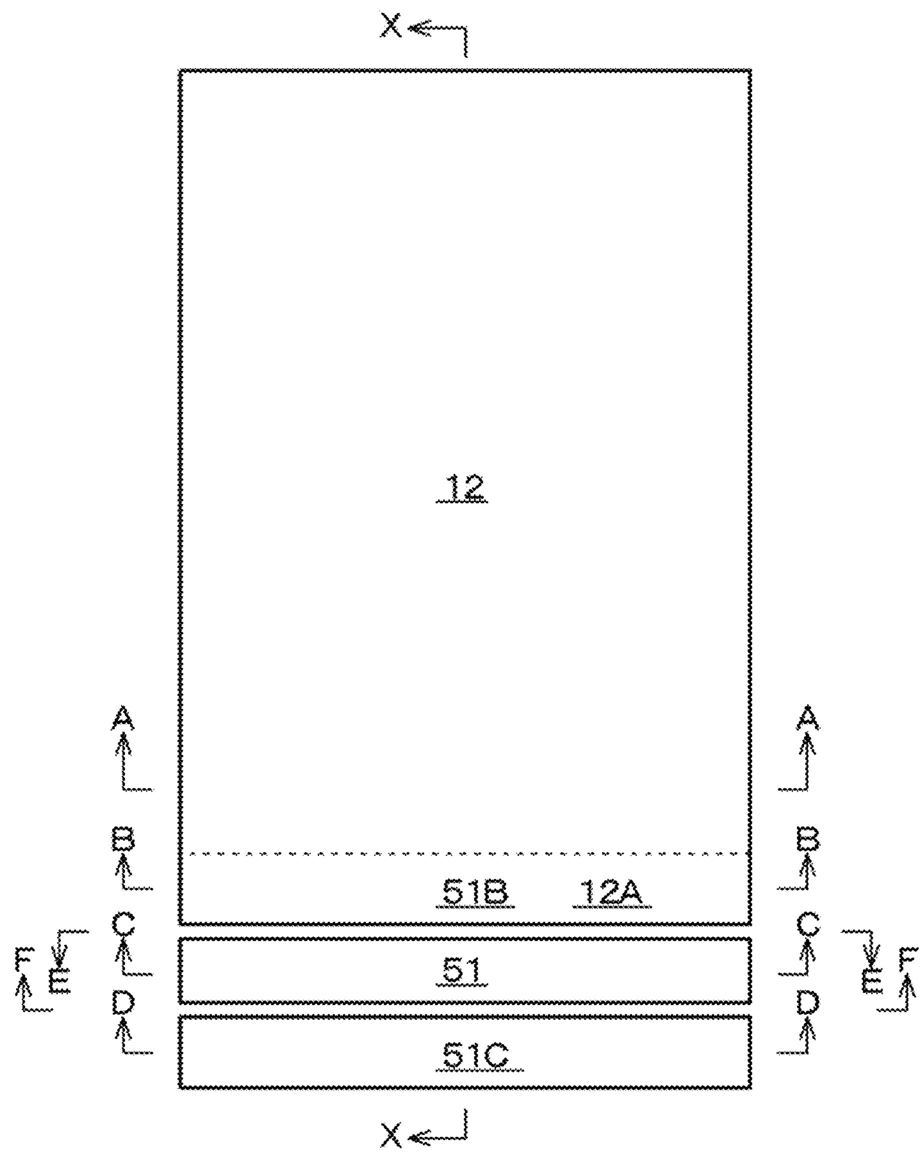
FIG. 6 is a schematic plan view of a second electrode and the like in the imaging element or the stacked imaging element of the first embodiment.
Figure 7A:
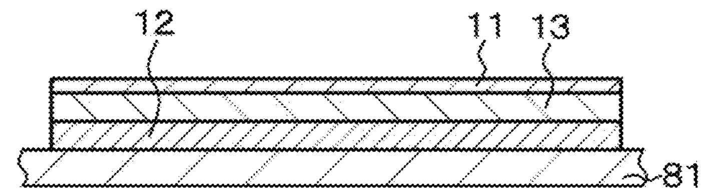
FIGS. 7A, 7B, 7C, 7D, and 7E are schematic partial cross-sectional views of the imaging element or the stacked imaging element of the first embodiment, taken along arrows A-A, B-B, C-C, D-D, and E-E (or F-F) of FIG. 6.
Figure 7B:
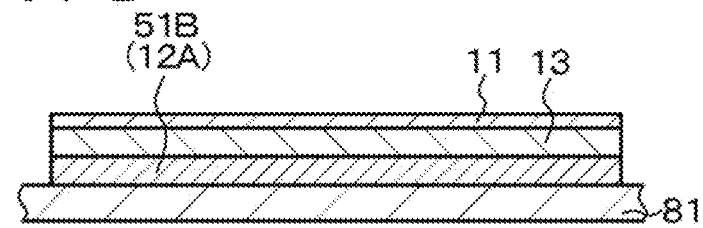
Figure 7C:
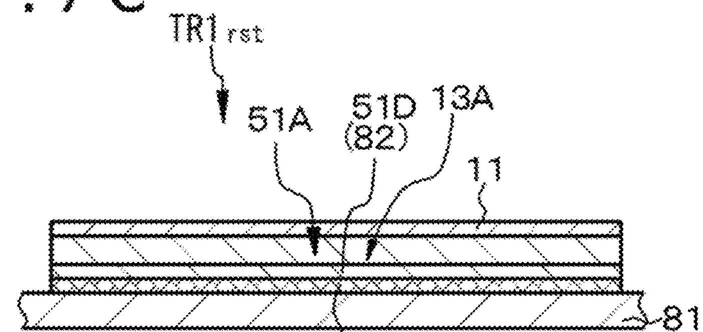
Figure 7D:
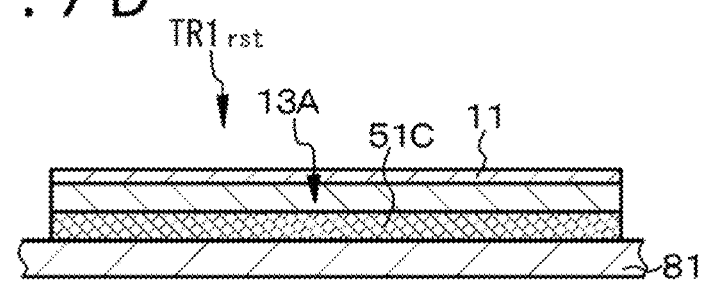
Figure 7E:
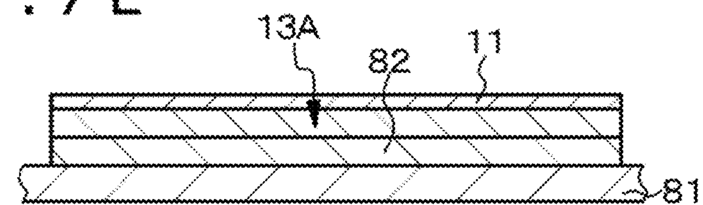
Figure 8:
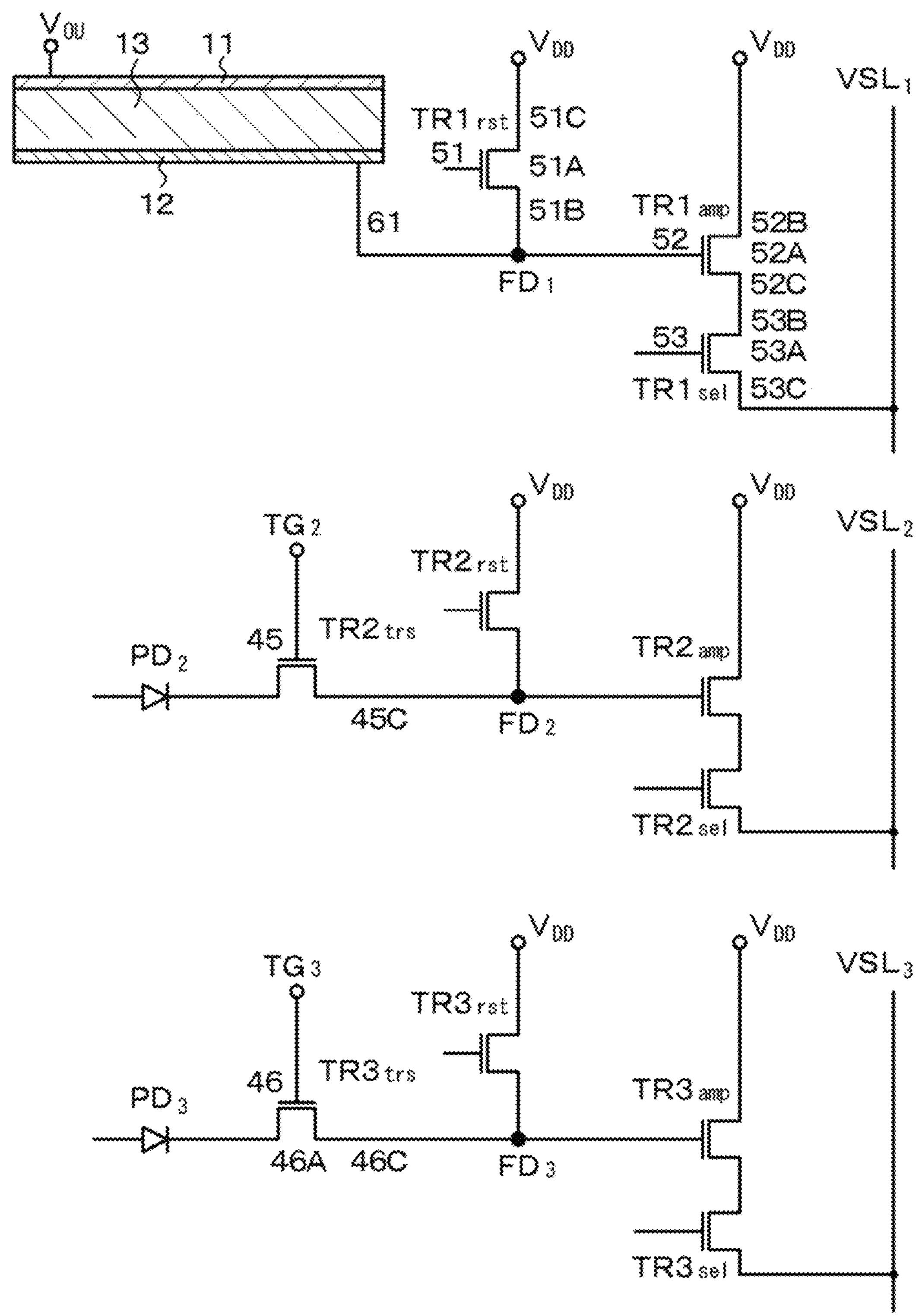
FIG. 8 is an equivalent circuit diagram of the imaging element or the stacked imaging element of the first embodiment.
Figure 9:
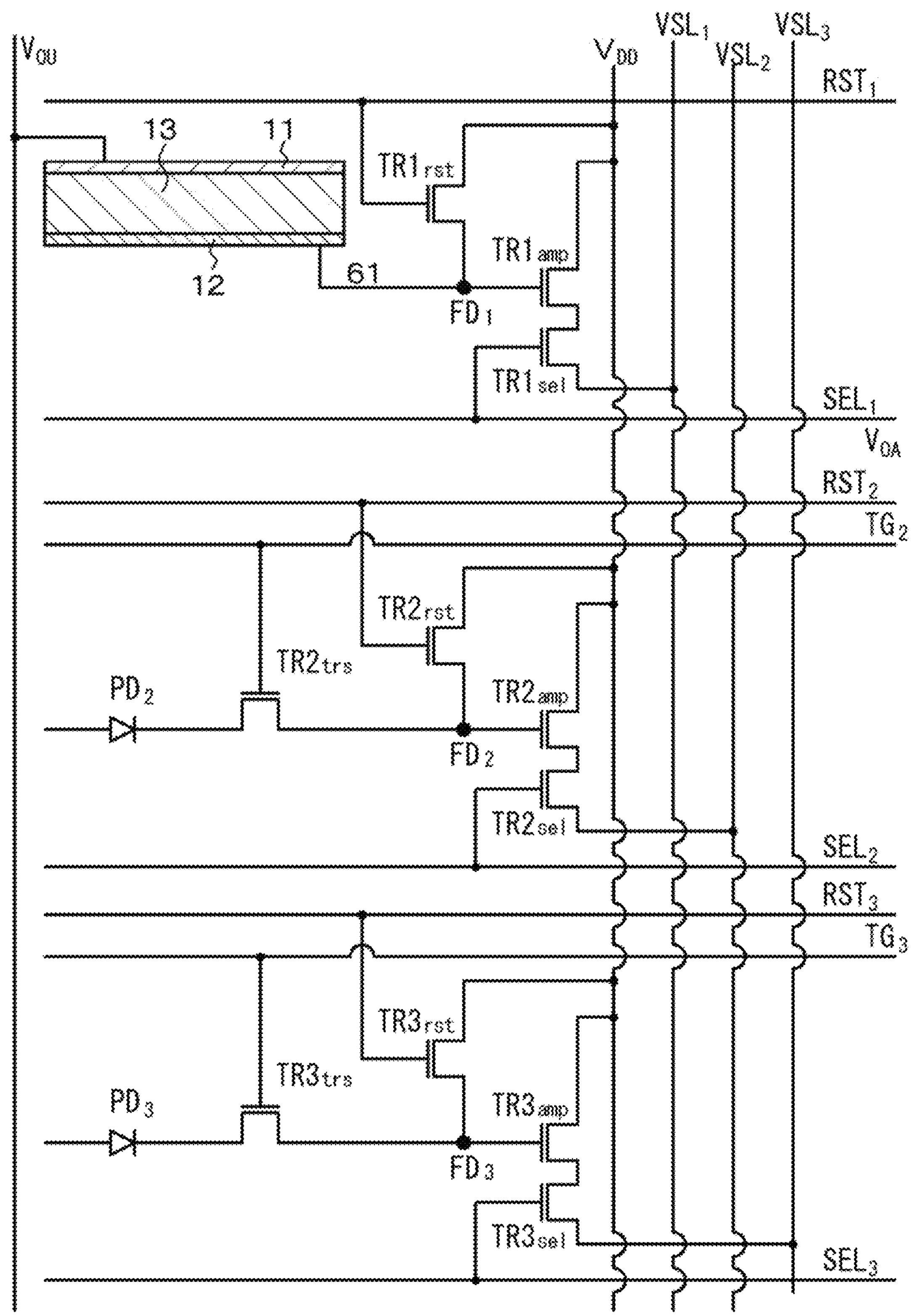
FIG. 9 is an equivalent circuit diagram of the imaging element or the stacked imaging element of the first embodiment.

A first embodiment relates to the imaging element according to the first aspect of the present disclosure, and specifically relates to the imaging element according to the aspect 1-A of the present disclosure, the stacked imaging element according to the present disclosure, and the solid-state imaging devices according to the first and second aspects of the present disclosure. FIG. 1A depicts a conceptual diagram of the imaging element according to the first embodiment, and FIG. 1B depicts an equivalent circuit diagram of the imaging element according to each of the first to third aspects of the present disclosure. Furthermore, FIG. 6 depicts a schematic plan view of a second electrode and the like in the imaging element or the stacked imaging element according to the first embodiment, FIG. 5 depicts a schematic partial cross-sectional view of the imaging element or the stacked imaging element according to the first embodiment, taken along an arrow X-X of FIG. 6, and FIGS. 7A, 7B, 7C, 7D, and 7E depict schematic partial cross-sectional views of the imaging element or the stacked imaging element according to the first embodiment, taken along arrows A-A, B-B, C-C, D-D, and E-E (or an arrow F-F) of FIG. 6. Moreover, FIGS. 8 and 9 depict equivalent circuit diagrams of the imaging element or the stacked imaging element according to the first embodiment.

The imaging element (for example, a green light imaging element to be described later) according to the first embodiment has at least a photoelectric conversion section, a first transistor $TR_1$, and a second transistor $TR_2$. In addition, the photoelectric conversion section includes:

a photoelectric conversion layer 13 that has a first surface and a second surface opposed to the first surface and on which light is incident from a first surface side;

a first electrode 11 that is provided to adjoin the first surface of the photoelectric conversion layer 13; and a second electrode 12 that is provided to adjoin the second surface of the photoelectric conversion layer 13. The imaging element further has:

a first photoelectric conversion layer extension section 13A that extends from the photoelectric conversion layer 13;

a third electrode 51 that is formed to be opposed to a second surface of the first photoelectric conversion layer extension section 13A via an insulating film 82, the second surface of the first photoelectric conversion layer extension section 13A being on a same side as a side of the second surface of the photoelectric conversion layer 13; and a fourth electrode 51C that is provided to adjoin the second surface of the first photoelectric conversion layer extension section 13A.

In addition, the first transistor $TR_1$ includes: a second electrode 12A (51B) that functions as one source/drain section (source/drain electrode); the third electrode 51 that functions as a gate section; the fourth electrode 51C that functions as the other source/drain section (source/drain electrode) and that is connected to a power supply section $V_{DD}$; and the first photoelectric conversion layer extension section 13A that functions as a channel formation region 51A, a gate section 52 of the second transistor $TR_2$ is connected to the second electrode 12, and one source/drain section 52B of the second transistor $TR_2$ is connected to the power supply section $V_{DD}$.

Furthermore, the imaging element of the first embodiment further has a third transistor $TR_3$, one source/drain section 53B of the third transistor $TR_3$ is connected to the other source/drain section 52C of the second transistor $TR_2$, and the other source/drain section 53C of the third transistor $TR_3$ is connected to a signal line (output signal line) $VSL_1$.

Here, the first transistor $TR_1$ is also referred to as reset transistor ($TR\mathbf{1}_{rst}$), the second transistor $TR_2$ is also referred to as amplification transistor ($TR\mathbf{1}_{amp}$), and the third transistor $TR_3$ is also referred to as selection transistor ($TR\mathbf{1}_{sel}$). The similar thing is true for the following description. Furthermore, in the drawings except for FIGS. 1 to 4, the first transistor $TR_1$ is denoted as "$TR\mathbf{1}_{rst}$," the second transistor $TR_2$ is denoted as "$TR\mathbf{1}_{amp}$" and the third transistor $TR_3$ is denoted as "$TR\mathbf{1}_{sel}$".

Moreover, the stacked imaging element of the first embodiment has at least one imaging element of the first embodiment, and in the first embodiment, the stacked imaging element has one imaging element of the first embodiment.

Moreover, the solid-state imaging device of the first embodiment has a plurality of stacked imaging elements of the first embodiment.

In addition, the photoelectric conversion layer 13 includes an organic photoelectric conversion material as described later.

Furthermore, the imaging element of the first embodiment is the imaging element according to the aspect 1-A of the present disclosure and further has a semiconductor layer 70, the second transistor $TR_2$ ($TR\mathbf{1}_{amp}$) and the third transistor $TR_3$ ($TR\mathbf{1}_{sel}$) are formed in the semiconductor layer 70, the photoelectric conversion section and the first transistor $TR_1$ ($TR\mathbf{1}_{rst}$) are formed above the semiconductor layer 70, and the gate section 52 of the second transistor $TR_2$ ($TR\mathbf{1}_{amp}$) is connected to the second electrode 12 via a first contact hole section 61.

As described above, the imaging element of the first embodiment further has the semiconductor substrate, which is specifically a semiconductor substrate (more specifically, silicon semiconductor substrate) 70, and the photoelectric conversion section is disposed above the semiconductor substrate 70. In addition, the imaging element of the first embodiment further has a control section that is provided in the semiconductor substrate 70 and that has a drive circuit to which the second electrode 12 is connected. It is defined herein that a light incidence surface of the semiconductor substrate 70 is upward and an opposite side to the semiconductor substrate 70 is downward. An interconnection layer 62 including a plurality of interconnections is provided below the semiconductor substrate 70. Moreover, at least the second transistor $TR_2$ (amplification transistor $TR\mathbf{1}_{amp}$) and the third transistor $TR_2$ (selection transistor $TR\mathbf{1}_{sel}$) configuring the control section are provided in the semiconductor substrate 70, and the second electrode 12 is connected to the gate section 52 of the amplification transistor $TR\mathbf{1}_{amp}$. Furthermore, the other source/drain section (source/drain region) 52C of the amplification transistor $TR\mathbf{1}_{amp}$ is connected to one source/drain section (source/drain region) 53B of the selection transistor $TR\mathbf{1}_{sel}$, and the other source/drain section 53C of the selection transistor $TR\mathbf{1}_{sel}$ is connected to the signal line $VSL_1$. Specifically, the other source/drain section (source/drain region) 52C of the amplification transistor $TR\mathbf{1}_{amp}$ and the one source/drain section (source/drain region) 53B of the selection transistor $TR\mathbf{1}_{sel}$ are shared (commonly provided).

Specifically, the imaging element or the stacked imaging element of the first embodiment is a back irradiation type imaging elements or stacked imaging elements, and has a structure of stacking three imaging elements, that is, the first type green light imaging element of the first embodiment (hereinafter, referred to as "first imaging element") that has the first type green light photoelectric conversion layer absorbing green light and that is sensitive to the green light, the second type blue light imaging element of the conventional technique (hereinafter, referred to as "second imaging element") that has the second type blue light photoelectric conversion layer absorbing blue light and that is sensitive to the blue light, and the second type red light imaging element of the conventional technique (hereinafter, referred to as "third imaging element") that has the second type red light photoelectric conversion layer absorbing red light and that is sensitive to the red light. Here, the red light imaging element (third imaging element) and the blue light imaging element (second imaging element) are provided in the semiconductor substrate 70, and the second imaging element is located closer to a light incidence side than the third imaging element. Furthermore, the green light imaging element (first imaging element) is provided above the blue light imaging element (second imaging element). A stacked structure of the first imaging element, the second imaging element, and the third imaging element configures one pixel. A color filter is not provided.

In the first imaging element, the second electrode 12 is formed on an interlayer insulating layer 81. The photoelectric conversion layer 13 is formed on the second electrode 12, and the first electrode 11 is formed on the photoelectric conversion layer 13. A protection layer 83 is formed on an entire surface including the first electrode 11, and an on-chip microlens 90 is provided on the protection layer 83. The second electrode 12 and the first electrode 11 are each configured from, for example, a transparent electrode including an ITO. The photoelectric conversion layer 13 is configured from a layer including a well-known organic photoelectric conversion material (for example, an organic material such as a rhodamine-based pigment or a quinacridone pigment) sensitive at least to the green light. In addition, the photoelectric conversion layer 13 may further have a material layer suited for charge accumulation. In other words, the material layer suited for charge accumulation may be further formed between the photoelectric conversion layer 13 and the second electrode 12. The interlayer insulating layer 81, the insulating film 82, and the protection layer 83 are configured from a well-known insulating material (for example, $SiO_2$ or SiN).

Element isolation regions 71 are formed on a first surface (front surface) 70A side of the semiconductor substrate 70, and an oxide film 72 is formed on the first surface 70A of the semiconductor substrate 70. Furthermore, the amplification transistor $TR\mathbf{1}_{amp}$ ($TR_2$) and the selection transistor $TR\mathbf{1}_{sel}$ ($TR_3$) configuring the control section of the first imaging element are provided on the first surface side of the semiconductor substrate 70.

The reset transistor $TR\mathbf{1}_{rst}$ (first transistor $TR_1$) is configured from the gate section 51, the channel formation region 51A, the source/drain sections 51B and 51C, and an insulating film (gate insulating film) 51D (82). The gate section 51 of the reset transistor $TR\mathbf{1}_{rst}$ is connected to a reset line $RST_1$, one source/drain section 51B of the reset transistor $TR\mathbf{1}_{rst}$ also functions as a first floating diffusion region, and the other source/drain section 51C is connected to the power supply $V_{DD}$. In addition, an interconnection portion from the second electrode 12 and the first contact hole section 61 to the gate section 52 of the amplification transistor $TR_j$, ($TR_2$) also functions as the first floating diffusion region.

The amplification transistor $TR\mathbf{1}_{amp}$ (second transistor $TR_2$) is configured from the gate section 52, a channel formation region 52A, the source/drain sections 52B and 52C, and a gate insulating film 72. The second electrode 12 is connected to the gate section 52 via the first contact hole section 61 formed in the semiconductor substrate 70 and the like and an interlayer insulating layer 76 and the interconnection layer 62 formed in the interlayer insulating layer 76. Furthermore, the one source/drain section 52B is connected to the power supply $V_{DD}$.

The selection transistor $TR\mathbf{1}_{sel}$(third transistor $TR_3$) is configured from the gate section 53, a channel formation region 53A, the source/drain sections 53B and 53C, and the gate insulating film 72. The gate section 53 is connected to a selection line $SEL_1$. In addition, the one source/drain section 53B shares a region with the other source/drain section 52C configuring the amplification transistor $TR\mathbf{1}_{amp}$, and the other source/drain section 53C is connected to the signal line (data output line) $VSL_1$ (117).

The second imaging element has the n-type semiconductor region 41 provided in the semiconductor substrate 70 as a photoelectric conversion layer. A gate section 45 of a transfer transistor $TR\mathbf{2}_{trs}$ including a vertical transistor extends to the n-type semiconductor region 41 and is also connected to a transfer gate line $TG_2$. In addition, a second floating diffusion layer $FD_2$ is provided in a region 45C in the semiconductor substrate 70 near the gate section 45 of the transfer transistor $TR\mathbf{2}_{trs}$. Charges accumulated in the n-type semiconductor region 41 are read to the second floating diffusion layer $FD_2$ via a transfer channel formed along the gate section 45.

In the second imaging element, a reset transistor $TR\mathbf{2}_{rst}$, an amplification transistor $TR\mathbf{2}_{amp}$, and a selection transistor $TR\mathbf{2}_{sel}$ configuring the control section of the second imaging element are further provided on the first surface side of the semiconductor substrate 70.

The reset transistor $TR\mathbf{2}_{rst}$ is configured from a gate section, a channel formation region, and source/drain sections. The gate section of the reset transistor $TR\mathbf{2}_{rst}$ is connected to a reset line $RST_2$, one source/drain section of the reset transistor $TR\mathbf{2}_{rst}$ is connected to the power supply $V_{DD}$, and the other source/drain section also functions as the second floating diffusion layer $FD_2$.

The amplification transistor $TR\mathbf{2}_{amp}$ is configured from a gate section, a channel formation region, and source/drain sections. The gate section is connected to the other source/drain section (second floating diffusion layer $FD_2$) of the reset transistor $TR\mathbf{2}_{rst}$. In addition, the one source/drain section is connected to the power supply $V_{DD}$.

The selection transistor $TR\mathbf{2}_{sel}$ is configured from a gate section, a channel formation region, and source/drain sections. The gate section is connected to a selection line $SEL_2$. In addition, the one source/drain section of the selection transistor $TR\mathbf{2}_{sel}$ shares a region with the other source/drain section configuring the amplification transistor $TR\mathbf{2}_{amp}$, and the other source/drain section thereof is connected to a signal line (data output line) $VSL_2$.

The third imaging element has an n-type semiconductor region 43 provided in the semiconductor substrate 70 as a photoelectric conversion layer. A gate section 46 of a transfer transistor $TR\mathbf{3}_{trs}$ is connected to a transfer gate line $TG_3$. In addition, a third floating diffusion layer $FD_3$ is provided in a region 46C in the semiconductor substrate 70 near the gate section 46 of the transfer transistor $TR\mathbf{3}_{trs}$. Charges accumulated in the n-type semiconductor region 43 are read to the third floating diffusion layer $FD_3$ via a transfer channel 46A formed along the gate section 46.

In the third imaging element, a reset transistor $TR\mathbf{3}_{rst}$, an amplification transistor $TR\mathbf{3}_{amp}$, and a selection transistor $TR\mathbf{3}_{sel}$ configuring the control section of the third imaging element are further provided on the first surface side of the semiconductor substrate 70.

The reset transistor $TR\mathbf{3}_{rst}$ is configured from a gate section, a channel formation region, and source/drain sections. A gate section of the reset transistor $TR\mathbf{3}_{rst}$ is connected to a reset line $RST_3$, one source/drain section of the reset transistor $TR\mathbf{3}_{rst}$ is connected to the power supply $V_{DD}$, and the other source/drain section functions as the third floating diffusion layer $FD_3$.

The amplification transistor $TR\mathbf{3}_{amp}$ is configured from a gate section, a channel formation region, and source/drain sections. The gate section is connected to the other source/drain section (third floating diffusion layer $FD_3$) of the reset transistor $TR\mathbf{3}_{rst}$. In addition, the one source/drain section is connected to the power supply $V_{DD}$.

The selection transistor $TR\mathbf{3}_{sel}$ is configured from a gate section, a channel formation region, and source/drain sections. The gate section is connected to a selection line $SEL_3$. In addition, the one source/drain section of the selection transistor $TR\mathbf{3}_{sel}$ shares a region with the other source/drain section configuring the amplification transistor $TR\mathbf{3}_{amp}$, and the other source/drain section thereof is connected to a signal line (data output line) $VSL_3$.

The reset lines $RST_1$, $RST_2$, and $RST_3$ the selection lines $SEL_1$, $SEL_2$, and $SEL_3$, and the transfer gate lines $TG_2$ and $TG_3$ are connected to a vertical drive circuit 112 configuring the drive circuit, while the signal lines (data output lines) $VSL_1$, $VSL_2$, and $VSL_3$ are connected to a column signal processing circuit 113 configuring the drive circuit.

A $p^+$ layer 44 is provided between the n-type semiconductor region 43 and the surface 70A of the semiconductor substrate 70, and suppresses generation of a dark current. A $p^+$ layer 42 is formed between the n-type semiconductor regions 41 and 43, and furthermore, part of a side surface of the n-type semiconductor region 43 is surrounded by the $p^+$ layer 42. A $p^+$ layer 73 is formed on a rear surface 70B side of the semiconductor substrate 70, and an $HfO_2$ film 74 and a lower-layer insulating film 75 include the $p^+$ layer 73 to a part, in which the first contact hole section 61 is to be formed, within the semiconductor substrate 70. While a plurality of interconnections is formed in the interlayer insulating layer 76, the interconnections are not depicted.

The $HfO_2$ film 74 is a film having negative fixed charges and it is possible to suppress the generation of the dark current by providing such a film. It is noted that an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, an europium oxide ($Eu_2O_3$) film, a gadolium oxide ($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, a ytterbium oxide ($Yb_2O_3$) film, a lutetium oxide ($Lu_2O_3$) film, a yttrium oxide ($Y_2O_3$) film, a hafnium nitride film, an aluminum nitride film, a hafnium oxynitride film, or an aluminum oxynitride film can be used as an alternative to the $HfO_2$ film. As examples of a film formation method of forming these films, a CVD method, a PVD method, and an ALD method can be cited.

Figure 10:
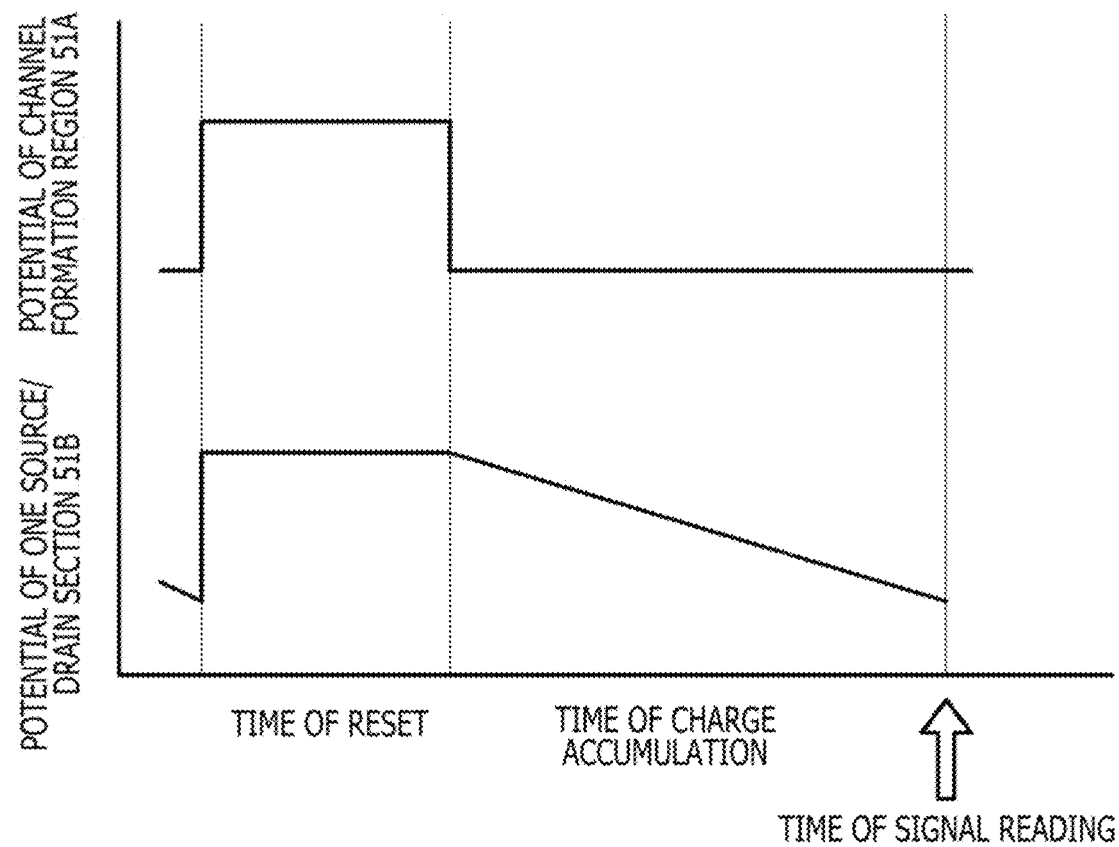
FIG. 10 is a schematic diagram of potential states of sites at time of an operation of the imaging element of the first embodiment.

An operation of the imaging element (first imaging element) of the first embodiment will be described hereinafter with reference to FIG. 10 that is a schematic diagram of potential states of sites at time of the operation of the imaging element of the first embodiment and FIG. 9 that is an equivalent circuit diagram of the imaging element or the stacked imaging element of the first embodiment. In other words, at a time of reset, the amplification transistor $TR\mathbf{1}_{amp}$, and the selection transistor $TR\mathbf{1}_{sel}$ are turned off and the first electrode 11 is set into a grounded state. In addition, the reset line $RST_1$ is set into an "H" state and a high potential is applied to the gate section 51, thereby turning off the reset transistor $TR\mathbf{1}_{rst}$ (first transistor $TR_1$). The other source/drain section 51C of the first transistor $TR_1$ is connected to the power supply section $V_{DD}$; thus, a potential of the channel formation region 51A in the first transistor $TR_1$, that of the one source/drain section 51B of the first transistor $TR_1$, and yet a potential of the second electrode 12 and that of the photoelectric conversion layer 13 adjacent to the second electrode 12 are equal to $V_{DD}$, thereby resetting the imaging element. At timing at which a reset operation is completed and charge accumulation is started, the reset line $RST_1$ is set into an "L" state and a low potential is applied to the gate section 51, thereby turning off the reset transistor $TR\mathbf{1}_{rst}$ (first transistor $TR_1$). When charges (specifically, electrons) obtained by photoelectric conversion by the photoelectric conversion layer 13 are accumulated in the second electrode 12, the potential of the second electrode 12 falls. In addition, at time of signal reading, the selection line $SEL_1$ is set into an "H" state and a high potential is applied to the gate section 53 of the selection transistor $TR\mathbf{1}_{sel}$, thereby turning on the selection transistor $TR\mathbf{1}_{sel}$ (third transistor $TR_3$). A current based on the potential of the second electrode 12 (that is, a potential of the gate section 52 of the amplification transistor $TR\mathbf{1}_{amp}$) is then passed from the one source/drain section 52B of the amplification transistor $TR\mathbf{1}_{amp}$ (second transistor $TR_2$) through the other source/drain section 52C thereof, further passed from the one source/drain section 53B of the selection transistor $TR\mathbf{1}_{sel}$ (third transistor $TR_3$) through the other source/drain section 53C thereof, and output to the signal line (data output line) $VSL_1$ as a signal (image signal). Furthermore, a series of operations including charge accumulation, a reset operation, and charge transfer of each of the second imaging element and third imaging element are similar to a series of conventional operations including the charge accumulation, the reset operation, and the charge transfer.

Figure 11:
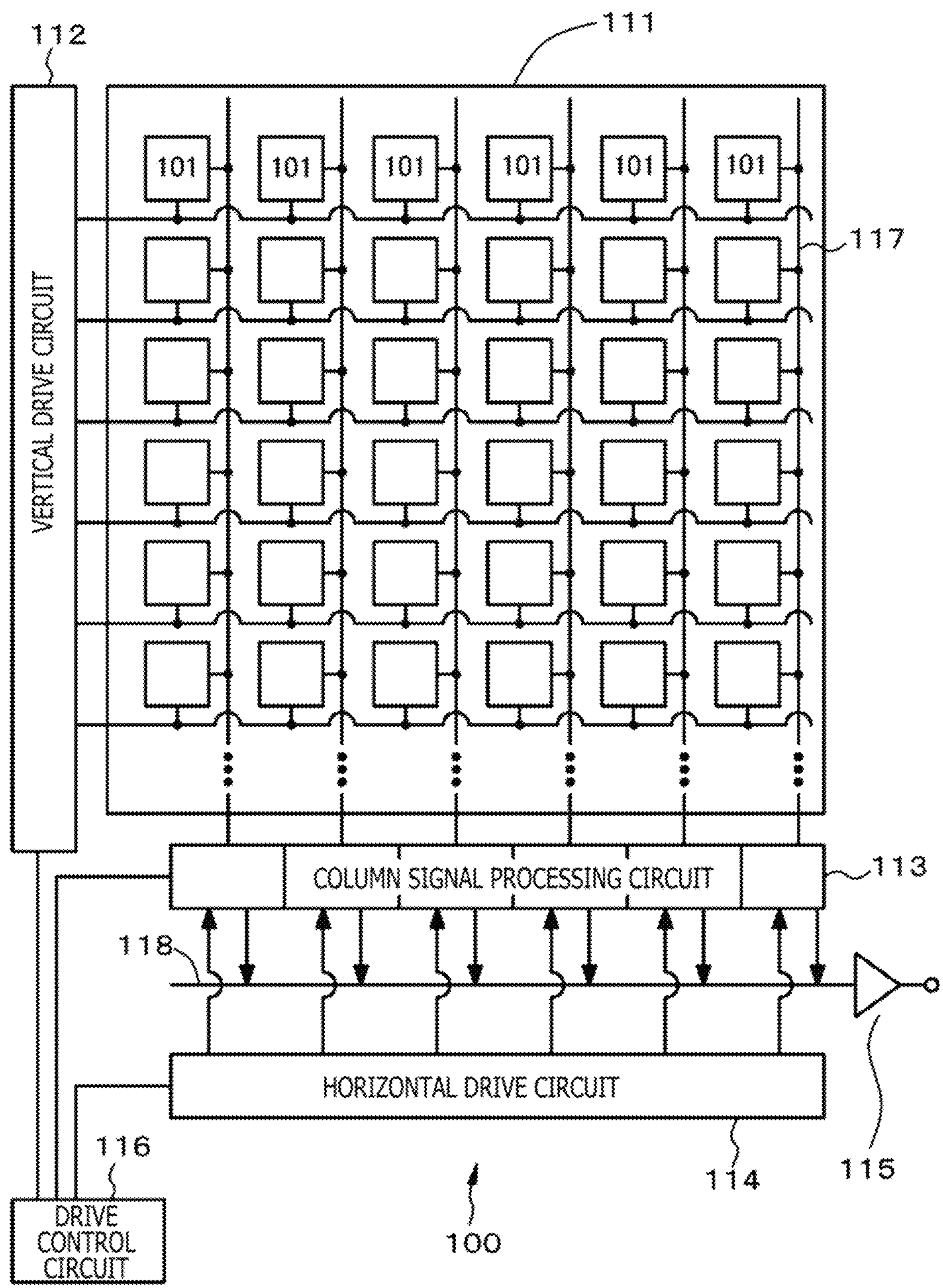
FIG. 11 is a conceptual diagram of a solid-state imaging device of the first embodiment.

FIG. 11 depicts a conceptual diagram of the solid-state imaging device of the first embodiment. A solid-state imaging device 100 of the first embodiment is configured from an imaging region 111 in which stacked imaging elements 101 are arranged in a two-dimensional array, the vertical drive circuit 112 serving as the drive circuits (peripheral circuit) of the stacked imaging elements 101, the column signal processing circuit 113, a horizontal drive circuit 114, an output circuit 115, a drive control circuit 116, and the like. Needless to say, these circuits can be configured from well-known circuits or can be configured using other circuit configurations (for example, various circuits used in a conventional CCD imaging device and a conventional CMOS imaging device). It is noted that the reference number "101" is illustrated only in one row of the stacked imaging elements 101 in FIG. 11.

The drive control circuit 116 generates clock signals and control signals that serve as references for operations of the vertical drive circuit 112, the column signal processing circuit 113, and the horizontal drive circuit 114, on the basis of a vertical synchronizing signal, a horizontal synchronizing signal, and a master clock. The generated clock signals and control signals are then input to the vertical drive circuit 112, the column signal processing circuit 113, and the horizontal drive circuit 114.

The vertical drive circuit 112 is configured with, for example, shift registers, and selectively and sequentially scans the stacked imaging elements 101 in the imaging region 111 per row in the perpendicular direction. Pixel signals (image signals) based on currents (signals) generated in response to quantities of received light of the stacked imaging elements 101 are sent to the column signal processing circuit 113 via signal lines (data output lines) 117, VSLs.

The column signal processing circuit 113 is disposed, for example, per column of the stacked imaging elements 101, and performs a signal process including noise removal and signal amplification on the image signals output from the stacked imaging elements 101 in one row by signals from black reference pixels (formed around an effective pixel region, not depicted) per imaging element. A horizontal selection switch (not depicted) is provided on an output stage of the column signal processing circuit 113 to be connected between the output stage and a horizontal signal line 118.

The horizontal drive circuit 114 is configured with, for example, shift registers, sequentially selects the column signal processing circuits 113 by sequentially outputting horizontal scanning pulses, and drives the column signal processing circuits 113 to output signals to the horizontal signal line 118.

The output circuit 115 performs a signal process on the signals sequentially supplied from the column signal processing circuits 113 via the horizontal signal line 118, and outputs the processed signals.

The imaging element or the stacked imaging element of the first embodiment can be produced by, for example, the following method. In other words, an SOI substrate is prepared first. A first silicon layer is then formed on a surface of the SOI substrate on the basis of an epitaxial growth method and the $p^+$ layer 73 and the n-type semiconductor region 41 are formed in this first silicon layer. Next, a second silicon layer is formed on the first silicon layer on the basis of the epitaxial growth method, and the element isolation regions 71, the oxide film 72, the $p^+$ layer 42, the n-type semiconductor region 43, and the $p^+$ layer 44 are formed in this second silicon layer. Furthermore, various transistors configuring the control section of the imaging element are formed in the second silicon layer, the interconnection layer 62, the interlayer insulating layer 76, various interconnections are further formed on the second silicon layer, and the interlayer insulating layer 76 is then bonded to a supporting substrate (not depicted). Subsequently, the SOI substrate is removed and the first silicon layer is exposed. It is noted that a surface of the second silicon layer corresponds to the front surface 70A of the semiconductor substrate 70, and the surface of the first silicon layer corresponds to a rear surface 70B of the semiconductor substrate 70. In addition, the first silicon layer and the second silicon layer are collectively expressed as the semiconductor substrate (semiconductor layer) 70. Next, an opening portion for forming the first contact hole section 61 is formed on the rear surface 70B side of the semiconductor substrate 70, the $HfO_2$ film 74, the lower-layer insulating film 75, and the first contact hole section 61 are formed, and the interlayer insulating layer 81, the second electrode 12, the third electrode 51, the fourth electrode 51C, the insulating film 82, the photoelectric conversion layer 13, the first electrode 11, the protection layer 83, and the on-chip microlens 90 are further formed. As a result, the imaging element or the stacked imaging element of the first embodiment can be obtained.

A specific process of manufacturing the reset transistor $\mathbf{TR1}_{rst}$ (first transistor $TR_1$) depicted in FIG. 5 will be described on the basis of FIGS. 65A, 65B, 65C, 65D, and 65E that are schematic partial end views of the interlayer insulating layer 81 and the like. It is noted that various constituent elements located below the interlayer insulating layer 81 are not depicted in these drawings.

Figure 65A:
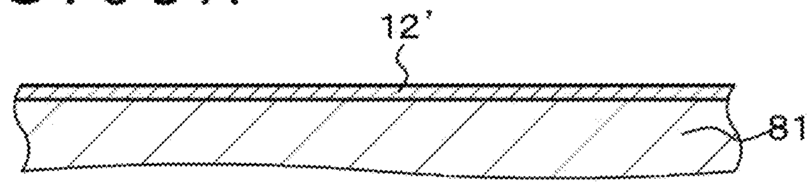
FIGS. 65A, 65B, 65C, 65D, and 65E are schematic partial end views of an interlayer insulating layer and the like for describing a manufacturing process for manufacturing a reset transistor $TR1_{rst}$ (first transistor $TR_1$) depicted in FIG. 5.
Figure 65B:
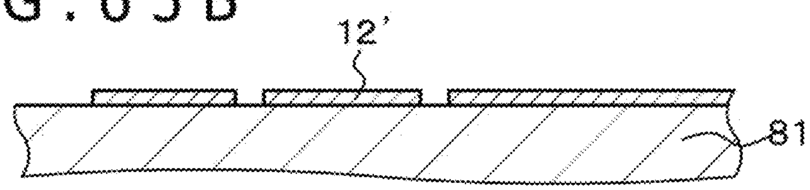
Figure 65C:
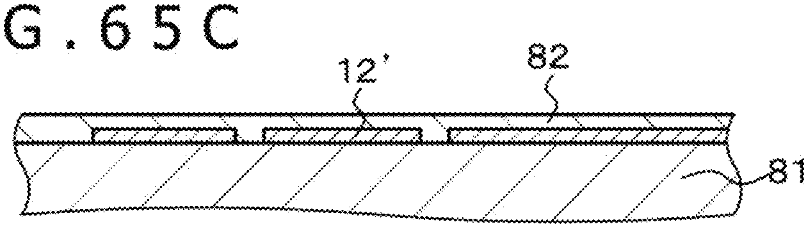
Figure 65D:
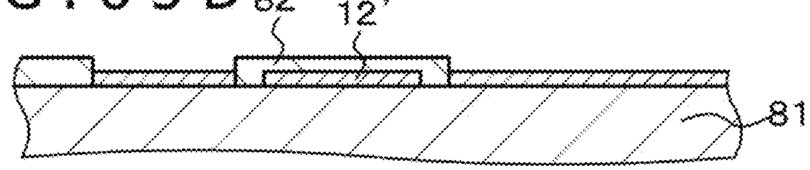
Figure 65E:
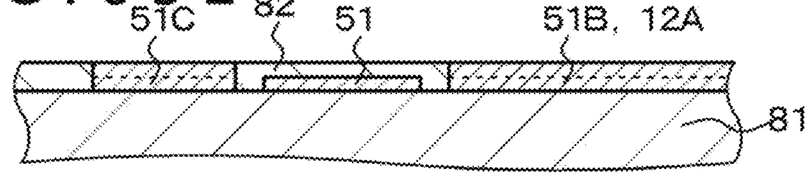

First, an ITO layer 12' for forming part of the second electrode 12, the gate section 51, and the like is formed on the interlayer insulating layer 81 (refer to FIG. 65A). Subsequently, portions of the ITO layer 12', in which the second electrode 12, the second electrode extension section 12A, the gate section 51, and the source/drain section (fourth electrode) 51C are to be formed, are left on the basis of a photolithography technique and an etching technique. As a result, a structure depicted in FIG. 65B can be obtained. Subsequently, the insulating film 82 is formed on an entire surface (refer to FIG. 65C). Next, the insulating film 82 above portions, in which the second electrode 12, the second electrode extension section 12A, and the source/drain section (fourth electrode) 51C are to be formed, is removed on the basis of the photolithography technique and the etching technique. As a result, a structure depicted in FIG. 65D can be obtained. Subsequently, an ITO layer is formed on the entire surface and unnecessary portions of the ITO layer are removed on the basis of an etch-back method; thus, a structure depicted in FIG. 65E can be obtained. Next, the photoelectric conversion layer 13 and the first electrode 11 are formed on the entire surface. As a result, the first transistor $TR_1$ (reset transistor $\mathbf{TR1}_{rst}$) can be obtained.

Figure 12:
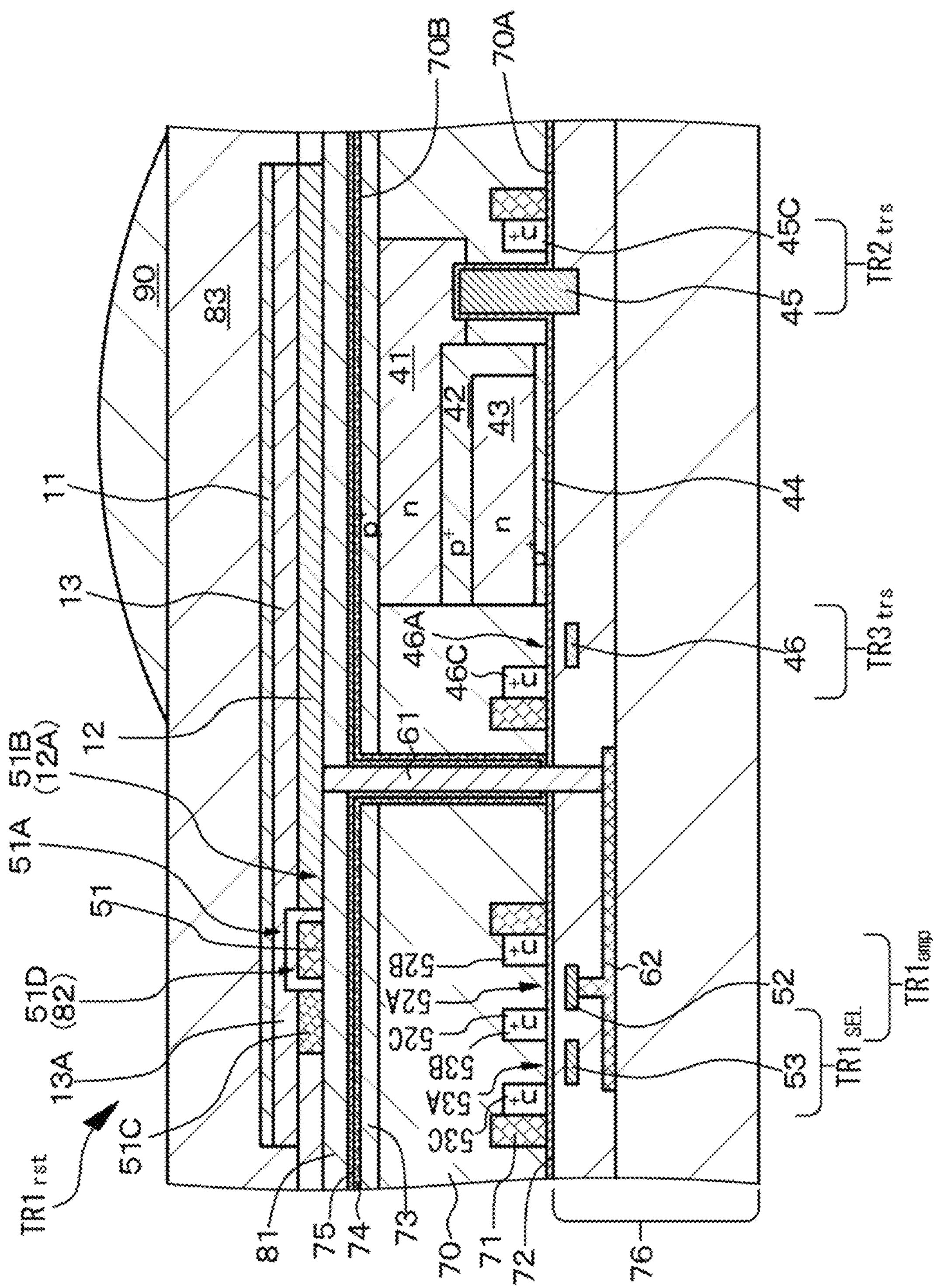
FIG. 12 is a schematic partial cross-sectional view of a modification of the imaging element or the stacked imaging element of the first embodiment, taken along the arrow X-X of FIG. 6.

As can be understood from FIG. 12 that depicts a modification of the imaging element of the first embodiment, the imaging element can be formed such that a thickness of a part 13A' of the first photoelectric conversion layer extension section 13A is smaller than that of the photoelectric conversion layer 13. In other words, a total thickness of the gate section 51 and the insulating film (gate insulating film) 51D is equal to the thickness of the photoelectric conversion layer 13.

A specific process of manufacturing the reset transistor $\mathbf{TR1}_{rst}$ (first transistor $TR_1$) depicted in FIG. 12 will be described on the basis of FIGS. 66A, 66B, 66C, and 66D that are schematic partial end views of the interlayer insulating layer 81 and the like. It is noted that various constituent elements located below the interlayer insulating layer 81 are not depicted in these drawings.

Figure 66A:
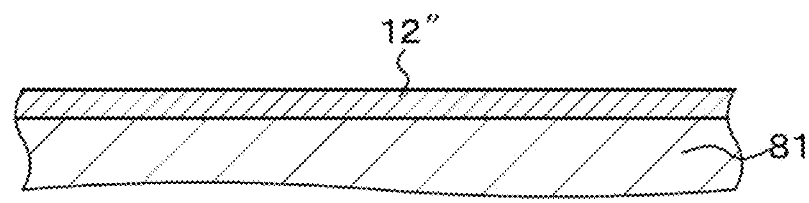
FIGS. 66A, 66B, 66C, and 66D are schematic partial end views of the interlayer insulating layer and the like for describing a manufacturing process for manufacturing the reset transistor $TR1_{rst}$ (first transistor $TR_1$) depicted in FIG. 12.
Figure 66B:
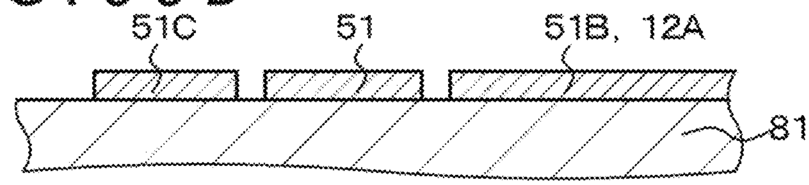
Figure 66C:
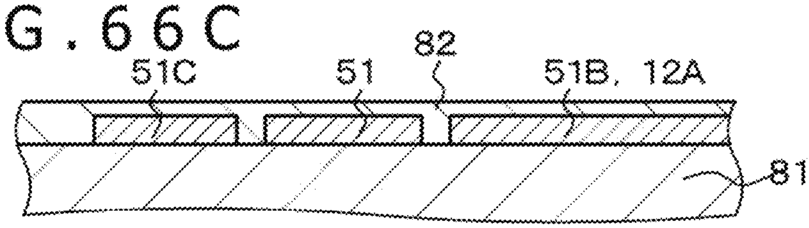
Figure 66D:
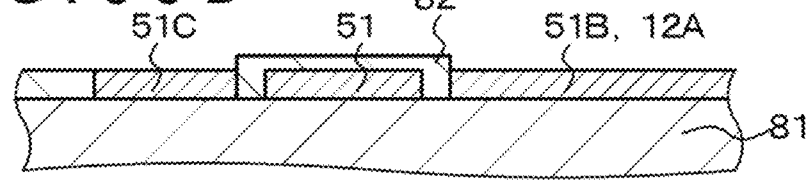
Figure 67:
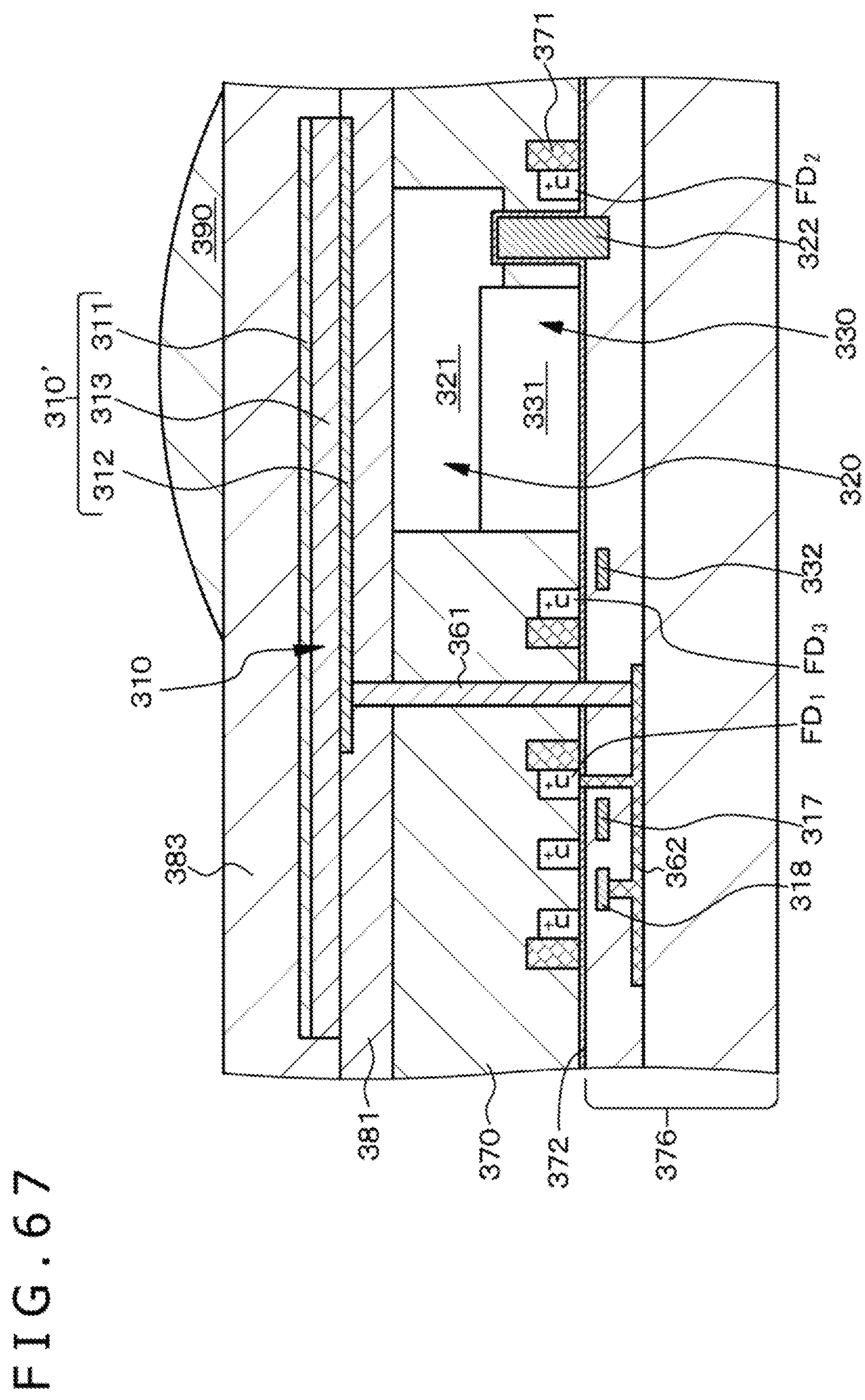
FIG. 67 is a conceptual diagram of a conventional stacked imaging element (stacked solid-state imaging device).

First, an ITO layer 12" for forming part of the second electrode 12, the gate section 51, and the like is formed on the interlayer insulating layer 81 (refer to FIG. 66A). Subsequently, the second electrode 12, the second electrode extension section 12A, the gate section 51, and the source/drain section (fourth electrode) 51C are formed on the basis of the photolithography technique and the etching technique. As a result, a structure depicted in FIG. 66B can be obtained. Subsequently, the insulating film 82 is formed on the entire surface and a planarization process is performed on the insulating film 82. As a result, a structure depicted in FIG. 66C can be obtained. Next, the insulating film 82 on the gate section 51 is left and the insulating film 82 on the second electrode 12, the second electrode extension section 12A, the source/drain section (fourth electrode) 51C, and the like is removed on the basis of the photolithography technique and the etching technique. As a result, a structure depicted in FIG. 66D can be obtained. Subsequently, the photoelectric conversion layer 13 and the first electrode 11 are formed on the entire surface. As a result, the first transistor $TR_1$ (reset transistor $\mathbf{TR1}_{rst}$) can be obtained.

Figure 13A:
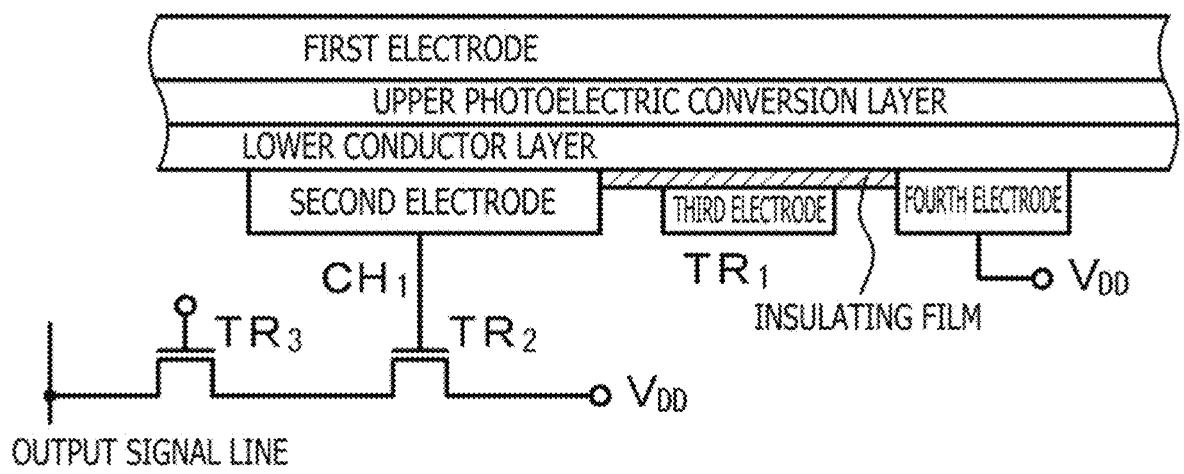
FIGS. 13A and 13B are conceptual diagrams of another modification of the imaging element of the first embodiment.
Figure 13B:
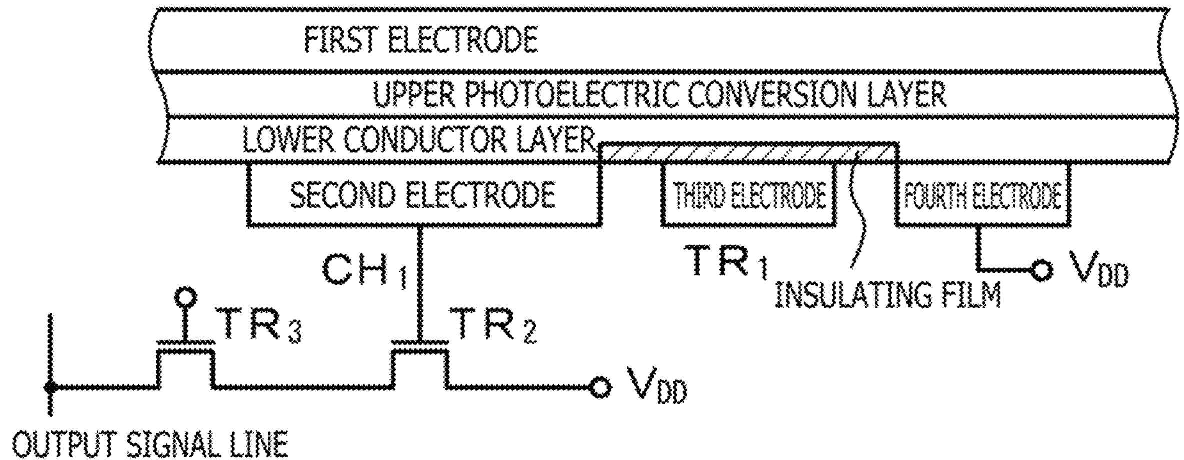

Alternatively, as can be understood from FIGS. 13A and 13B that are conceptual diagrams, the imaging element of the first embodiment can be formed such that at least the first photoelectric conversion layer extension section 13A has a stacked structure of a lower semiconductor layer and an upper photoelectric conversion layer from a second surface side. Furthermore, in this case, the photoelectric conversion layer 13 and the first photoelectric conversion layer extension section 13A have the stacked structure of the lower semiconductor layer and the upper photoelectric conversion layer from the second surface side. Moreover, in these forms, the imaging element of the first embodiment is preferably formed such that a semiconductor material configuring the lower semiconductor layer has band gap energy equal to or higher than 3.0 eV from the viewpoint of preventing absorption of visible light into the lower semiconductor layer. Specifically, the lower semiconductor layer is only required to be configured from, for example, a transparent oxide semiconductor material and the upper photoelectric conversion layer is only required to be configured from the same material as that configuring the photoelectric conversion layer 13. As the transparent oxide semiconductor material, IGZO or the like, for example, can be used.

Figure 14:
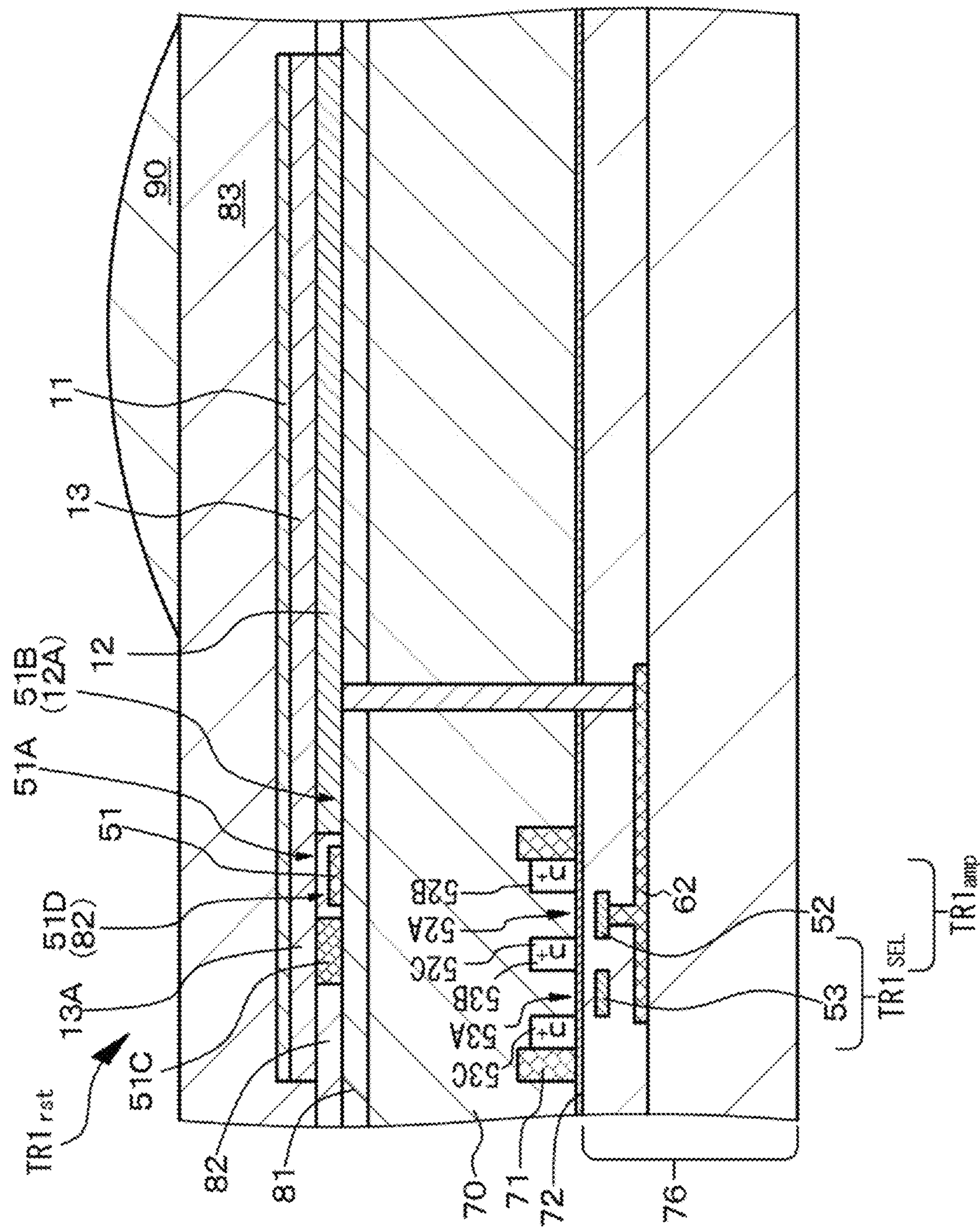
FIG. 14 is a schematic partial cross-sectional view of yet another modification of the imaging element of the first embodiment (imaging element configuring the solid-state imaging device according to the first aspect of the present disclosure), taken along the arrow X-X of FIG. 6.

A solid-state imaging device having a plurality of imaging elements of the first embodiment can be provided. A modification of the imaging element of the first embodiment depicted in FIG. 14 that is a schematic partial cross-sectional view is a back irradiation type imaging element and configured from the first type, first imaging element of the first embodiment. Here, the first imaging element is configured from three types of imaging elements, that is, the imaging element absorbing the red light, the imaging element absorbing the green light, and the imaging element absorbing the blue light. Furthermore, a plurality of imaging elements as above configures the solid-state imaging device according to the first aspect of the present disclosure. As an example of disposing the plurality of imaging elements, the Bayer array can be cited. A color filter for dispersing the blue light, the green light, and the red light is provided on the light incidence side of each imaging element as needed. It is noted that the solid-state imaging device may have a plurality of imaging elements of the second to sixth embodiments described later.

It is noted that the solid-state imaging device can be formed such that two first type imaging elements of the first embodiment (that is, two photoelectric conversion sections are stacked and the control sections of the two imaging elements are provided in the semiconductor substrate) or that three first type imaging elements of the first embodiment are stacked (that is, three photoelectric conversion sections are stacked and the control sections of the three imaging elements are provided in the semiconductor substrate) instead of providing one first type imaging element of the first embodiment. The following table exemplarily depicts an example of the stacked structure of the first type imaging element and the second imaging element.

| | First type | Second type |
|---|---|---|
| Back irradiation type and Surface irradiation type | 1 green | 2 blue + red |
| | 1 primary color | 1 complementary color |
| | 1 white | 1 infrared rays |
| | 1 blue or green or red | 0 |
| | 2 green + infrared light | 2 blue + red |
| | 2 green + blue | 1 red |
| | 2 white + infrared light | 0 |
| | 3 green + blue + red | 2 turquoise blue (emerald green) + infrared light |
| | 3 green + blue + red | 1 infrared light |
| | 3 blue + green + red | 0 |

As described so far, the imaging element of the first embodiment has a configuration and a structure of having three transistors, that is, the first transistor, the second transistor, and the third transistor; thus, it is possible to achieve simplification of the configuration and the structure of the imaging element. In addition, the first transistor is provided to be adjacent to the photoelectric conversion layer; thus, it is possible to achieve reduction in an area of the imaging element, improvement in a resolution of the imaging element, and further simplification of the configuration and the structure of the imaging element. Moreover, the first transistor is provided to be adjacent to the photoelectric conversion layer; thus, it is possible to achieve shortening and simplification of the interconnections within the imaging element and omission of the interconnections (for example, an interconnection for connecting the second electrode to the one source/drain section of the reset transistor can be omitted). As a result, it is possible to achieve reduction in an interconnection capacity and improvement in charge-to-voltage conversion efficiency of pixels; thus, it is possible to achieve improvement in an S/N ratio of the imaging element, increase in output signals, and improvement in a quality of obtained images.

Second Embodiment

Figure 2A:
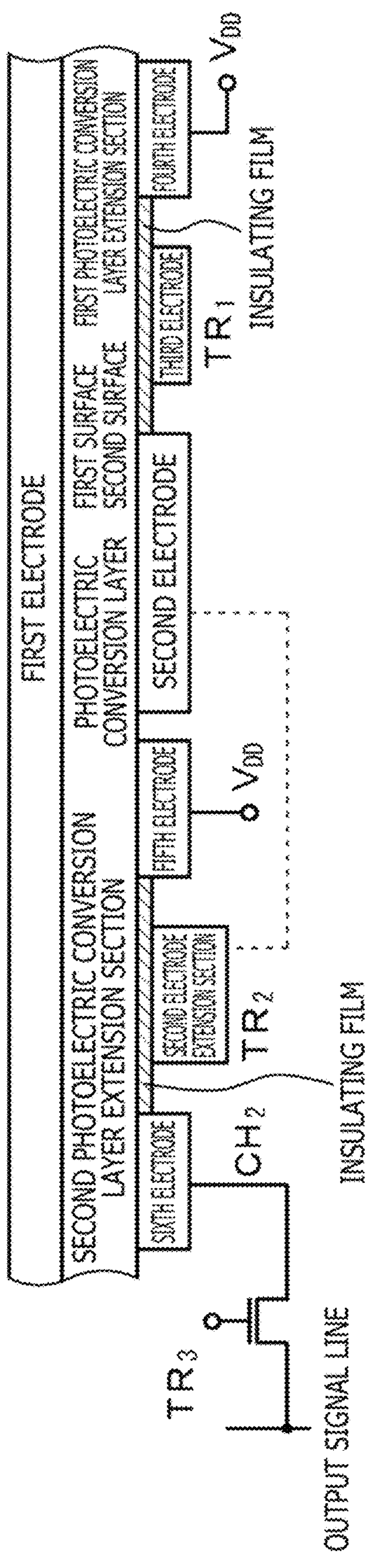
FIGS. 2A and 2B are conceptual diagrams of imaging elements of second and third embodiments, respectively.
Figure 15:
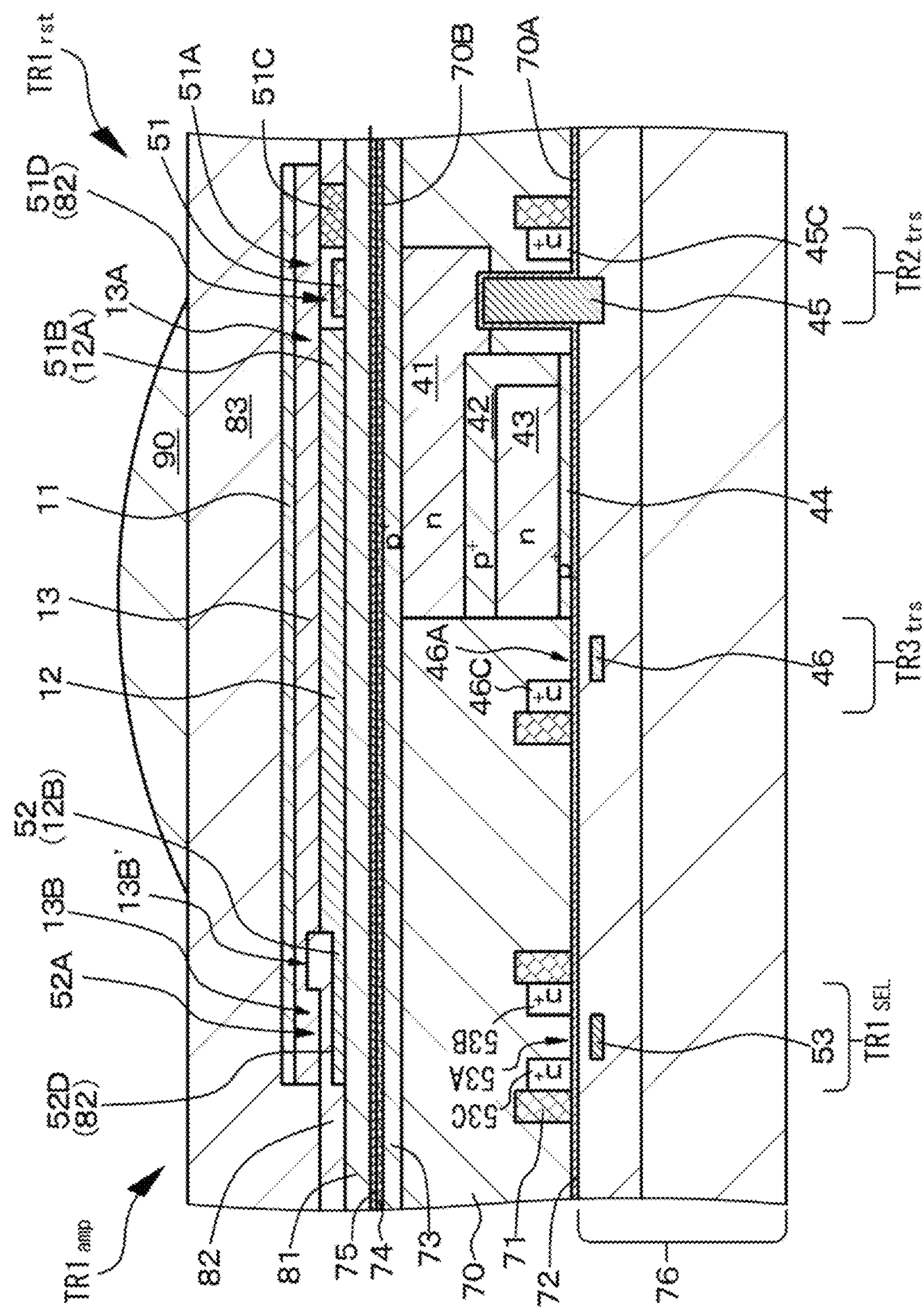
FIG. 15 is a schematic partial cross-sectional view of the imaging element or a stacked imaging element of the second embodiment, taken along an arrow X-X of FIG. 16.
Figure 16:
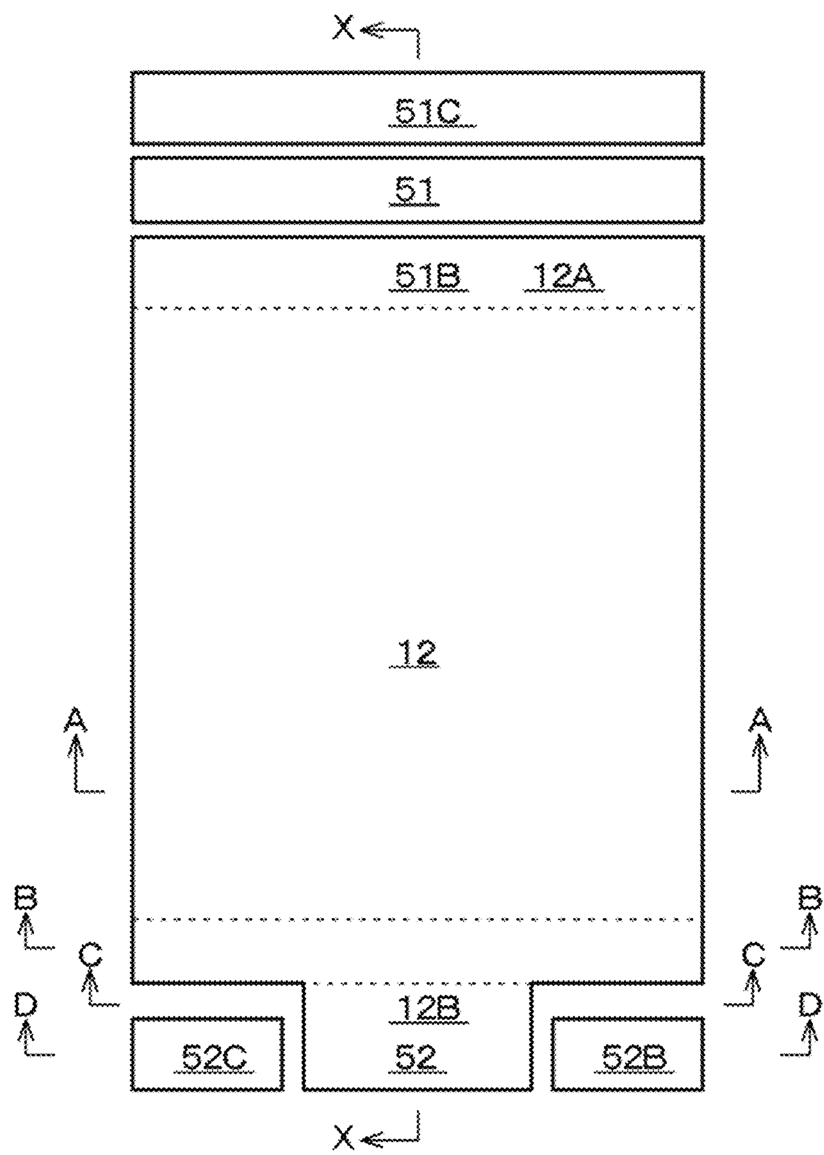
FIG. 16 is a schematic plan view of a second electrode and the like in the imaging element or the stacked imaging element of the second embodiment.
Figure 17A:
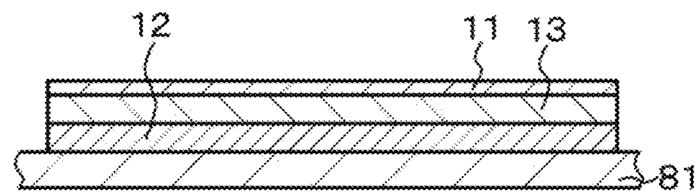
FIGS. 17A, 17B, 17C, and 17D are schematic partial cross-sectional views of the imaging element or the stacked imaging element of the second embodiment, taken along arrows A-A, B-B, C-C, and D-D of FIG. 16.
Figure 17B:
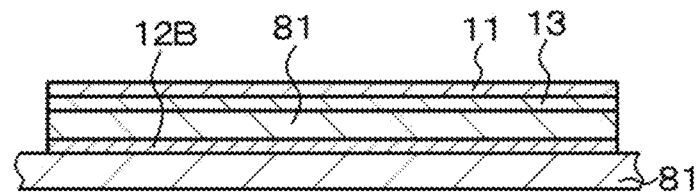
Figure 17C:
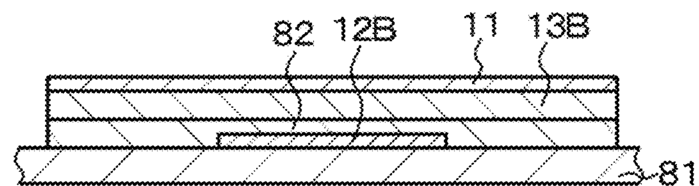
Figure 17D:
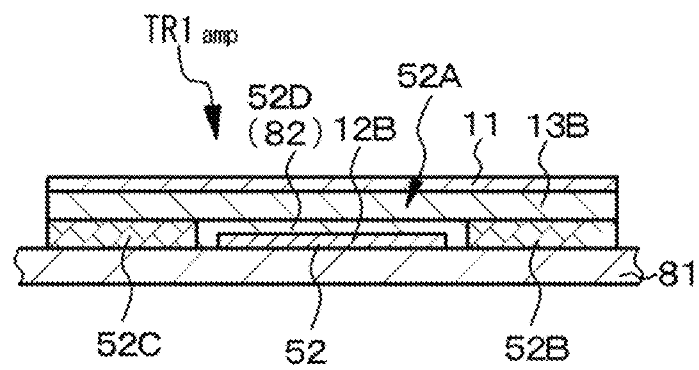
Figure 18:
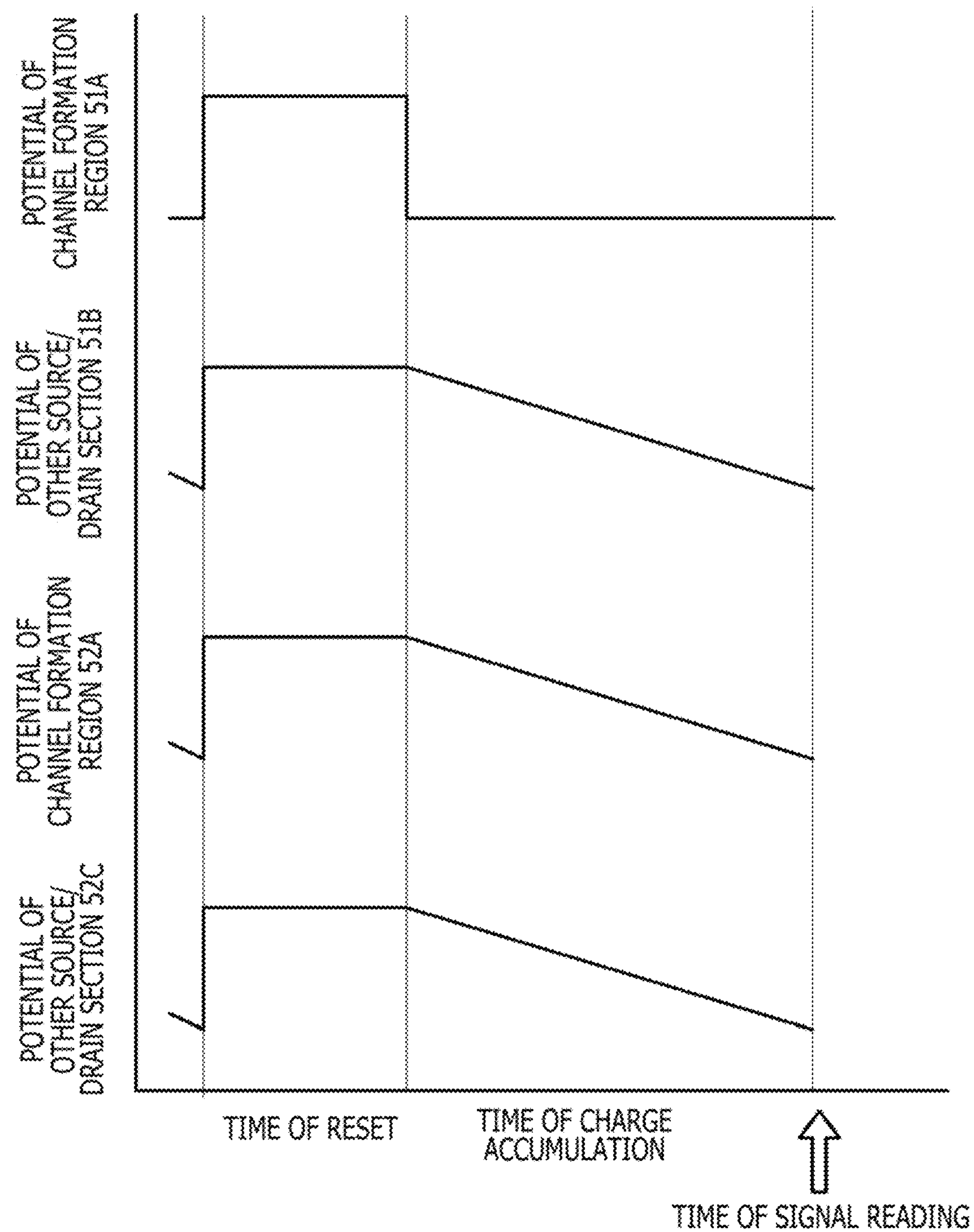
FIG. 18 is a schematic diagram of potential states of sites at time of an operation of the imaging element of the second embodiment.

A second embodiment is a modification of the first embodiment and relates to the imaging element according to the aspect 1-B of the present disclosure. FIG. 2A depicts a conceptual diagram of the imaging element of the second embodiment, FIG. 16 depicts a schematic plan view of the second electrode and the like in the imaging element or the stacked imaging element of the second embodiment, FIG. 15 depicts a schematic partial cross-sectional view of the imaging element or the stacked imaging element of the second embodiment, taken along an arrow X-X of FIG. 16, and FIGS. 17A, 17B, 17C, and 17D depict schematic partial cross-sectional views of the imaging element or the stacked imaging element of the second embodiment, taken along arrows A-A, B-B, C-C, and D-D of FIG. 16. Furthermore, FIG. 18 is a schematic diagram of potential states of sites at time of an operation of the imaging element of the second embodiment.

The imaging element of the second embodiment further has:

a second photoelectric conversion layer extension section 13B that extends from the photoelectric conversion layer 13;

a second electrode extension section 12B that is formed on a second surface of the second photoelectric conversion layer extension section 13B via the insulating film 82, the second surface of the second photoelectric conversion layer extension section 13B being on the same side as the side of the second surface of the photoelectric conversion layer 13; and a fifth electrode and a sixth electrode that are provided to adjoin the second surface of the second photoelectric conversion layer extension section 13B, the second transistor $TR_2$ is formed above the semiconductor layer 70 instead of being formed in the semiconductor layer 70, the gate section 52 of the second transistor $TR_2$ is configured from the second electrode extension section 12B instead of being connected to the second electrode 12, the one source/drain section (source/drain electrode 52B) of the second transistor $TR_2$ is configured from the fifth electrode, and the other source/drain section (source/drain electrode 52C) of the second transistor $TR_2$ is configured from the sixth electrode and connected to the one source/drain section of the third transistor $TR_3$ via a second contact hole section $CH_2$ (refer to FIG. 2A). It is noted that the reference number 52D denotes a gate insulating film, which is configured from the insulating film 82.

In addition, a thickness of a part 13B' of the second photoelectric conversion layer extension section 13B is smaller than a thickness of the photoelectric conversion layer 13. In other words, a thickness of the insulating film in the part 13B' of the second photoelectric conversion layer extension section 13B is larger than that of the gate insulating film 52D. Adopting such a configuration makes it possible to suppress formation of a channel region in a site of the part 13B' of the second photoelectric conversion layer extension section 13B and to prevent penetration of a current passed through the channel formation region 52A of the amplification transistor $TR1_{amp}$ (second transistor $TR_2$) into the photoelectric conversion section.

A configuration and a structure of the imaging element of the second embodiment can be made similar to those of the imaging element described in the first embodiment except for the above respects; thus, detailed description will be omitted.

It is noted that the imaging element of the second embodiment can be configured such that the second photoelectric conversion layer extension section 13B has a stacked structure of a lower semiconductor layer and an upper photoelectric conversion layer from a second surface side, similarly to the first embodiment.

An operation of the imaging element (first imaging element) of the second embodiment will be described hereinafter with reference to FIG. 18 that is a schematic diagram of potential states of sites at time of the operation of the imaging element of the second embodiment. In other words, at a time of reset, the amplification transistor $TR1_{amp}$ and the selection transistor $TR1_{sel}$ are turned off and the first electrode 11 is set into a grounded state. In addition, the reset line $RST_1$ is set into an "H" state and a high potential is applied to the gate section 51, thereby turning off the reset transistor $TR1_{rst}$ (first transistor $TR_1$). The other source/drain section 51C of the first transistor $TR_1$ is connected to the power supply section $V_{DD}$; thus, the potential of the channel formation region 51A in the first transistor $TR_1$, that of the one source/drain section 51B of the first transistor $TR_1$, and yet the potential of the second electrode 12, that of the photoelectric conversion layer 13 adjacent to the second electrode 12, and that of the gate section 52D of the amplification transistor $TR1_{amp}$ (second transistor $TR_2$) are equal to $V_{DD}$, thereby resetting the imaging element. At timing at which a reset operation is completed and charge accumulation is started, the reset line $RST_1$ is set into an "L" state and a low potential is applied to the gate section 51, thereby turning off the reset transistor $TR1_{rst}$ (first transistor $TR_1$). When charges (specifically, electrons) obtained in the photoelectric conversion by the photoelectric conversion layer 13 are accumulated in the second electrode 12, the potential of the second electrode 12 falls and those of the gate section 52D, the channel formation region 52A, and the other source/drain section (source/drain electrode 52C) of the amplification transistor $TR1_{amp}$ (second transistor $TR_2$) fall. In addition, at time of signal reading, the selection line $SEL_1$ is set into an "H" state and a high potential is applied to the gate section 53 of the selection transistor $TR1_{sel}$, thereby turning on the selection transistor $TR1_{sel}$ (third transistor $TR_3$). A current based on the potential of the channel formation region 52A of the amplification transistor $TR1_{amp}$ (second transistor $TR_2$) is then passed from the one source/drain section 52B of the amplification transistor $TR1_{amp}$, (second transistor $TR_2$) through the other source/drain section 52C thereof, further passed from the one source/drain section 53B of the selection transistor $TR1_{amp}$ (third transistor $TR_3$) through the other source/drain section 53C thereof, and output to the signal line (data output line) $VSL_1$ as a signal (image signal).

Third Embodiment

Figure 2B:
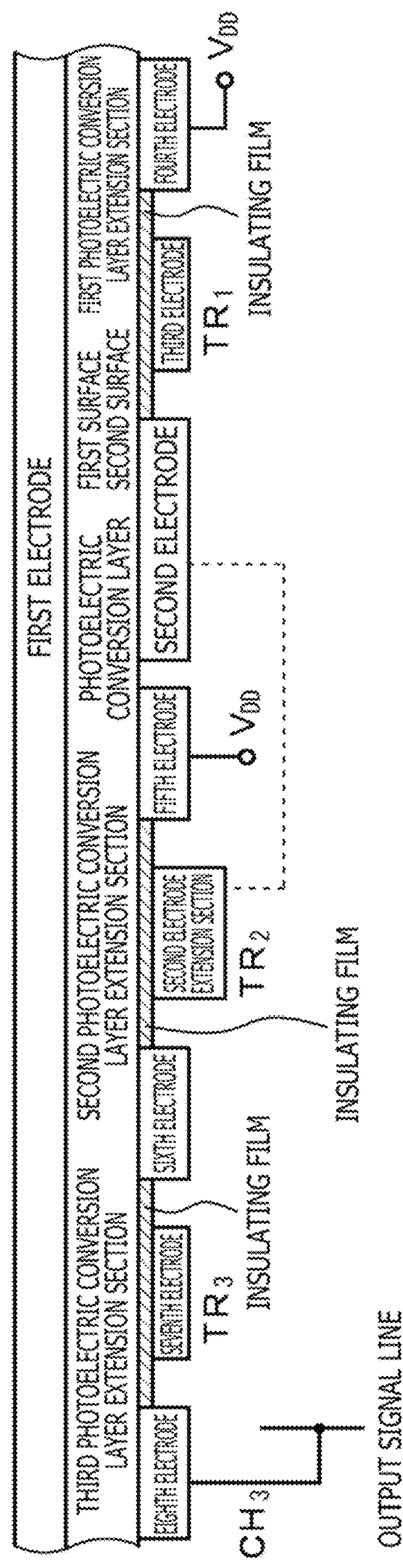
Figure 19:
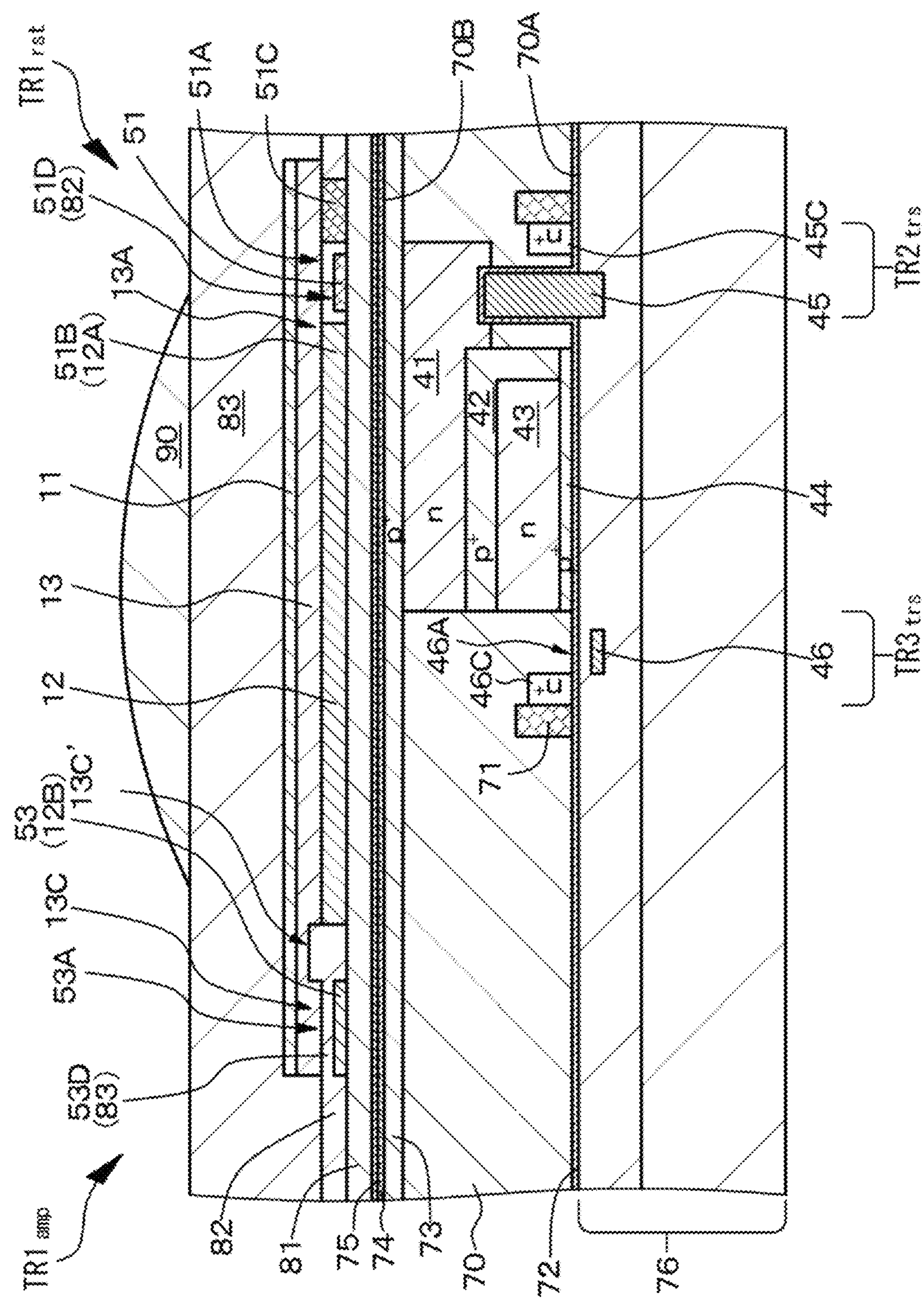
FIG. 19 is a schematic partial cross-sectional view of the imaging element or a stacked imaging element of the third embodiment, taken along an arrow X-X of FIG. 20.
Figure 20:
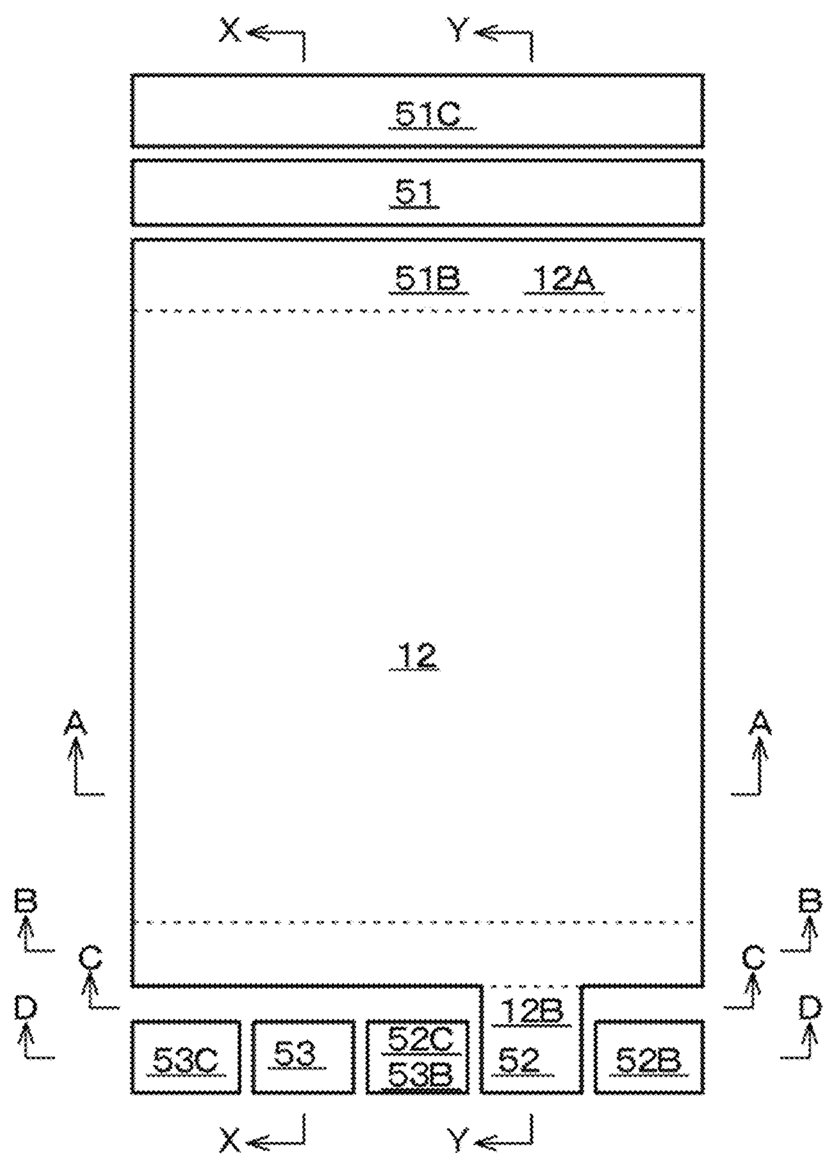
FIG. 20 is a schematic plan view of a second electrode and the like in the imaging element or the stacked imaging element of the third embodiment.
Figure 21A:
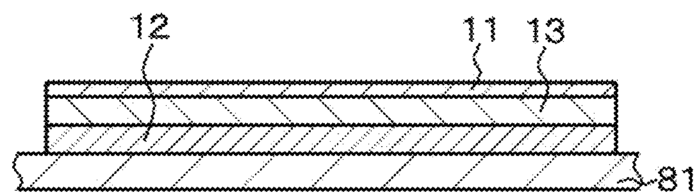
FIGS. 21A, 21B, 21C, and 21D are schematic partial cross-sectional views of the imaging element or the stacked imaging element of the third embodiment, taken along arrows A-A, B-B, C-C, and D-D of FIG. 20.
Figure 21B:
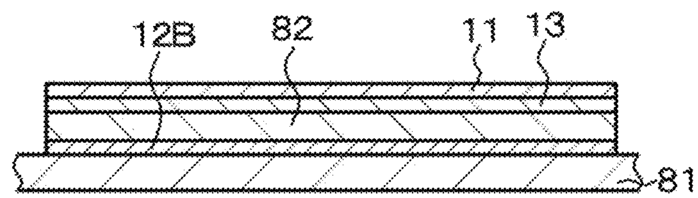
Figure 21C:
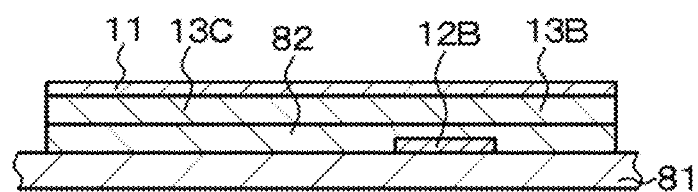
Figure 21D:
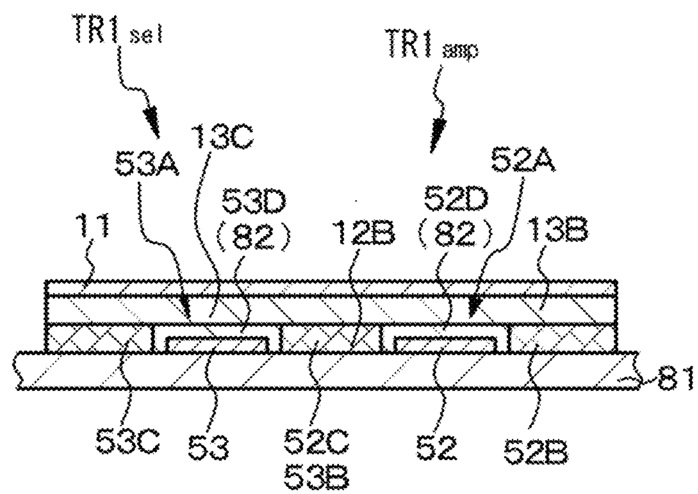
Figure 22:
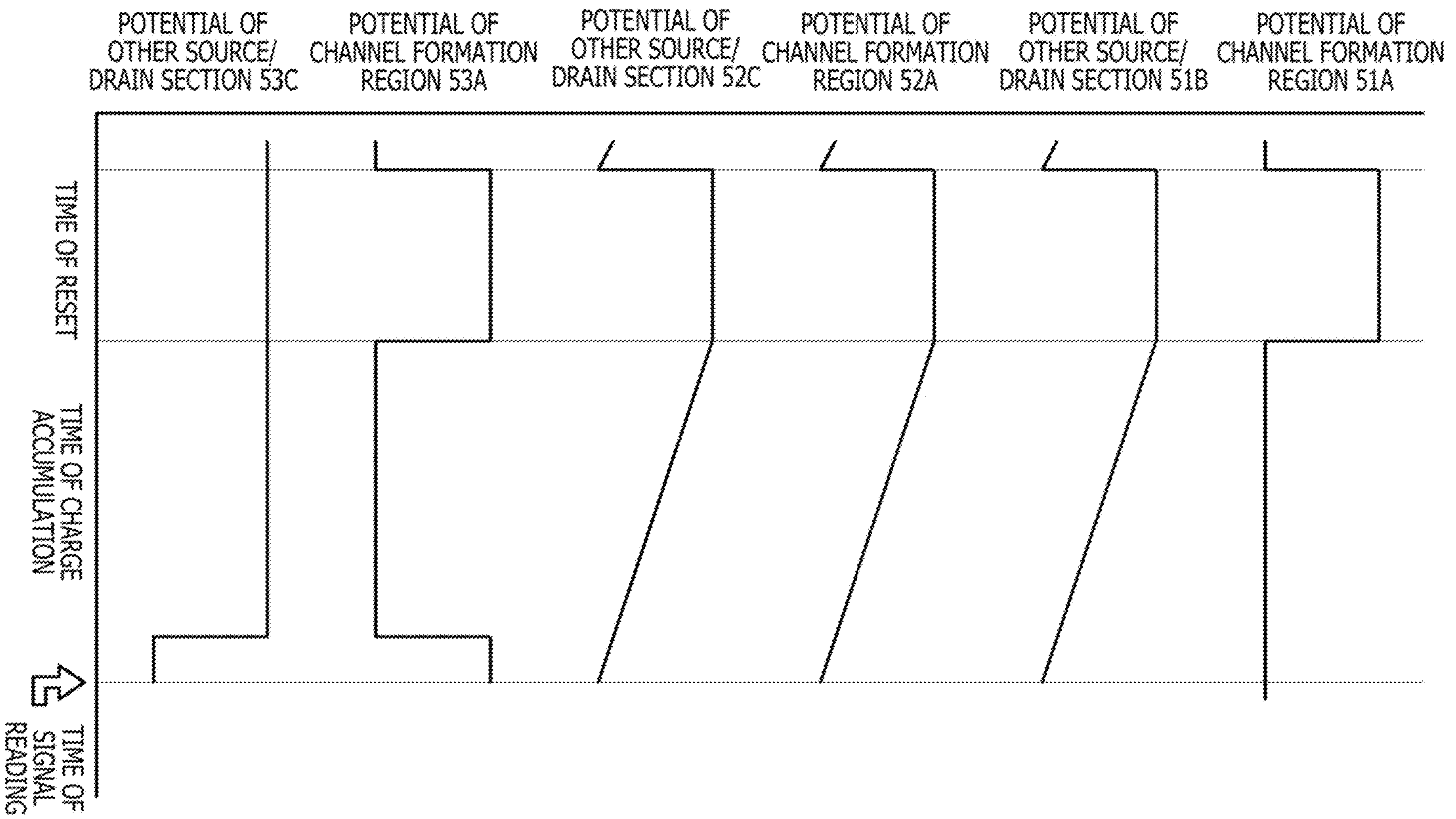
FIG. 22 is a schematic diagram of potential states of sites at time of an operation of the imaging element of the third embodiment.

A third embodiment is a modification of the second embodiment and relates to the imaging element according to the aspect 1-C of the present disclosure. FIG. 2B depicts a conceptual diagram of an imaging element of the third embodiment, FIG. 20 depicts a schematic plan view of the second electrode and the like in the imaging element or a stacked imaging element of the third embodiment, FIG. 19 depicts a schematic partial cross-sectional view of the imaging element or the stacked imaging element of the third embodiment, taken along an arrow X-X of FIG. 20, and FIGS. 21A, 21B, 21C, and 21D depict schematic partial cross-sectional views of the imaging element or the stacked imaging element of the third embodiment, taken along arrows A-A, B-B, C-C, and D-D of FIG. 20. In addition, FIG. 22 is a schematic diagram of potential states of sites at time of an operation of the imaging element of the third embodiment. It is noted that the schematic partial cross-sectional view taken along the arrow Y-Y of FIG. 20 is similar to that depicted in FIG. 15.

The imaging element of the third embodiment further has:

a third photoelectric conversion layer extension section 13C that extends from the photoelectric conversion layer 13;

a seventh electrode that is formed to be opposed to a second surface of the third photoelectric conversion layer extension section 13C via the insulating film 82, the second surface of the third photoelectric conversion layer extension section 13C being on the same side as the side of the second surface of the photoelectric conversion layer 13; and an eighth electrode that is provided to adjoin the second surface of the third photoelectric conversion layer extension section 13C, the third transistor $TR_3$ is formed above the semiconductor layer 70 instead of being formed in the semiconductor layer 70, the one source/drain section (source/drain electrode) 53B of the third transistor $TR_3$ is commonly configured from the sixth electrode (specifically, the other source/drain section (source/drain electrode 52C) of the second transistor $TR_2$) instead of being connected to the sixth electrode via the second contact hole section, the gate section 53 of the third transistor $TR_3$ is configured from the seventh electrode, and the other source/drain section (source/drain electrode) 53C of the third transistor $TR_3$ is configured from the eighth electrode and connected to the signal line (output signal line) $VSL_1$ via a third contact hole section $CH_3$ (refer to FIG. 2B). It is noted that the reference number 53D denotes a gate insulating film, which is configured from the insulating film 82.

In addition, a thickness of a part 13C' of the third photoelectric conversion layer extension section 13C is smaller than the thickness of the photoelectric conversion layer 13. In other words, a thickness of the insulating film in the part 13C' of the second photoelectric conversion layer extension section 13C is larger than that of the gate insulating film 53D. Adopting such a configuration makes it possible to suppress formation of a channel region in a site of the part 13C' of the second photoelectric conversion layer extension section 13C and to prevent penetration of a current passed through the channel formation region 53A of the selection transistor $TR1_{sel}$ (third transistor $TR_3$) into the photoelectric conversion section.

In addition, the imaging element of the third embodiment can be configured such that the third photoelectric conversion layer extension section 13C has a stacked structure of a lower semiconductor layer and an upper photoelectric conversion layer from a second surface side, similarly to the first embodiment.

An operation of the imaging element (first imaging element) of the third embodiment is substantially similar to that of the imaging element (first imaging element) of the second embodiment; thus, description will be omitted. In addition, a configuration and a structure of the imaging element of the third embodiment can be made similar to those of the imaging element described in the first embodiment except for the above respects; thus, detailed description will be omitted. In the imaging element of the third embodiment, it is unnecessary to provide a contact hole section in the photoelectric conversion section; thus, it is possible to achieve improvement in manufacturing yield, achieve expansion of an area of the photoelectric conversion section of the second type imaging element located below in a case of the stacked imaging element, and achieve improvement in sensitivity of a solid-state imaging device.

Fourth Embodiment

Figure 3A:
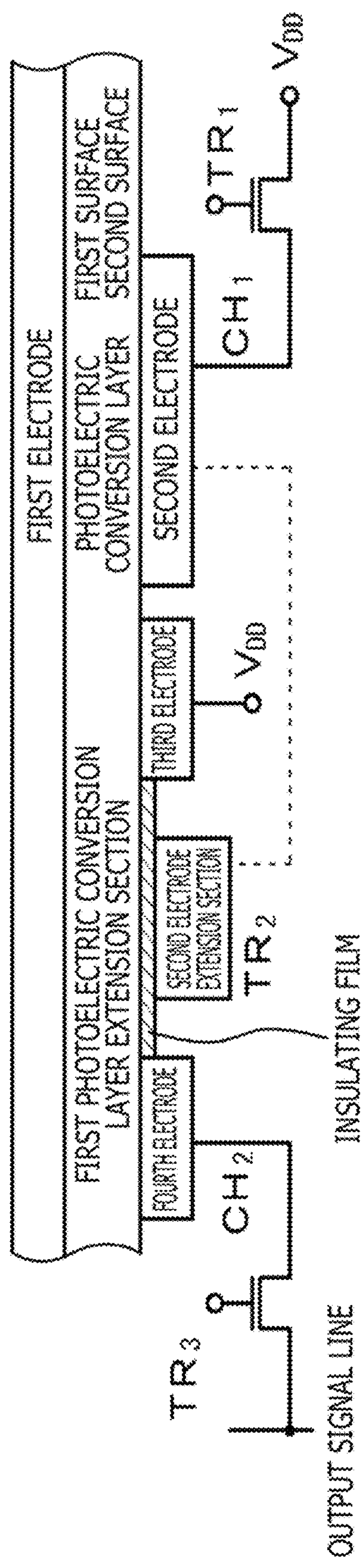
FIGS. 3A and 3B are conceptual diagrams of imaging elements of fourth and fifth embodiments, respectively.
Figure 23:
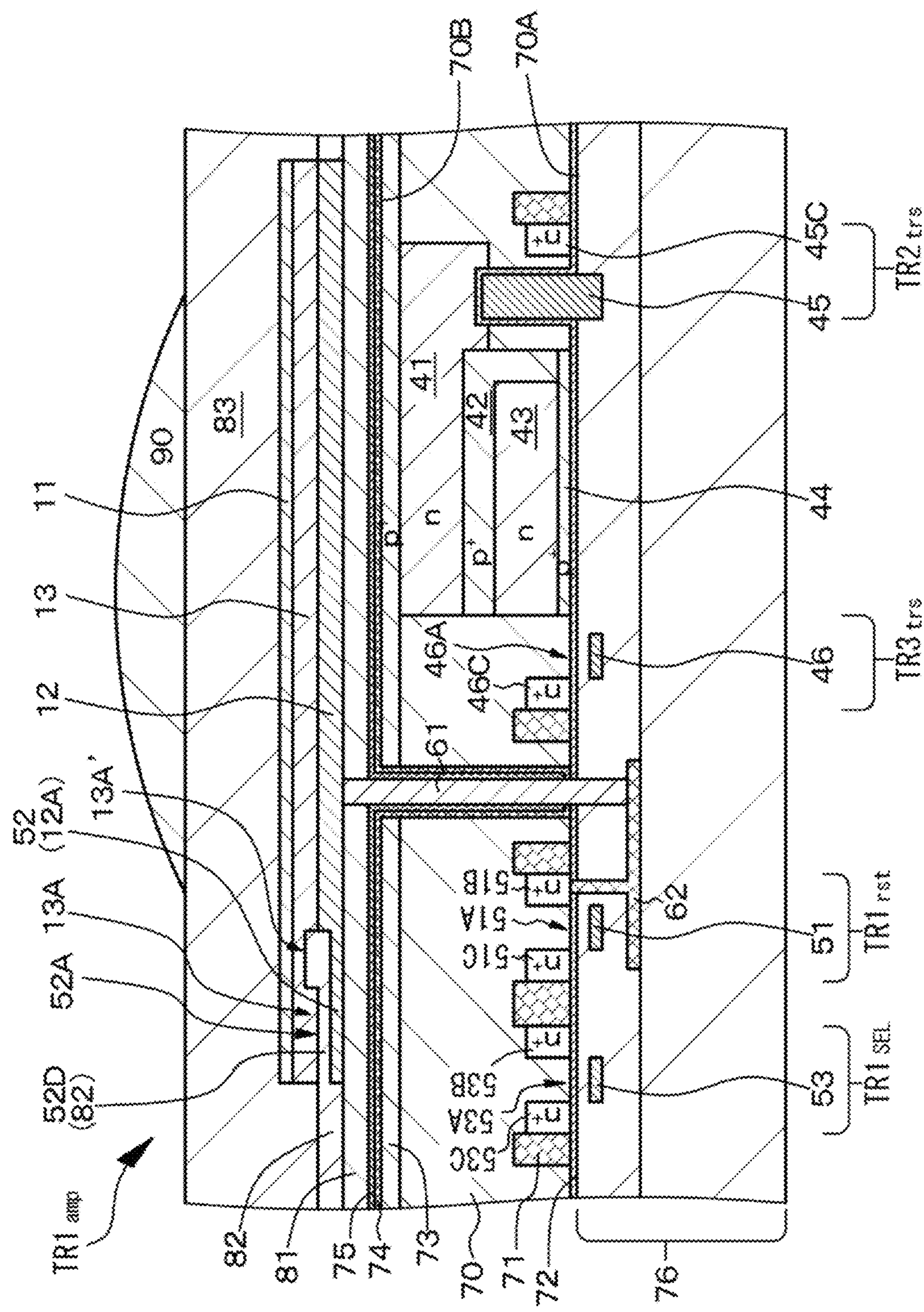
FIG. 23 is a schematic partial cross-sectional view of the imaging element or a stacked imaging element of the fourth embodiment, taken along an arrow X-X of FIG. 24.
Figure 24:
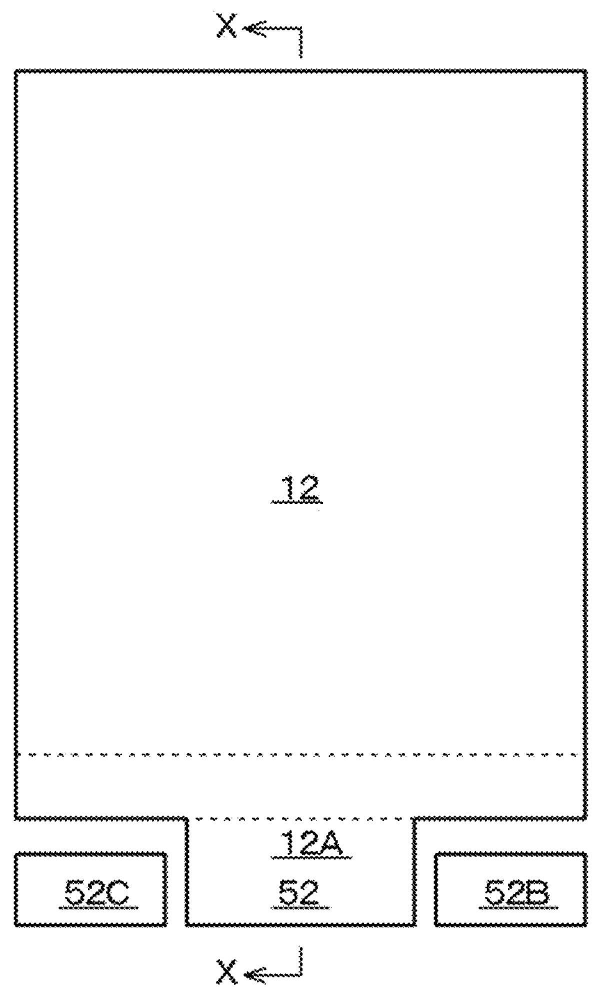
FIG. 24 is a schematic plan view of a second electrode and the like in the imaging element or the stacked imaging element of the fourth embodiment.

A fourth embodiment relates to the imaging element according to the second aspect of the present disclosure. FIG. 3A depicts a conceptual diagram of an imaging element of the fourth embodiment, FIG. 24 depicts a schematic plan view of the second electrode and the like in the imaging element or a stacked imaging element of the fourth embodiment, and FIG. 23 depicts a schematic partial cross-sectional view of the imaging element or the stacked imaging element of the fourth embodiment, taken along an arrow X-X of FIG. 24.

The imaging element of the fourth embodiment is an imaging element having at least a photoelectric conversion section; a second transistor $TR_2$; and a third transistor $TR_3$, the photoelectric conversion section includes:

a photoelectric conversion layer 13 that has a first surface and a second surface opposed to the first surface and on which light is incident from a first surface side;

a first electrode 11 that is provided to adjoin the first surface of the photoelectric conversion layer 13; and a second electrode 12 that is provided to adjoin the second surface of the photoelectric conversion layer 13, the imaging element further has:

a first photoelectric conversion layer extension section 13A that extends from the photoelectric conversion layer 13;

a second electrode extension section 12A that is formed on a second surface of the first photoelectric conversion layer extension section 13A via an insulating film 82, the second surface of the first photoelectric conversion layer extension section 13A being on a same side as a side of the second surface of the photoelectric conversion layer 13; and a third electrode and a fourth electrode that are provided to adjoin the second surface of the first photoelectric conversion layer extension section 13A, the second transistor $TR_2$ includes: the third electrode that functions as one source/drain section (source/drain electrode) 52B and that is connected to a power supply section $V_{DD}$; the second electrode extension section 12A that functions as a gate section 52; the fourth electrode that functions as the other source/drain section (source/drain electrode) 52C; and the first photoelectric conversion layer extension section 13A that functions as a channel formation region 52A, one source/drain section 53B of the third transistor $TR_3$ is connected to the other source/drain section (fourth electrode) 53C, and the other source/drain section 53C of the third transistor $TR_3$ is connected to a signal line (output signal line) $VSL_1$.

Furthermore, the imaging element of the second embodiment further has a first transistor $TR_1$, one source/drain section 51B of the first transistor $TR_1$ is connected to the second electrode 12, and the other source/drain section 51C of the first transistor $TR_1$ is connected to the power supply section $V_{DD}$.

In addition, the imaging element of the fourth embodiment further has a semiconductor layer 70, the first transistor $TR_1$ and the third transistor $TR_3$ are formed in the semiconductor layer 70, the photoelectric conversion section and the second transistor $TR_2$ are formed above the semiconductor layer 70, the one source/drain section 51B of the first transistor $TR_1$ is connected to the second electrode 12 via a first contact hole section 61, and the one source/drain section 53B of the third transistor $TR_3$ is connected to the source/drain section (fourth electrode) 53C of the second transistor $TR_2$ via a second contact hole section $CH_2$ (refer to FIG. 3A).

In addition, the stacked imaging element of the fourth embodiment has at least one imaging element of the fourth embodiment, and in the fourth embodiment, the stacked imaging element has one imaging element of the first embodiment.

Moreover, a solid-state imaging device of the fourth embodiment has a plurality of stacked imaging elements of the fourth embodiment.

In addition, a thickness of a part 13A' of the first photoelectric conversion layer extension section 13A is smaller than a thickness of the photoelectric conversion layer 13. In other words, a thickness of the insulating film in the part 13A' of the first photoelectric conversion layer extension section 13A is larger than that of the gate insulating film 52D. Adopting such a configuration makes it possible to suppress formation of a channel region in a site of the part 13A' of the first photoelectric conversion layer extension section 13A and to prevent penetration of a current passed through the channel formation region 52A of the amplification transistor $TR1_{amp}$ (second transistor $TR_2$) into the photoelectric conversion section.

In addition, the imaging element of the fourth embodiment can be configured such that the photoelectric conversion layer 13 and the first photoelectric conversion layer extension section 13A have a stacked structure of a lower semiconductor layer and an upper photoelectric conversion layer from a second surface side, similarly to the first embodiment.

An operation of the imaging element (first imaging element) of the fourth embodiment is substantially similar to that of the imaging element (first imaging element) of the first embodiment; thus, description will be omitted. In addition, a configuration and a structure of the imaging element of the fourth embodiment can be made similar to those of the imaging element described in the first embodiment except for the above respects; thus, detailed description will be omitted.

Fifth Embodiment

Figure 3B:
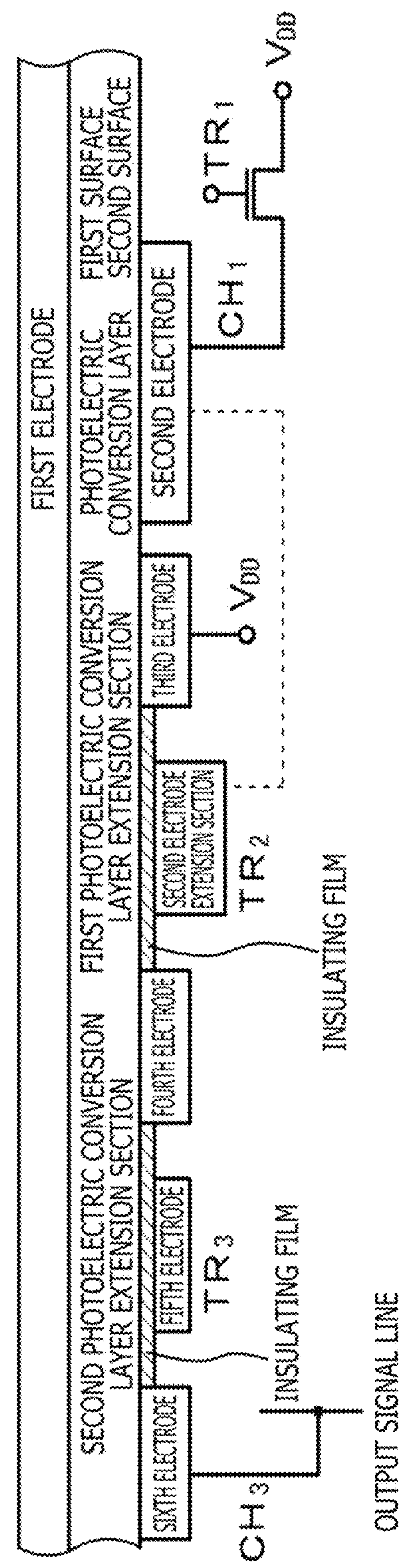
Figure 25:
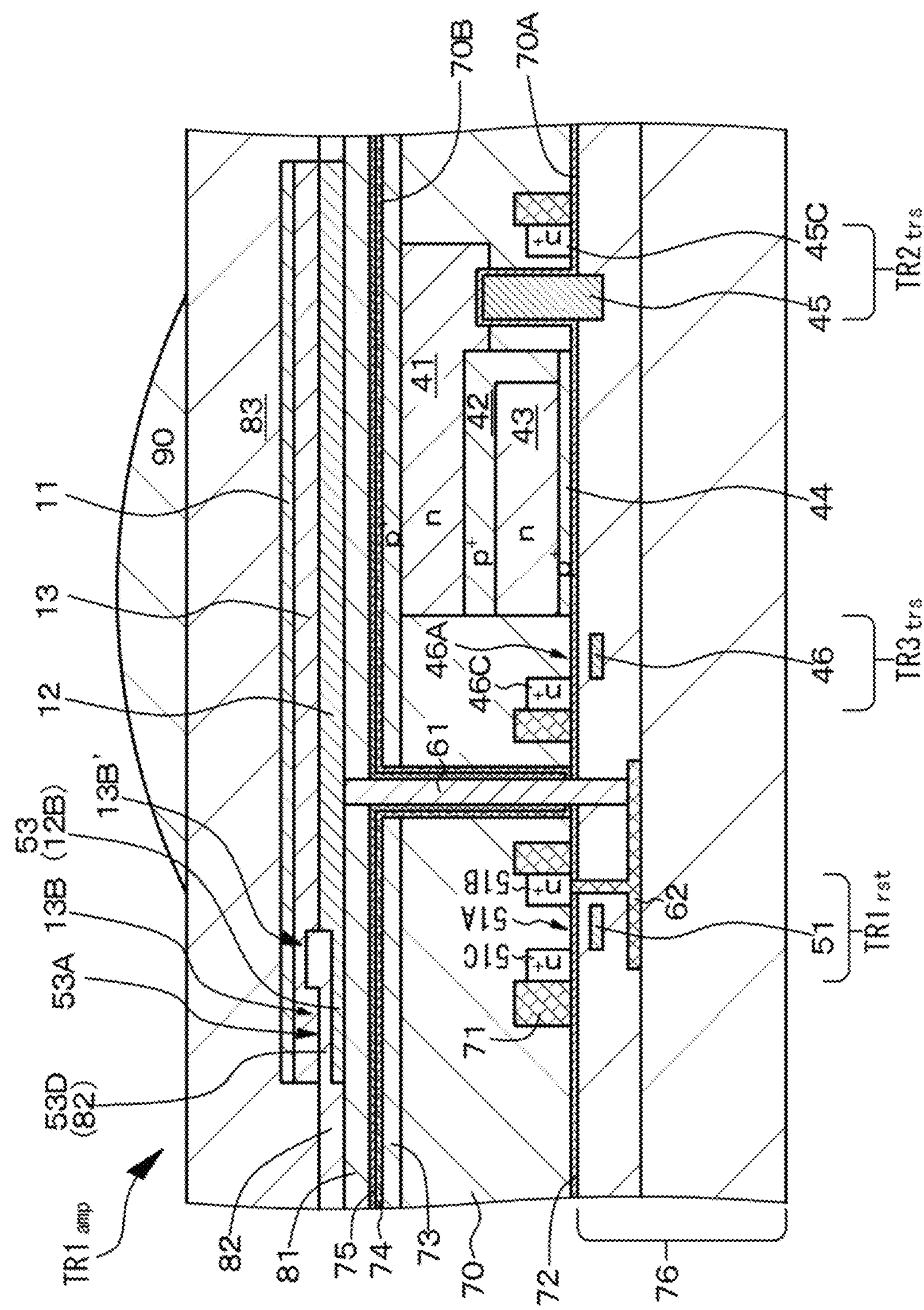
FIG. 25 is a schematic partial cross-sectional view of the imaging element or a stacked imaging element of the fifth embodiment, taken along an arrow X-X of FIG. 26.
Figure 26:
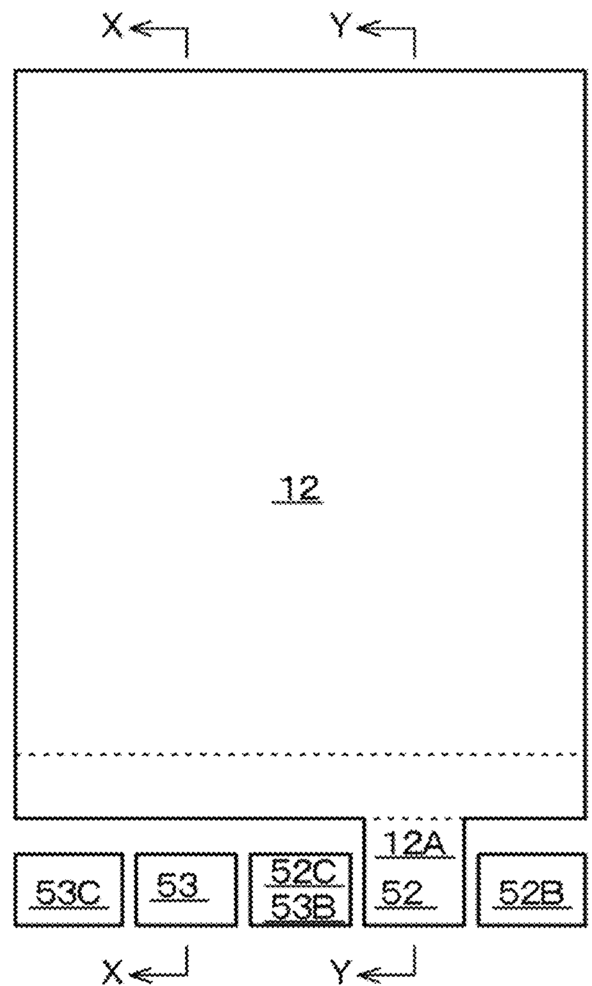
FIG. 26 is a schematic plan view of a second electrode and the like in the imaging element or the stacked imaging element of the fifth embodiment.

A fifth embodiment is a modification of the fourth embodiment and relates to the imaging element according to the aspect 2-B of the present disclosure. FIG. 3B depicts a conceptual diagram of an imaging element of the fifth embodiment, FIG. 26 depicts a schematic plan view of the second electrode and the like in the imaging element or a stacked imaging element of the fifth embodiment, and FIG. 25 depicts a schematic partial cross-sectional view of the imaging element or the stacked imaging element of the fifth embodiment, taken along an arrow X-X of FIG. 26. It is noted that the schematic partial cross-sectional view taken along the arrow Y-Y of FIG. 26 is similar to that depicted in FIG. 23.

The imaging element of the fifth embodiment further has:

a second photoelectric conversion layer extension section 13B that extends from the photoelectric conversion layer 13;

a fifth electrode that is formed to be opposed to a second surface of the second photoelectric conversion layer extension section 13B via the insulating film 82, the second surface of the second photoelectric conversion layer extension section 13B being on a same side as a side of the second surface of the photoelectric conversion layer 13; and a sixth electrode that is provided to adjoin the second surface of the second photoelectric conversion layer extension section 13B, the third transistor $TR_3$ is formed above the semiconductor layer 70 instead of being formed in the semiconductor layer 70, the one source/drain section (source/drain electrode) 53B of the third transistor $TR_3$ is commonly configured from the other source/drain section (source/drain electrode, fourth electrode) 52C of the second transistor $TR_2$ instead of being connected to the fourth electrode via the second contact hole section, a gate section 53 of the third transistor $TR_3$ is configured from the fifth electrode, and the other source/drain section (source/drain electrode) 53C of the third transistor $TR_3$ is configured from the sixth electrode and connected to the signal line (output signal line) $VSL_1$ via a third contact hole section $CH_3$ (refer to FIG. 3B).

In addition, a thickness of a part 13B of the second photoelectric conversion layer extension section 13B is smaller than a thickness of the photoelectric conversion layer 13. In other words, a thickness of the insulating film in the part 13B' of the second photoelectric conversion layer extension section 13B is larger than that of the gate insulating film 53D. Adopting such a configuration makes it possible to suppress formation of a channel region in a site of the part 13B' of the second photoelectric conversion layer extension section 13B and to prevent penetration of a current passed through the channel formation region 53A of the selection transistor $TR\mathbf{1}_{sel}$ (third transistor $TR_3$) into the photoelectric conversion section.

In addition, the imaging element of the fifth embodiment can be configured such that the photoelectric conversion layer 13, the first photoelectric conversion layer extension section 13A, and the second photoelectric conversion layer extension section 13B have a stacked structure of a lower semiconductor layer and an upper photoelectric conversion layer from a second surface side, similarly to the first embodiment.

An operation of the imaging element (first imaging element) of the fifth embodiment is substantially similar to that of the imaging element (first imaging element) of the first embodiment; thus, description will be omitted. In addition, a configuration and a structure of the imaging element of the fifth embodiment can be made similar to those of the imaging element described in the first embodiment except for the above respects; thus, detailed description will be omitted.

Sixth Embodiment

Figure 4:
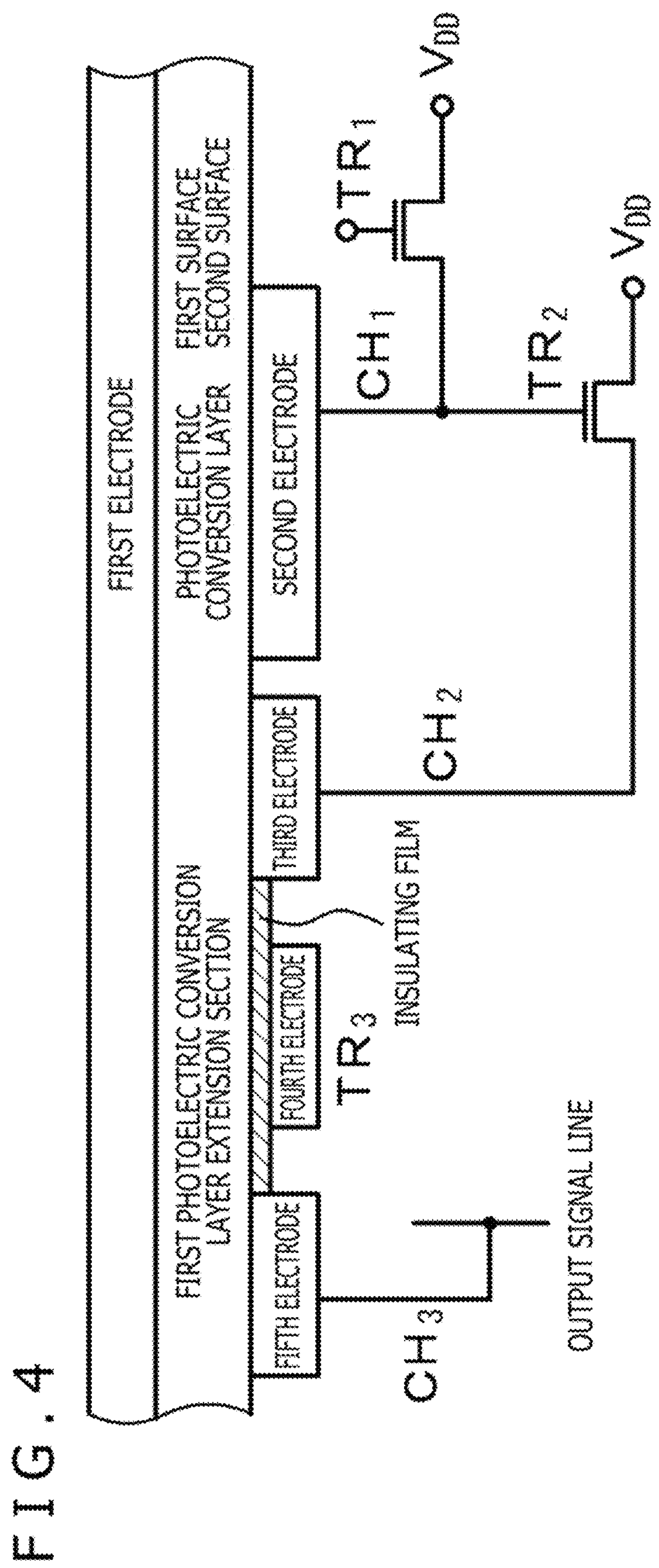
FIG. 4 is a conceptual diagram of an imaging element of a sixth embodiment.
Figure 27:
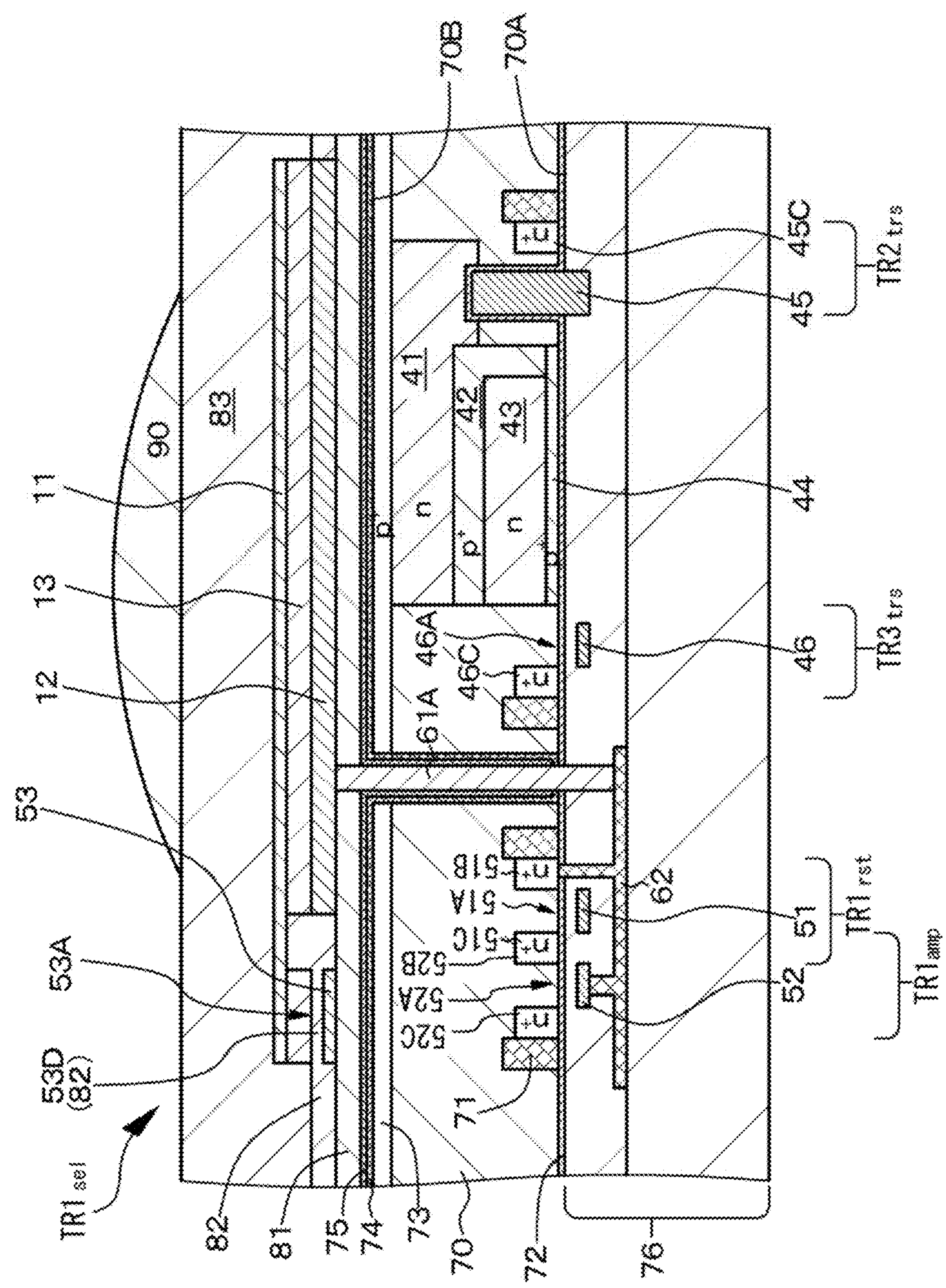
FIG. 27 is a schematic partial cross-sectional view of the imaging element or a stacked imaging element of the sixth embodiment, taken along an arrow X-X of FIG. 28.
Figure 28:
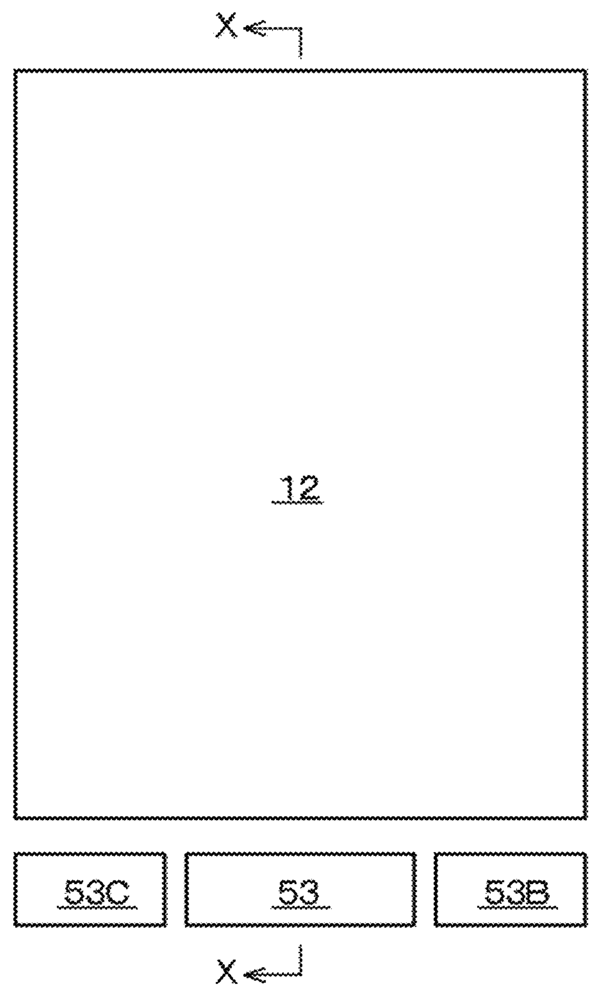
FIG. 28 is a schematic plan view of a second electrode and the like in the imaging element or the stacked imaging element of the sixth embodiment.

A sixth embodiment relates to the imaging element according to the third aspect of the present disclosure. FIG. 4 depicts a conceptual diagram of an imaging element of the sixth embodiment, FIG. 28 depicts a schematic plan view of the second electrode and the like in the imaging element or a stacked imaging element of the sixth embodiment, and FIG. 27 depicts a schematic partial cross-sectional view of the imaging element or the stacked imaging element of the sixth embodiment, taken along an arrow X-X of FIG. 28.

The imaging element of the sixth embodiment is an imaging element having at least a photoelectric conversion section; a second transistor $TR_2$; and a third transistor $TR_3$, the photoelectric conversion section includes:

a photoelectric conversion layer 13 that has a first surface and a second surface opposed to the first surface and on which light is incident from a first surface side;

a first electrode 11 that is provided to adjoin the first surface of the photoelectric conversion layer 13; and a second electrode 12 that is provided to adjoin the second surface of the photoelectric conversion layer 13, the imaging element further has:

a channel formation region 53A that is configured from a same material as a material of the photoelectric conversion layer 13 and that is provided to be apart from the photoelectric conversion layer 13;

a fourth electrode that is formed on a surface of the channel formation region via an insulating film 82, the surface of the channel formation region being on a same side as a side of the second surface of the photoelectric conversion layer 13; and a third electrode and a fifth electrode that are provided to adjoin a surface of a channel formation region extension section that is on the same side as the side of the second surface of the photoelectric conversion layer, a gate section 52 of the second transistor $TR_2$ is connected to the second electrode 12, and one source/drain section 52B of the second transistor $TR_2$ is connected to a power supply section $V_{DD}$, the other source/drain section 52C of the second transistor TR2 is connected to the third electrode that configures one source/drain section (source/drain electrode) 53B of the third transistor $TR_3$, a gate section 53 of the third transistor $TR_3$ is configured from the fourth electrode, and the fifth electrode that configures the other source/drain section (source/drain electrode) 53C of the third transistor $TR_3$ is connected to a signal line (output signal line) $VSL_1$.

Furthermore, the imaging element of the sixth embodiment further has a first transistor $TR_1$, one source/drain section 51B of the first transistor $TR_1$ is connected to the second electrode 12, and the other source/drain section 51C of the first transistor $TR_1$ is connected to the power supply section $V_{DD}$.

In addition, the imaging element of the sixth embodiment further has a semiconductor layer 70, the first transistor $TR_1$ and the second transistor $TR_2$ are formed in the semiconductor layer 70, the photoelectric conversion section and the third transistor $TR_3$ are formed above the semiconductor layer 70, the one source/drain section 51B of the first transistor $TR_1$ and the gate section 52 of the second transistor $TR_2$ are connected to the second electrode 12 via a first contact hole section $CH_1$ (refer to FIG. 4), the other source/drain section 52C of the second transistor $TR_2$ is connected to the one source/drain section (source/drain electrode, third electrode) 53B of the third transistor $TR_3$ via a second contact hole section $CH_2$ (refer to FIG. 4), and the other source/drain section (source/drain electrode) 53C of the third transistor $TR_3$ is connected to the signal line (output signal line) $VSL_1$ via a third contact hole section $CH_3$ (refer to FIG. 4).

In addition, the stacked imaging element of the sixth embodiment has at least one imaging element of the sixth embodiment, and in the sixth embodiment, the stacked imaging element has one imaging element of the first embodiment.

Moreover, a solid-state imaging device of the sixth embodiment has a plurality of stacked imaging elements of the sixth embodiment.

In addition, the imaging element of the sixth embodiment can be configured such that the photoelectric conversion layer 13, the channel formation region 53A, and the channel formation region extension section have a stacked structure of a lower semiconductor layer and an upper photoelectric conversion layer from a second surface side, similarly to the first embodiment.

An operation of the imaging element (first imaging element) of the sixth embodiment is substantially similar to that of the imaging element (first imaging element) of the first embodiment; thus, description will be omitted.

In addition, a configuration and a structure of the imaging element of the sixth embodiment can be made similar to those of the imaging element described in the first embodiment except for the above respects; thus, detailed description will be omitted.

Seventh Embodiment

A seventh embodiment is a modification of the first to sixth embodiments and relates to an imaging element having a charge accumulation electrode.

Figure 29:
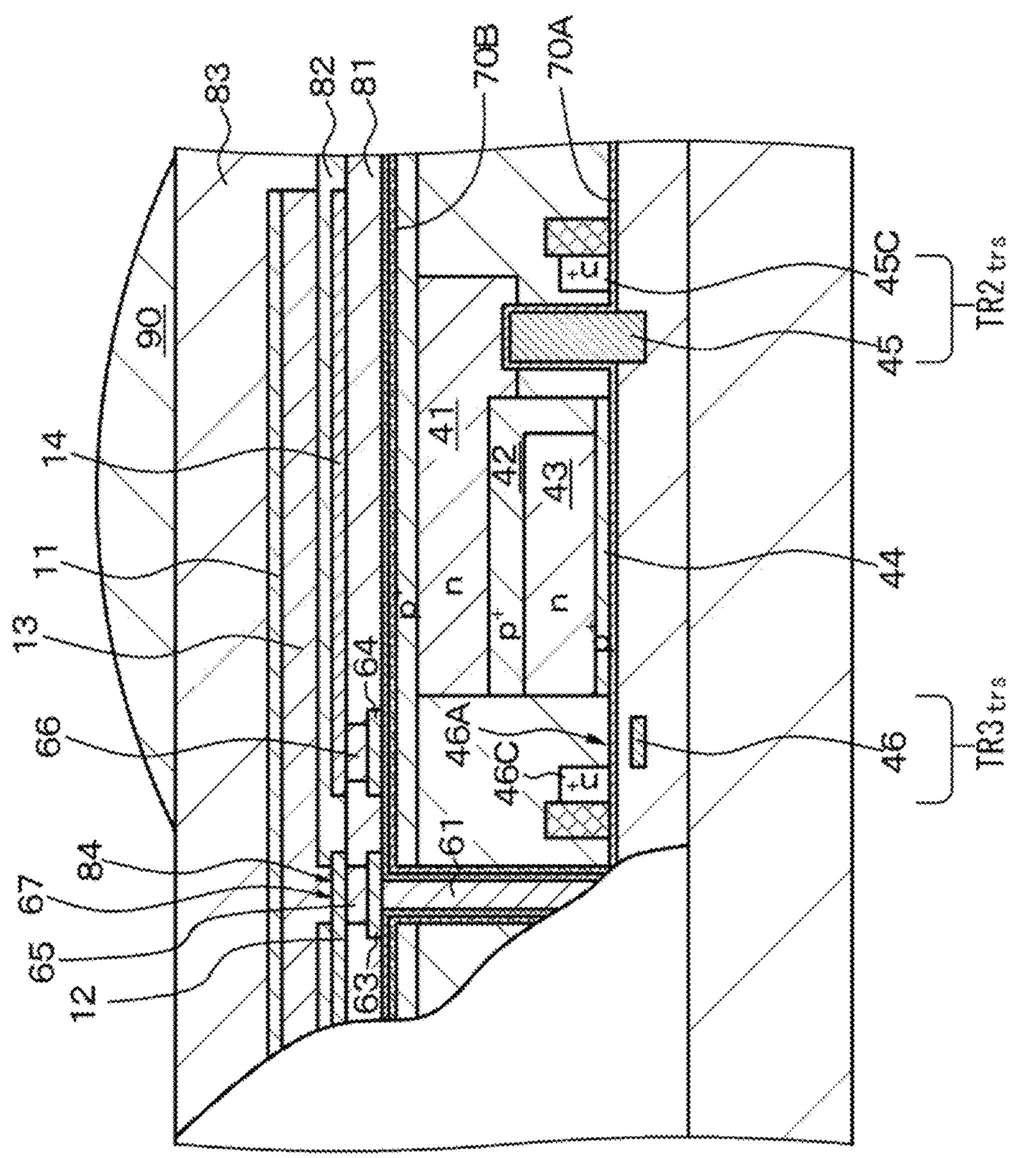
FIG. 29 is a schematic partial cross-sectional view of an imaging element or a stacked imaging element of a seventh embodiment.
Figure 30:
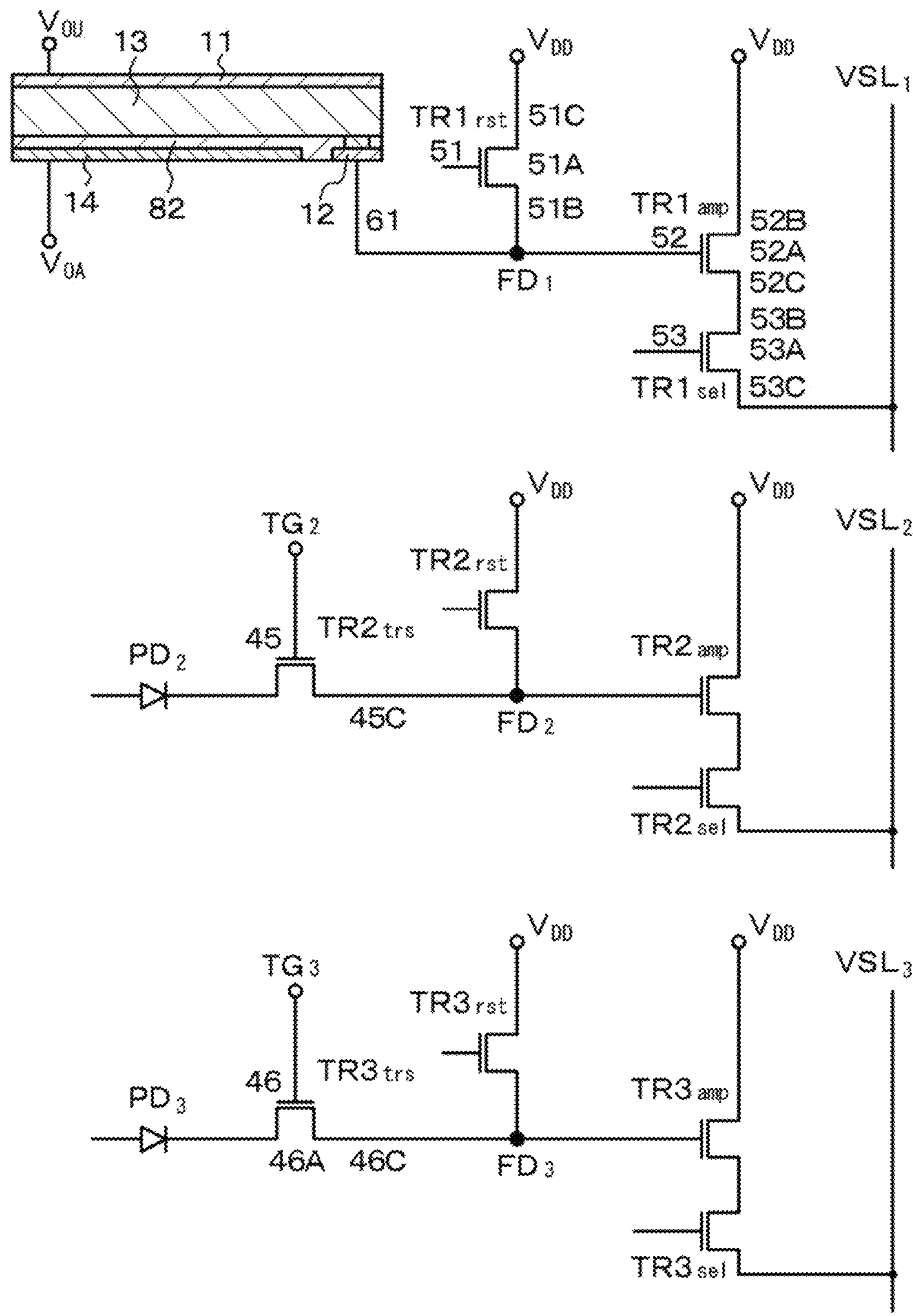
FIG. 30 is an equivalent circuit diagram of the imaging element or the stacked imaging element of the seventh embodiment.
Figure 31:
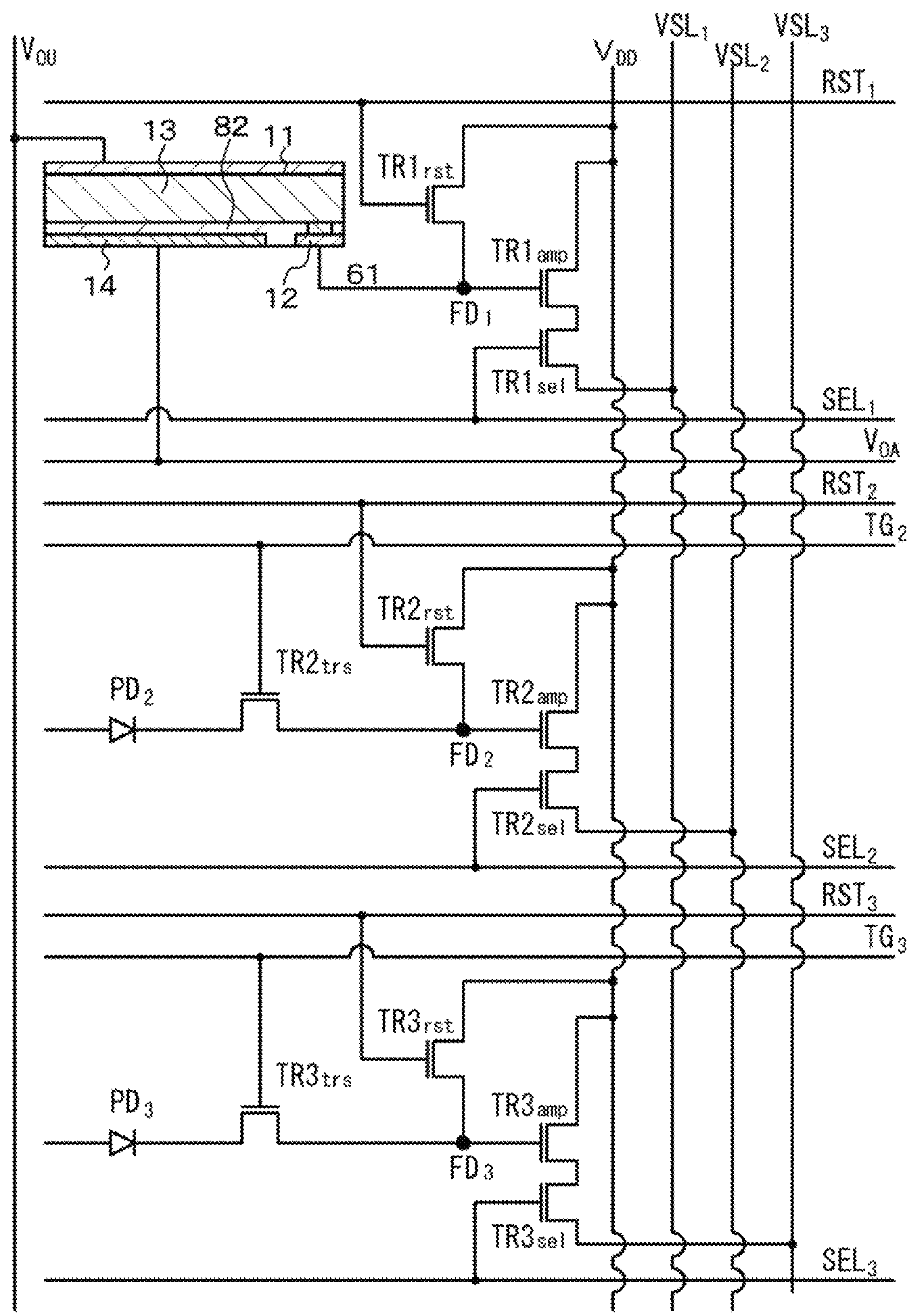
FIG. 31 is an equivalent circuit diagram of the imaging element or the stacked imaging element of the seventh embodiment.
Figure 32A:
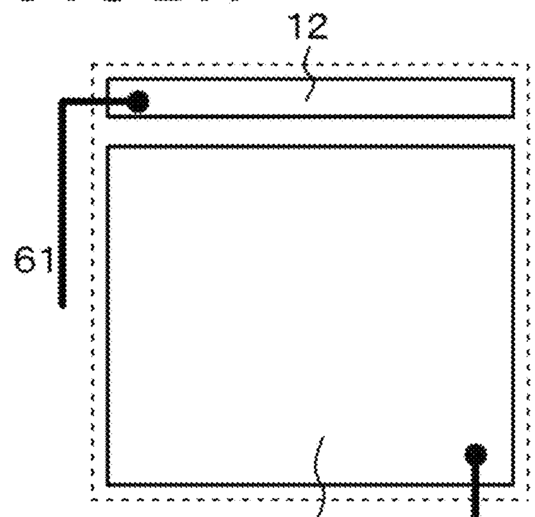
FIGS. 32A, 32B, and 32C are schematic layout plans of a second electrode, a charge accumulation electrode, and the like configuring imaging elements of seventh, tenth, and twelfth embodiments, respectively.

FIG. 29 depicts a schematic partial cross-sectional view of an imaging element or a stacked imaging element of the seventh embodiment, FIGS. 30 and 31 depict equivalent circuit diagrams of the imaging element or the stacked imaging element of the seventh embodiment, FIG. 32A is a schematic layout plan of the second electrode, a charge accumulation electrode, and the like configuring the imaging element of the seventh embodiment, and FIG. 33 schematically depicts potential states of sites at time of an operation of the imaging element of the seventh embodiment. It is noted that the first transistor $TR_1$, the second transistor $TR_2$, and the third transistor $TR_j$ are not depicted in the drawings described hereinafter. In addition, the imaging element of the seventh embodiment will be described basically on the basis of the configuration and the structure of the imaging element of the first embodiment; however, a configuration and a structure of the imaging element of the seventh embodiment are not limited to those of the first embodiment.

The imaging element of the seventh embodiment has a photoelectric conversion section formed by stacking the second electrode 12, the photoelectric conversion layer 13, and the first electrode 11, and the photoelectric conversion section further has a charge accumulation electrode 14 that is disposed to be apart from the second electrode and that is disposed to be opposed to the photoelectric conversion layer 13 via the insulating film 82.

The charge accumulation electrode 14 is connected to the drive circuit. Specifically, the charge accumulation electrode 14 is connected to the vertical drive circuit 112 (refer to FIG. 11) configuring the drive circuit via a connection hole 66, a pad section 64, and an interconnection $V_{OA}$ (refer to FIGS. 30 and 32A) provided in the interlayer insulating layer 81. In addition, the second electrode 12 is connected to the contact hole section 61 formed in the semiconductor substrate 70 and the interlayer insulating layer 76 via a connection hole 65 and a pad section 63 formed in the interlayer insulating layer 76. The photoelectric conversion layer 13 and the second electrode 12 are connected to each other by a connection section 67 provided in the insulating film 82. The photoelectric conversion layer 13 extends within the connection section 67. In other words, the photoelectric conversion layer 13 extends within an opening portion 84 provided in the insulating film 82 and is connected to the second electrode 12.

A magnitude of the charge accumulation electrode 14 is larger than that of the second electrode 12. When it is assumed that an area of the charge accumulation electrode 14 is $S_1'$ and an area of the second electrode 12 is $S_1$, the areas of the charge accumulation electrode 14 and the second electrode 12 preferably satisfy the following relationship although not being limited thereto:

$$4 \leq S_1'/S_1.$$

In the seventh embodiment, the areas of the charge accumulation electrode 14 and the second electrode 12 satisfy, for example, the following relationship although not being limited thereto:

$$S_1'/S_1 = 8.$$

As described so far, the imaging element of the seventh embodiment is substantially similar in configuration and structure to the imaging elements of the first to sixth embodiments except that the imaging element has the charge accumulation electrode 14.

An operation of the imaging element (first imaging element) of the seventh embodiment will be described hereinafter with reference to FIG. 33. Here, the potential of the second electrode 12 is set higher than that of the first electrode. In other words, it is assumed, for example, that the second electrode 12 has a positive potential and the first electrode has a negative potential, the photoelectric conversion layer 13 performs photoelectric conversion, and electrons are read as a signal. It is assumed that the same thing is true for the other embodiments. It is noted that, in a form in which the second electrode 12 has a negative potential, the first electrode has a positive potential, and holes generated on the basis of the photoelectric conversion by the photoelectric conversion layer 13 are read as a signal, high and low of potentials described below is only required to be inverted.

Figure 43:
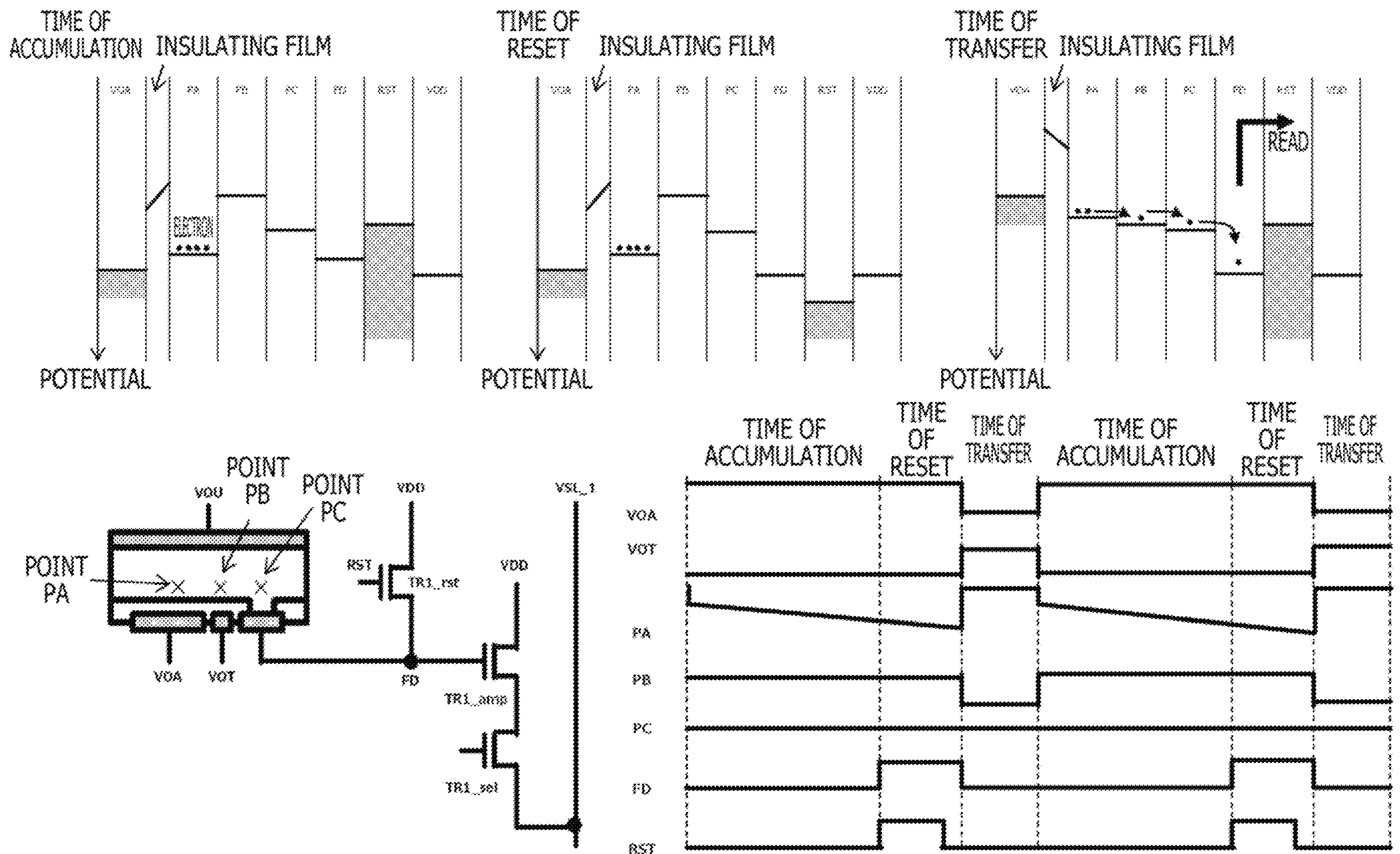
FIG. 43 is a schematic diagram of potential states of sites at time of an operation of the imaging element of the tenth embodiment.

Reference characters used in FIG. 33, FIGS. 43 and 44 in a tenth embodiment to be described later, and in FIGS. 49 and 50 in a twelfth embodiment to be described later are as follows.

PA . . . Potential at a point PA in a region of the photoelectric conversion layer 13 opposed to the charge accumulation electrode 14, or potential at the point PA in a region of the photoelectric conversion layer 13 opposed to a charge accumulation electrode segment 14C PB . . . Potential at a point PB in a region of the photoelectric conversion layer 13 opposed to a region located midway between the charge accumulation electrode 14 and the second electrode 12, potential at the point PB in a region of the photoelectric conversion layer 13 opposed to a transfer control electrode (charge transfer electrode) 15, or potential at the point PB in a region of the photoelectric conversion layer 13 opposed to a charge accumulation electrode segment 14B PC . . . Potential at a point PC in a region of the photoelectric conversion layer 13 opposed to the second electrode 12, or potential at the point PC in a region of the photoelectric conversion layer 13 opposed to a charge accumulation electrode segment 14A PD . . . Potential at a point PD in a region of the photoelectric conversion layer 13 opposed to the region located midway between the charge accumulation electrode segment 14C and the second electrode 12

FD . . . Potential in the first floating diffusion region $FD_1$

VOA . . . Potential of the charge accumulation electrode 14

VOA-A . . . Potential of the charge accumulation electrode segment 14A

VOA-B . . . Potential of the charge accumulation electrode segment 14B

VOA-C . . . Potential of the charge accumulation electrode segment 14C

VOT . . . Potential of a transfer control electrode (charge transfer electrode) 15

RST . . . Potential of the gate section 51 of the reset transistor $TR1_{rst}$ VDD . . . Potential of the power supply VSL_1 . . . Signal line (data output line) $VSL_1$ TR1_rst . . . Reset transistor $TR1_{rst}$ TR1_amp . . . Amplification transistor $TR1_{amp}$ TR1_sel . . . Selection transistor $TR1_{sel}$ A potential $V_{11}$ is applied from the drive circuit to the second electrode 12 and a potential $V_{12}$ is applied therefrom to the charge accumulation electrode 14 in a charge accumulation period. Light incident on the photoelectric conversion layer 13 causes photoelectric conversion in the photoelectric conversion layer 13. Holes generated by the photoelectric conversion are transmitted from the first electrode 11 to the drive circuit via an interconnection $V_{OU}$. On the other hand, since the potential of the second electrode 12 is set higher than that of the first electrode 11, that is, since a positive potential, for example, is applied to the second electrode 12 and a negative potential, for example, is applied to the first electrode 11, the potentials of the first electrode 11 and the second electrode 12 are assumed to satisfy $V_{12} \geq V_{11}$, preferably $V_{12} > V_{11}$. This causes electrons generated by the photoelectric conversion to be attracted to the charge accumulation electrode 14 and to be stopped in the region of the photoelectric conversion layer 13 opposed to the charge accumulation electrode 14. In other words, charges are accumulated in the photoelectric conversion layer 13. Because of $V_{12} > V_{11}$, the electrons generated within the photoelectric conversion layer 13 do not move toward the second electrode 12. With passage of time of the photoelectric conversion, the potential in the region of the photoelectric conversion layer 13 opposed to the charge accumulation electrode 14 is closer to a more negative value.

A reset operation is performed in a latter period of the charge accumulation period. This causes the potential of the first floating diffusion region $FD_1$ to be reset and the potential of the first floating diffusion region $FD_1$ to be equal to the potential $V_{DD}$ of the power supply.

After completion of the reset operation, the charges are read. In other words, a potential $V_{21}$ is applied from the drive circuit to the second electrode 12 and a potential $V_{22}$ is applied therefrom to the charge accumulation electrode 14 in a charge transfer period. It is assumed herein that $V_{21} < V_{21}$. This causes the electrons stopped in the region of the photoelectric conversion layer 13 opposed to the charge accumulation electrode 14 are read to the second electrode 12 and yet to the first floating diffusion region $FD_1$. In other words, the charges accumulated in the photoelectric conversion layer 13 are read to the control section.

Thus, a series of operations including the charge accumulation, the reset operation, and the charge transfer are completed.

Operations of the amplification transistor $TR1_{amp}$ and the selection transistor $TR1_{sel}$ after the electrons are read to the first floating diffusion region $FD_1$ are the same as those of conventional transistors of these types. In addition, a series of operations including charge accumulation, a reset operation, and charge transfer of each of the second imaging element and third imaging element are similar to a series of conventional operations including the charge accumulation, the reset operation, and the charge transfer. Furthermore, reset noise of the first floating diffusion region $FD_1$ can be removed by correlated double sampling (CDS) similarly to the conventional technique.

As described so far, in the seventh embodiment, the imaging element has the charge accumulation electrode that is disposed to be apart from the second electrode and that is disposed to be opposed to the photoelectric conversion layer via the insulating film; thus, when the photoelectric conversion section is irradiated with light and performs photoelectric conversion, a kind of capacitor is formed by the photoelectric conversion layer, the insulating film, and the charge accumulation electrode and the charges generated in the photoelectric conversion layer can be accumulated. Owing to this, it is possible to completely deplete the charge accumulation section and eliminate the charges at a time of starting exposure. As a result, it is possible to suppress occurrence of a phenomenon that kTC noise grows and random noise aggravates, resulting in deterioration in an imaging quality. Furthermore, all pixels can be reset simultaneously; thus, it is possible to realize a so-called global shutter function.

Figure 34:
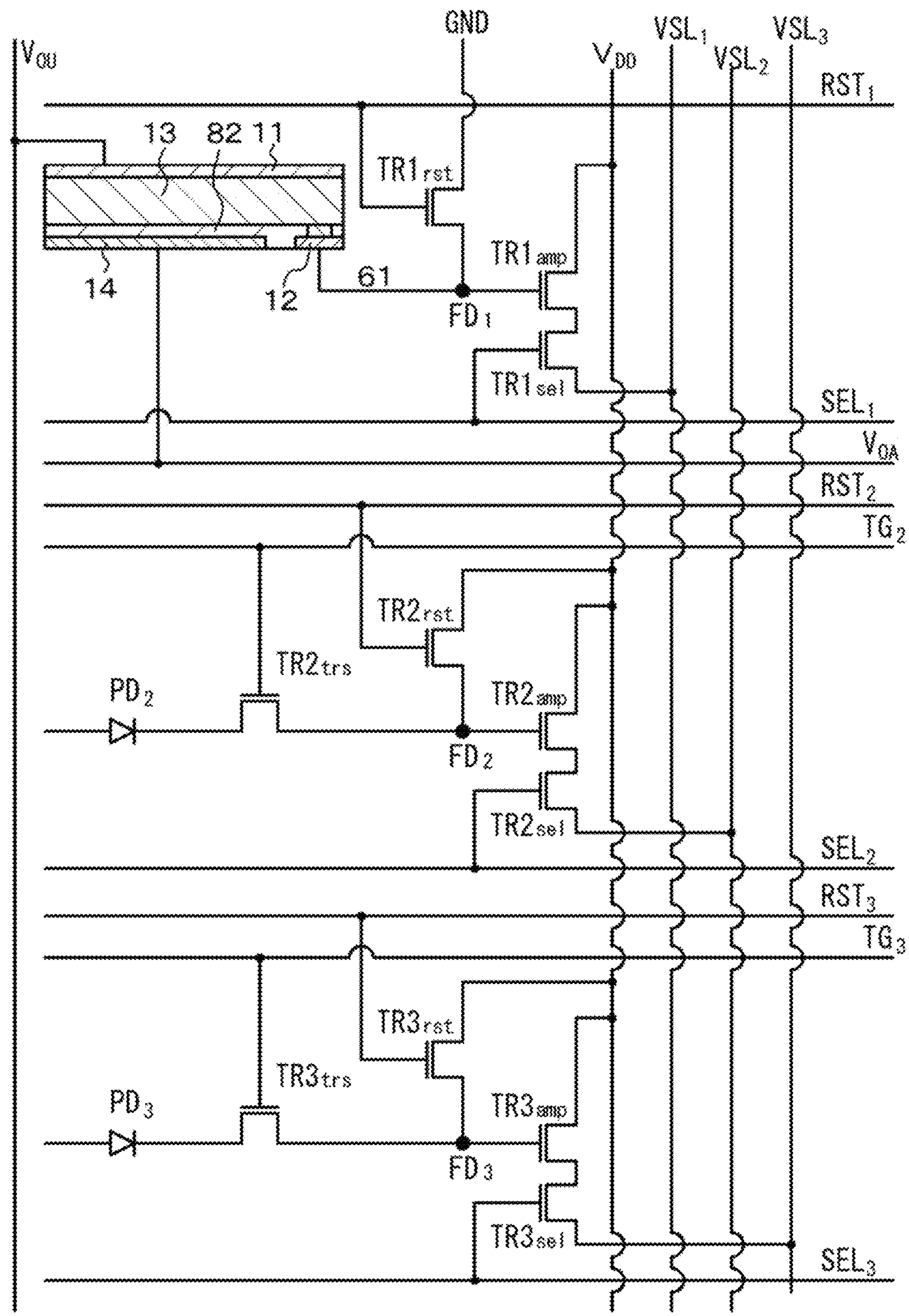
FIG. 34 is an equivalent circuit diagram of a modification of the imaging element or the stacked imaging element of the seventh embodiment.

As depicted in FIG. 34 that is an equivalent circuit diagram of a modification the imaging element or the stacked imaging element of the seventh embodiment, the other source/drain region 51C of the reset transistor $TR1_{rst}$ may be grounded instead of being connected to the power supply $V_{DD}$.

Eighth Embodiment

Figure 35:
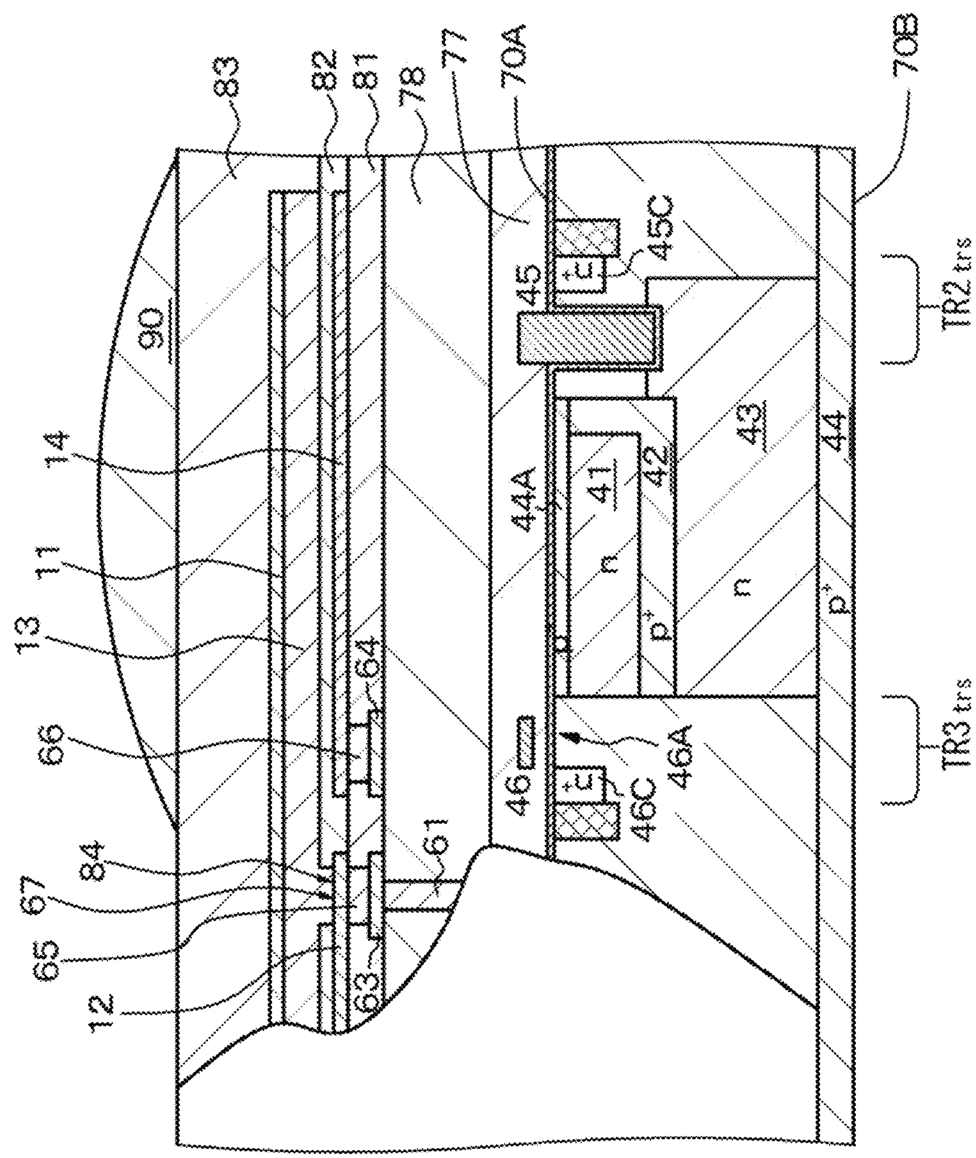
FIG. 35 is a schematic partial cross-sectional view of an imaging element or a stacked imaging element of an eighth embodiment.

FIG. 8 is a modification of the seventh embodiment. An imaging element or a stacked imaging element of the eighth embodiment depicted in FIG. 35 that is a schematic partial cross-sectional view is a surface irradiation type imaging element or stacked imaging element, and has a structure of stacking three imaging elements, that is, the first type green light imaging element of the seventh embodiment (first to sixth embodiments) that has the first type green light photoelectric conversion layer absorbing green light and that is sensitive to the green light, the second type blue light imaging element of the conventional technique (second imaging element) that has the second type blue light photoelectric conversion layer absorbing blue light and that is sensitive to the blue light, and the second type red light imaging element of the conventional technique (third imaging element) that has the second type red light photoelectric conversion layer absorbing red light and that is sensitive to the red light. Here, the red light imaging element (third imaging element) and the blue light imaging element (second imaging element) are provided in the semiconductor substrate 70, and the second imaging element is located closer to the light incidence side than the third imaging element. Furthermore, the green light imaging element (first imaging element) is provided above the blue light imaging element (second imaging element).

Similarly to the seventh embodiment, various transistors configuring the control section are provided on the surface 70A-side of the semiconductor substrate 70. These transistors can be formed to be substantially similar in configuration and structure to the transistors described in the seventh embodiment. Furthermore, while the second imaging element and the third imaging element are provided in the semiconductor substrate 70, these imaging element can be formed to be substantially similar in configuration and structure to the second imaging element and the third imaging element described in the seventh embodiment.

Interlayer insulating layers 77 and 78 are formed on the surface 70A of the semiconductor substrate 70, and the photoelectric conversion section (the second electrode 12 and the like, the photoelectric conversion layer 13, and the first electrode 11) configuring the imaging element of the seventh embodiment as well as the charge accumulation electrode 14 and the like are provided on the interlayer insulating layer 78.

In this way, a configuration and a structure of the imaging element or the stacked imaging element of the eighth embodiment can be made similar to those of the imaging element or the stacked imaging element of the seventh embodiment except that the imaging element is the surface irradiation type; thus, detailed description will be omitted. In addition, the configuration and the structure of the imaging element of the eighth embodiment can be applied to the imaging elements described in the first to sixth embodiments.

Ninth Embodiment

A ninth embodiment is a modification of the seventh and eighth embodiments.

Figure 36:
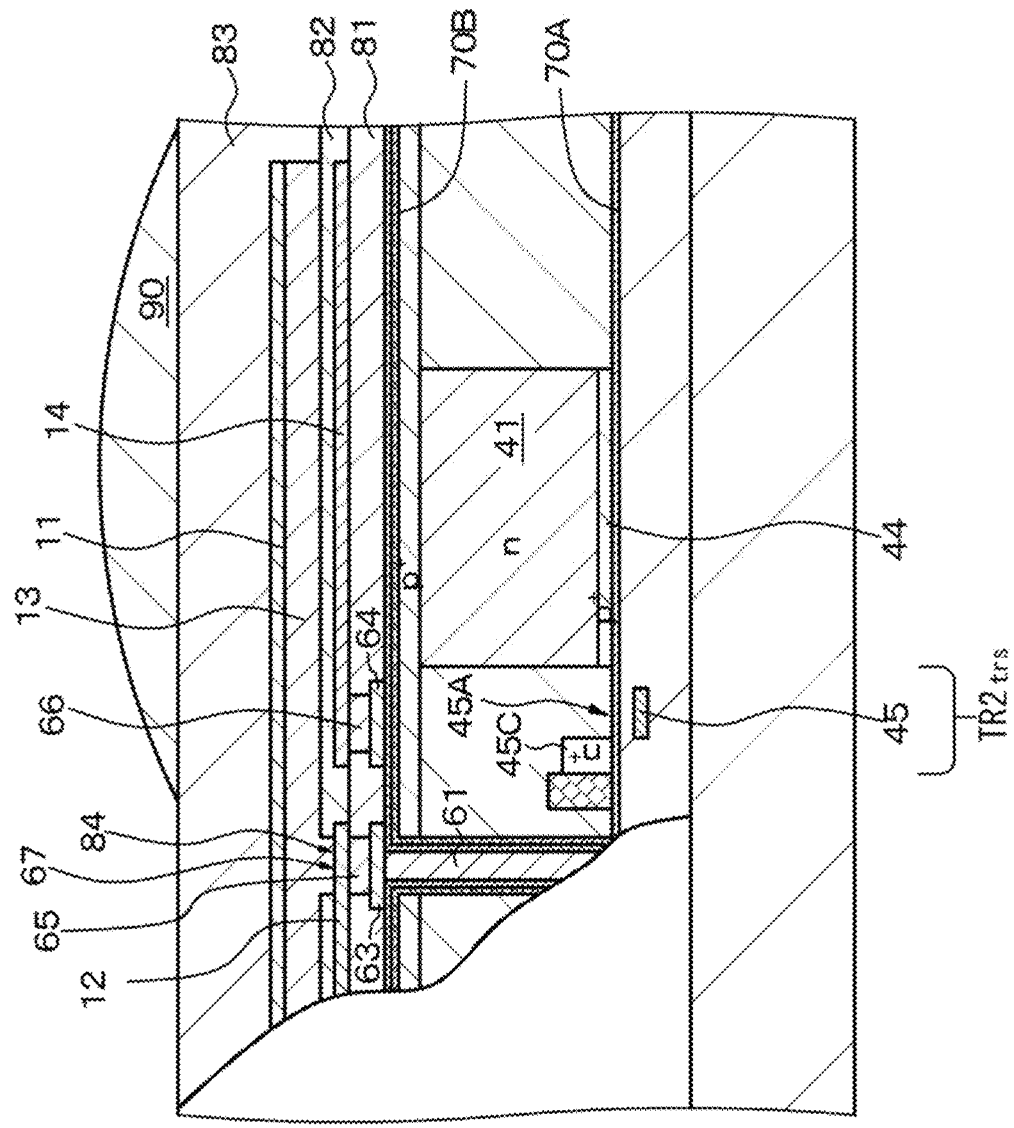
FIG. 36 is a schematic partial cross-sectional view of an imaging element or a stacked imaging element of a ninth embodiment.
Figure 37:
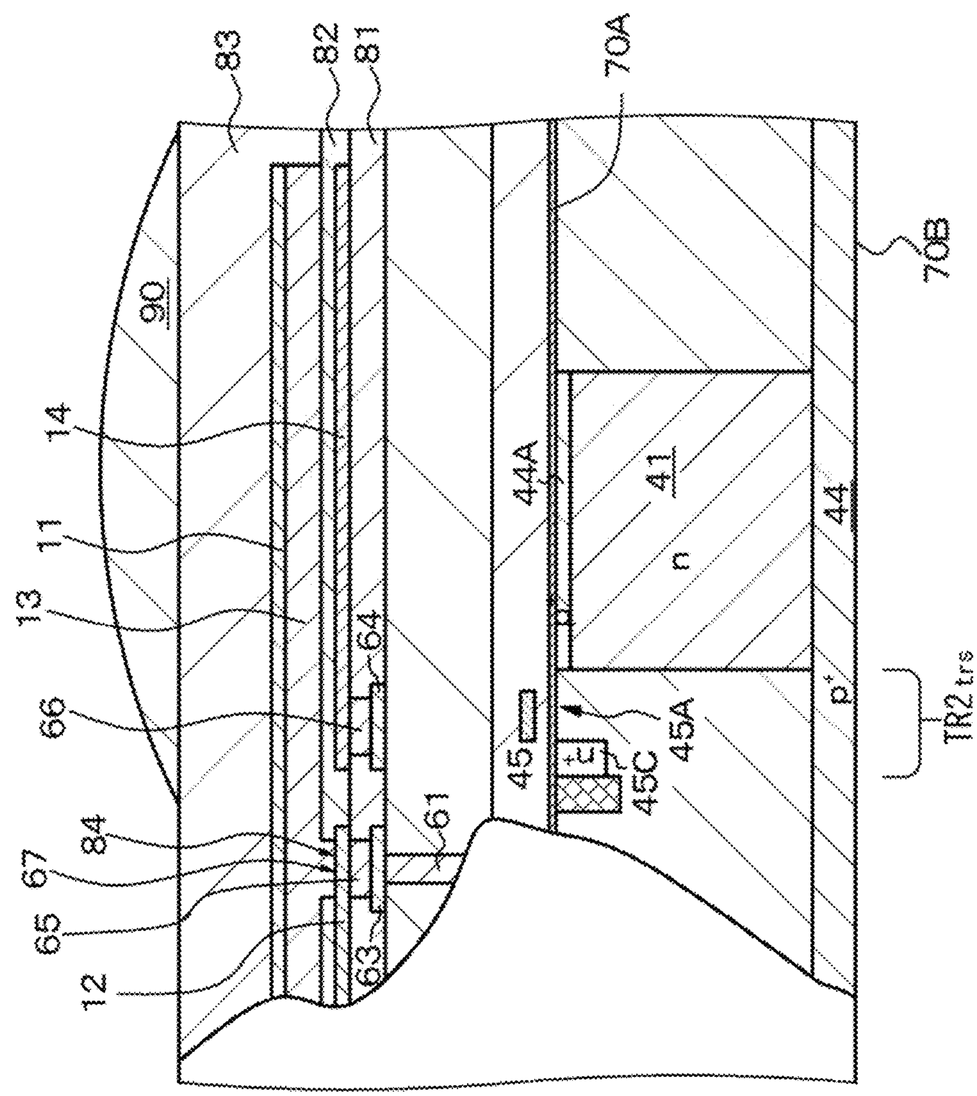
FIG. 37 is a schematic partial cross-sectional view of a modification of the imaging element or the stacked imaging element of the ninth embodiment.

An imaging element or a stacked imaging element of the ninth embodiment depicted in FIG. 36 that is a schematic partial cross-sectional view is a back irradiation type imaging element or stacked imaging element, and has a structure of stacking two imaging elements, that is, the first type, first imaging element of the seventh embodiment (first to sixth embodiments) and the second type, second imaging element. In addition, a modification of the imaging element or stacked imaging element of the ninth embodiment depicted in FIG. 37 that is a schematic partial cross-sectional view is a surface irradiation type imaging element or stacked imaging element, and has a structure of stacking two imaging elements, that is, the first type, first imaging element of the seventh embodiment (first to sixth embodiments) and the second type, second imaging element. Here, the first imaging element absorbs primary color light and the second imaging element absorbs complementary color light. Alternatively, the first imaging element absorbs white light and the second imaging element absorbs infrared rays.

Figure 38:
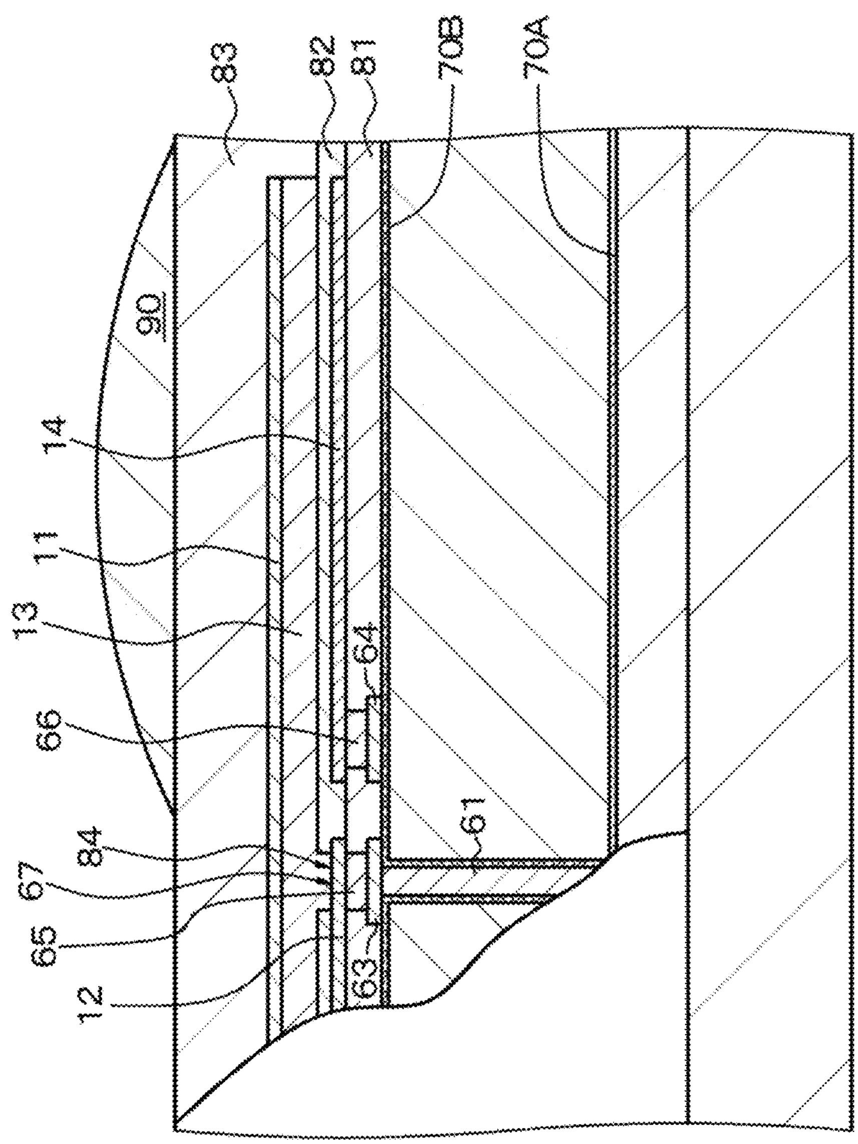
FIG. 38 is a schematic partial cross-sectional view of another modification of the imaging element or the stacked imaging element of the ninth embodiment.
Figure 39:
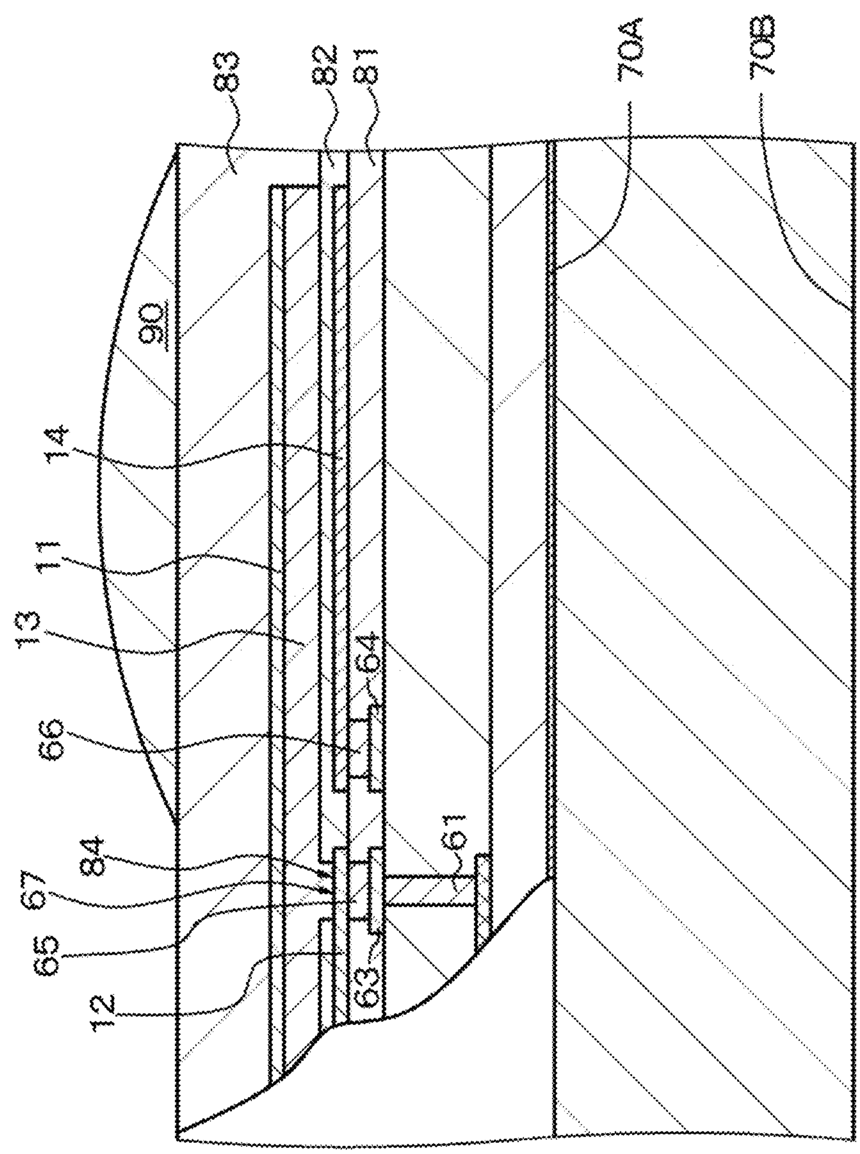
FIG. 39 is a schematic partial cross-sectional view of yet another modification of the imaging element of the ninth embodiment.

A modification of the imaging element of the ninth embodiment depicted in FIG. 38 that is a schematic partial cross-sectional view is a back irradiation type imaging element and configured from the first type, first imaging element of the seventh embodiment (first to sixth embodiments). In addition, a modification of the imaging element of the ninth embodiment depicted in FIG. 39 that is a schematic partial cross-sectional view is a front irradiation type imaging element and configured from the first type, first imaging element of the seventh embodiment (first to sixth embodiments). Here, the first imaging element is configured from three types of imaging elements, that is, the imaging element absorbing the red light, the imaging element absorbing the green light, and the imaging element absorbing the blue light. Furthermore, a plurality of imaging elements as above configures the solid-state imaging device according to the first aspect of the present disclosure. As an example of disposing the plurality of imaging elements, the Bayer array can be cited. A color filter for dispersing the blue light, the green light, and the red light is provided on the light incidence side of each imaging element as needed.

A configuration and a structure of the imaging element of the ninth embodiment can be applied to the imaging elements described in the first to sixth embodiments.

Tenth Embodiment

Figure 32B:
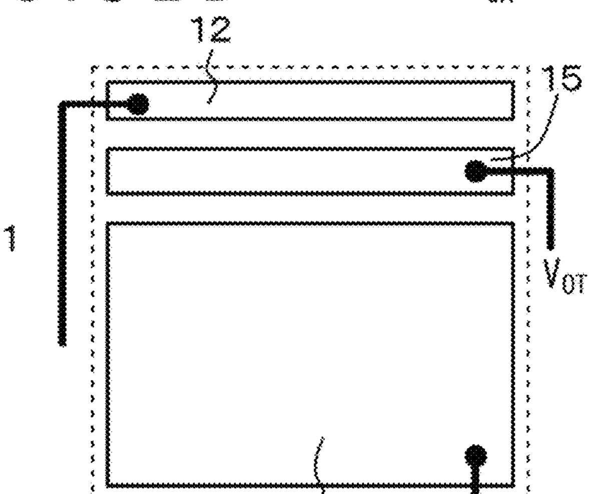
Figure 40:
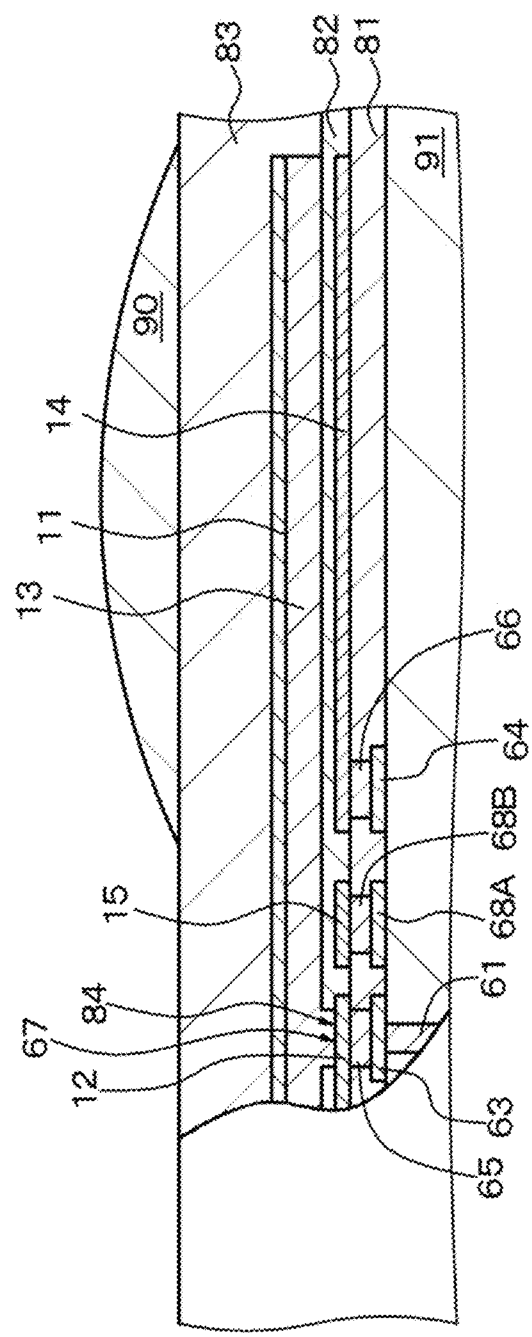
FIG. 40 is a schematic partial cross-sectional view of an imaging element or a stacked imaging element of the tenth embodiment.
Figure 41:
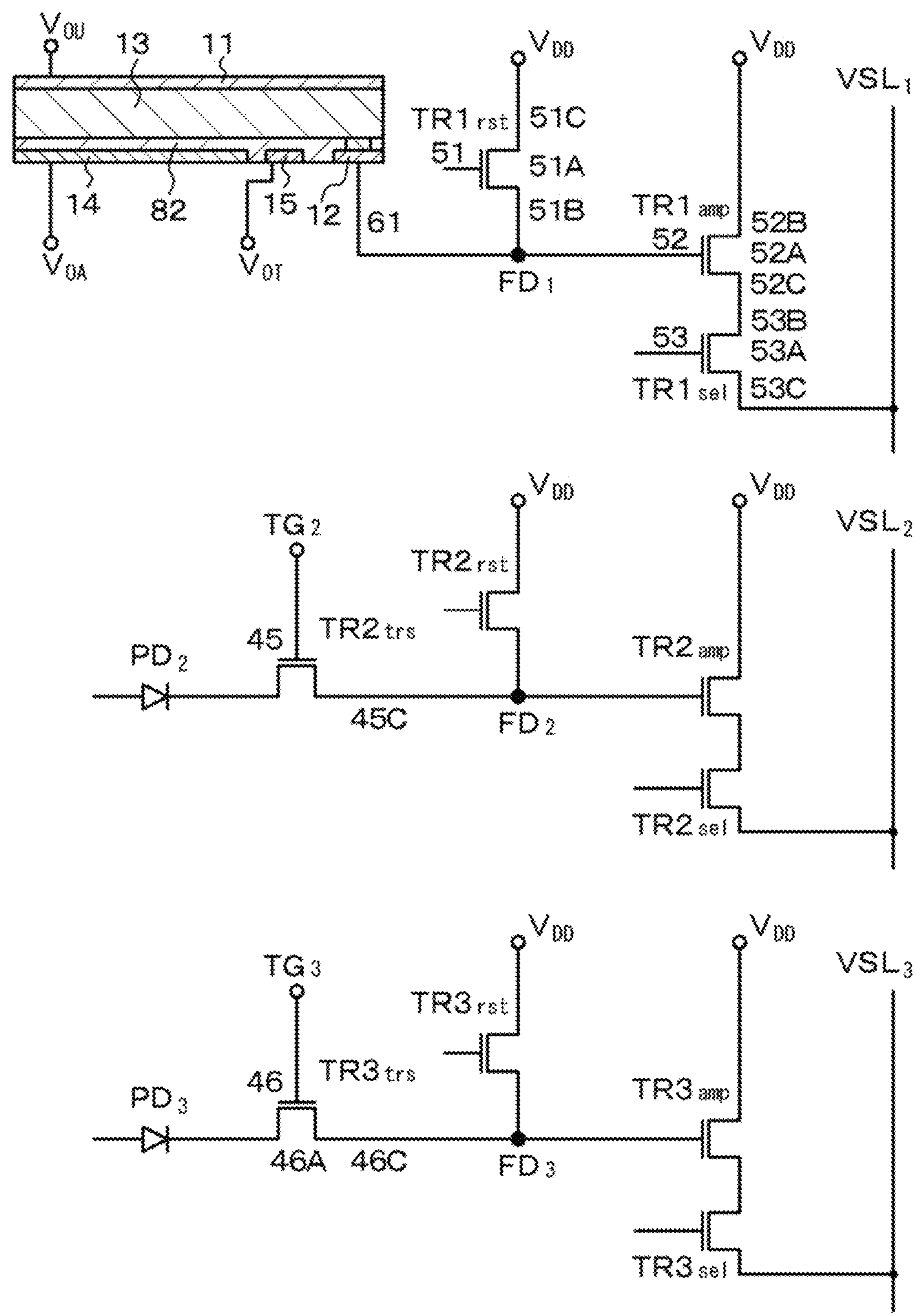
FIG. 41 is an equivalent circuit diagram of the imaging element or the stacked imaging element of the tenth embodiment.
Figure 42:
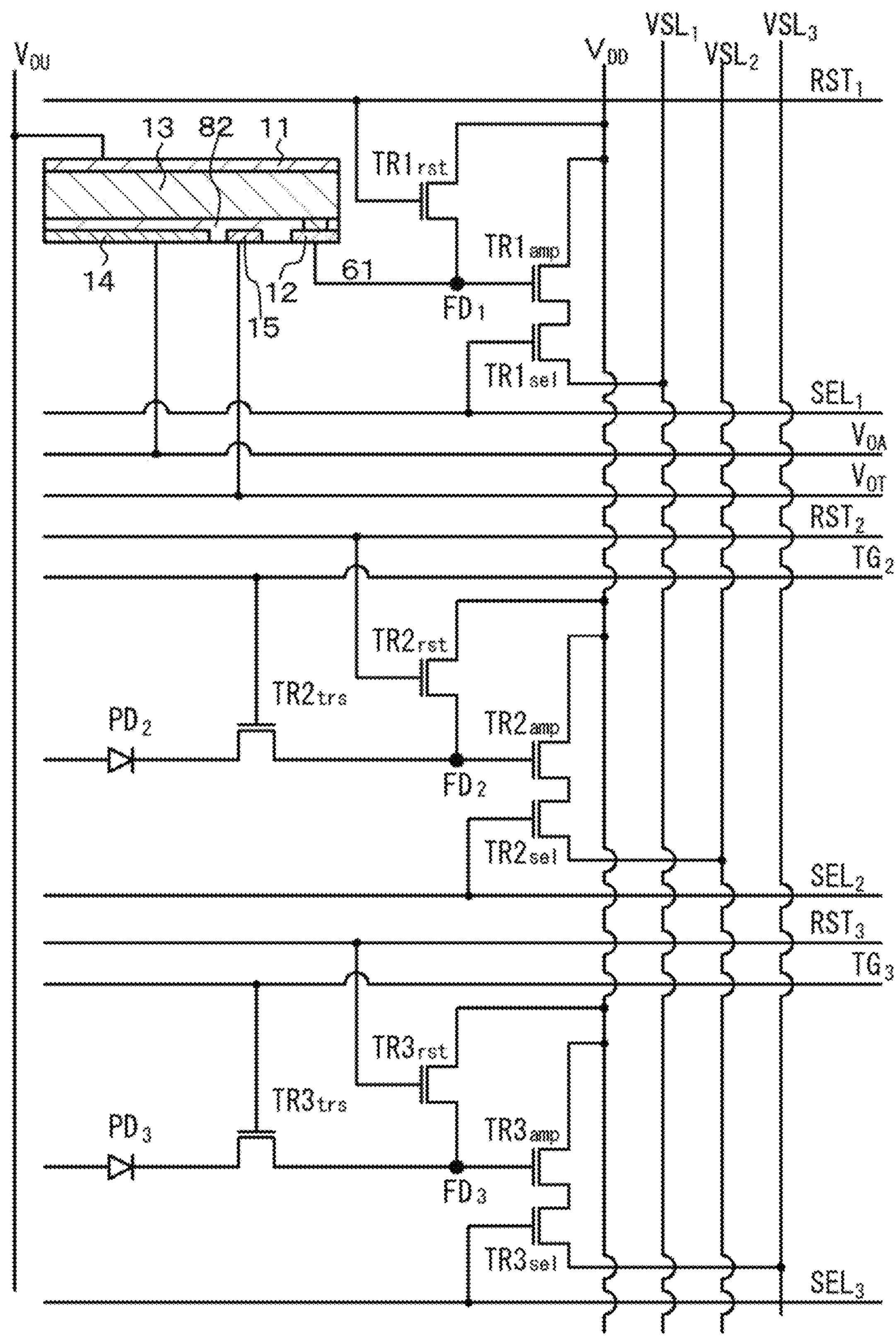
FIG. 42 is an equivalent circuit diagram of the imaging element or the stacked imaging element of the tenth embodiment.

A tenth embodiment is a modification of the seventh to ninth embodiments and relates to an imaging element having a transfer control electrode (charge transfer electrode). FIG. 40 depicts a schematic partial cross-sectional view of part of an imaging element or a stacked imaging element of the tenth embodiment, FIGS. 41 and 42 depict equivalent circuit diagrams of the imaging element or the stacked imaging element of the tenth embodiment, and FIGS. 43 and 44 schematically depict potential states of sites at time of an operation of the imaging element of the tenth embodiment. In addition, FIG. 32B depicts a schematic layout plan of the second electrode, the charge accumulation electrode, and the like configuring the imaging element of the tenth embodiment.

The imaging element or the stacked imaging element of the tenth embodiment further has a transfer control electrode (charge transfer electrode) 15 that is disposed between the second electrode 12 and the charge accumulation electrode 14 to be apart from the second electrode 12 and the charge accumulation electrode 14 and that is disposed to be opposed to the photoelectric conversion layer 13 via the insulating film 82. The transfer control electrode 15 is connected to a pixel drive circuit configuring the drive circuit via a connection hole 68B, a pad section 68A, and an interconnection $V_{OT}$ provided in the interlayer insulating layer 81. It is noted that various constituent elements of the imaging element located below the interlayer insulating layer 81 are generically denoted by the reference number 91 for simplification of the drawing and for the sake of convenience.

An operation of the imaging element (first imaging element) of the tenth embodiment will be described hereinafter with reference to FIGS. 43 and 44. It is noted that FIGS. 43 and 44 differ in a potential applied to the charge accumulation electrode 14 and a value of the potential at the position PB.

The potential Vu is applied from the drive circuit to the second electrode 12, and the potential $V_{12}$, is applied therefrom to the charge accumulation electrode 14, and a potential $V_{13}$ is applied therefrom to the transfer control electrode 15 in the charge accumulation period. Light incident on the photoelectric conversion layer 13 causes photoelectric conversion in the photoelectric conversion layer 13. Holes generated by the photoelectric conversion are transmitted from the first electrode 11 to the drive circuit via the interconnection $V_{OU}$. On the other hand, since the potential of the second electrode 12 is set higher than that of the first electrode 11, that is, since a positive potential, for example, is applied to the second electrode 12 and a negative potential, for example, is applied to the first electrode 11, the potentials of the first electrode 11 and the second electrode 12 are assumed to satisfy $V_{12}>V_{13}$ (for example, $V_{12}>V_{11}>V_{11}$ or $V_{11}>V_{12}>V_{13}$). This causes electrons generated by the photoelectric conversion to be attracted to the charge accumulation electrode 14 and to be stopped in the region of the photoelectric conversion layer 13 opposed to the charge accumulation electrode 14.

In other words, charges are accumulated in the photoelectric conversion layer 13. Because of $V_{12}>V_{13}$, it is possible to reliably prevent the electrons generated within the photoelectric conversion layer 13 from moving toward the second electrode 12. With passage of time of the photoelectric conversion, the potential in the region of the photoelectric conversion layer 13 opposed to the charge accumulation electrode 14 is closer to a more negative value.

A reset operation is performed in a latter period of the charge accumulation period. This causes the potential of the first floating diffusion region $FD_1$ to be reset and the potential of the first floating diffusion region $FD_1$ to be equal to the potential $V_{DD}$ of the power supply.

After completion of the reset operation, the charges are read. In other words, the potential $V_{21}$ is applied from the drive circuit to the second electrode 12, and the potential $V_{22}$ is applied therefrom to the charge accumulation electrode 14, and a potential $V_{23}$ is applied therefrom to the transfer control electrode 15 in the charge transfer period. It is assumed herein that $V_{22} \leq V_{23} \leq V_{21}$. This ensures that the electrons stopped in the region of the photoelectric conversion layer 13 opposed to the charge accumulation electrode 14 are read to the second electrode 12 and yet to the first floating diffusion region $FD_1$. In other words, the charges accumulated in the photoelectric conversion layer 13 are read to the control section.

Thus, a series of operations including the charge accumulation, the reset operation, and the charge transfer are completed.

Operations of the amplification transistor $TR1_{amp}$ and the selection transistor $TR1_{sel}$ after the electrons are read to the first floating diffusion region $FD_1$ are the same as those of conventional transistors of these types. In addition, a series of operations including charge accumulation, a reset operation, and charge transfer of, for example, each of the second imaging element and third imaging element are similar to a series of conventional operations including the charge accumulation, the reset operation, and the charge transfer.

A configuration and a structure of the imaging element of the tenth embodiment can be applied to the imaging elements described in the first to sixth embodiments.

Eleventh Embodiment

Figure 45:
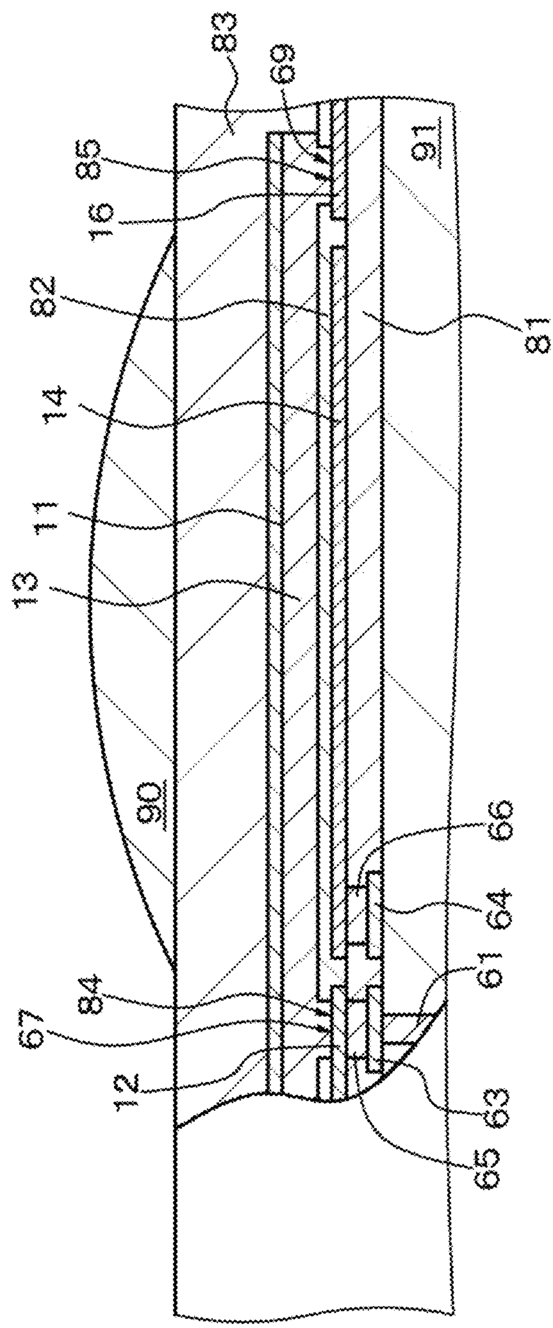
FIG. 45 is a schematic partial cross-sectional view of an imaging element or a stacked imaging element of an eleventh embodiment.

An eleventh embodiment is a modification of the seventh to tenth embodiments and relates to an imaging element having a charge emitting electrode. FIG. 45 is a schematic partial cross-sectional view of an imaging element or a stacked imaging element of the eleventh embodiment.

The imaging element or the stacked imaging element of the eleventh embodiment further has a charge emitting electrode 16 that is connected to the photoelectric conversion layer 13 via a connection section 69 and that is disposed to be apart from the second electrode 12 and the charge accumulation electrode 14. Here, the charge emitting electrode 16 is disposed to surround the second electrode 12 and the charge accumulation electrode 14 as well as various transistors provided above the semiconductor layer 70 (that is, disposed in a frame fashion). The charge emitting electrode 16 is connected to the pixel drive circuit configuring the drive circuit. The photoelectric conversion layer 13 extends within the connection section 69. In other words, the photoelectric conversion layer 13 extends within a second opening portion 84A provided in the insulating film 82 and is connected to the charge emitting electrode 16. The charge emitting electrode 16 is shared among (common to) a plurality of imaging elements.

In the eleventh embodiment, the potential $V_{11}$ is applied from the drive circuit to the second electrode 12, the potential $V_{12}$ is applied therefrom to the charge accumulation electrode 14, a potential $V_{14}$ is applied therefrom to the charge emitting electrode 16, and charges are accumulated in the photoelectric conversion layer 13 in the charge accumulation period. Light incident on the photoelectric conversion layer 13 causes photoelectric conversion in the photoelectric conversion layer 13. Holes generated by the photoelectric conversion are transmitted from the first electrode 11 to the drive circuit via the interconnection $V_{OU}$. On the other hand, since the potential of the second electrode 12 is set higher than that of the first electrode 11, that is, since a positive potential, for example, is applied to the second electrode 12 and a negative potential, for example, is applied to the first electrode 11, the potentials of the first electrode 11 and the second electrode 12 are assumed to satisfy $V_{14}>V_{11}$ (for example, $V_{12}>V_{14}>V_{11}$). This causes electrons generated by the photoelectric conversion to be attracted to the charge accumulation electrode 14 and to be stopped in the region of the photoelectric conversion layer 13 opposed to the charge accumulation electrode 14; thus, this can ensure that the electrons are prevented from moving toward the second electrode 12. It is noted, however, that electrons that are not attracted sufficiently by the charge accumulation electrode 14 or those that fail to be accumulated in the photoelectric conversion layer 13 (so-called overflowing electrons) are transmitted to the drive circuit by way of the charge emitting electrode 16.

A reset operation is performed in a latter period of the charge accumulation period. This causes the potential of the first floating diffusion region $FD_1$ to be reset and the potential of the first floating diffusion region $FD_1$ to be equal to the potential $V_{DD}$ of the power supply.

After completion of the reset operation, the charges are read. In other words, the potential $V_{21}$ is applied from the drive circuit to the second electrode 12, and the potential $V_{22}$ is applied therefrom to the charge accumulation electrode 14, and a potential $V_{24}$ is applied therefrom to the charge emitting electrode 16 in the charge transfer period. It is assumed herein that $V_{24}<V_{21}$ (for example, $V_{24}<V_{22}<V_{21}$). This ensures that the electrons stopped in the region of the photoelectric conversion layer 13 opposed to the charge accumulation electrode 14 are read to the second electrode 12 and yet to the first floating diffusion region $FD_1$. In other words, the charges accumulated in the photoelectric conversion layer 13 are read to the control section.

Thus, a series of operations including the charge accumulation, the reset operation, and the charge transfer are completed.

Operations of the amplification transistor $TR1_{amp}$ and the selection transistor $TR1_{sel}$ after the electrons are read to the first floating diffusion region $FD_1$ are the same as those of conventional transistors of these types. In addition, a series of operations including charge accumulation, a reset operation, and charge transfer of, for example, each of the second imaging element and third imaging element are similar to a series of conventional operations including the charge accumulation, the reset operation, and the charge transfer.

In the eleventh embodiment, the so-called overflowing electrons are transmitted to the drive circuit by way of the charge emitting electrode 16; thus, it is possible to suppress leakage of electrons to charge accumulation sections of adjacent pixels and suppress occurrence of blooming. Further, this can improve an imaging performance of the imaging element. In addition, a configuration and a structure of the imaging element of the eleventh embodiment can be applied to the imaging elements described in the first to sixth embodiments.

Twelfth Embodiment

A twelfth embodiment is a modification of the seventh to eleventh embodiments and relates to an imaging element having a plurality of charge accumulation electrode segments.

Figure 32C:
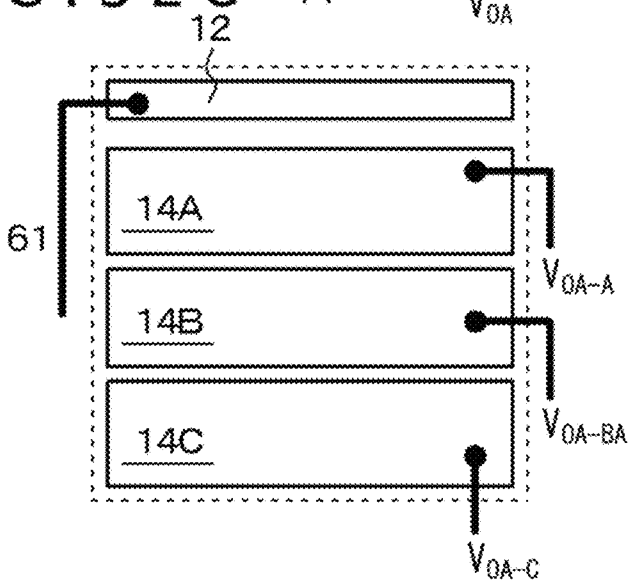
Figure 46:
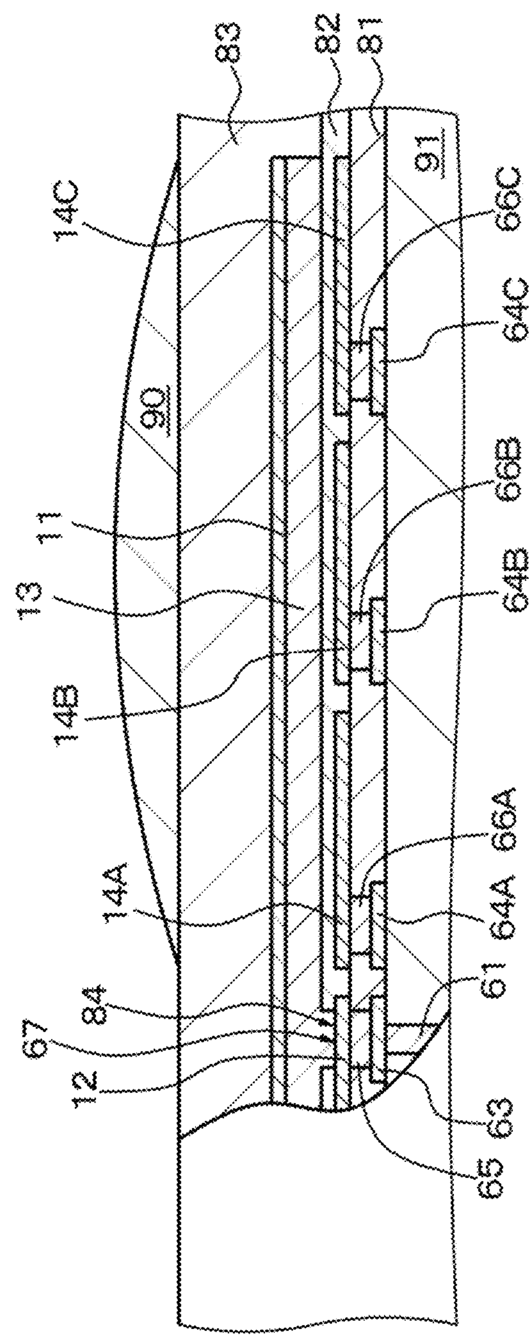
FIG. 46 is a schematic partial cross-sectional view of an imaging element or a stacked imaging element of a twelfth embodiment.
Figure 47:
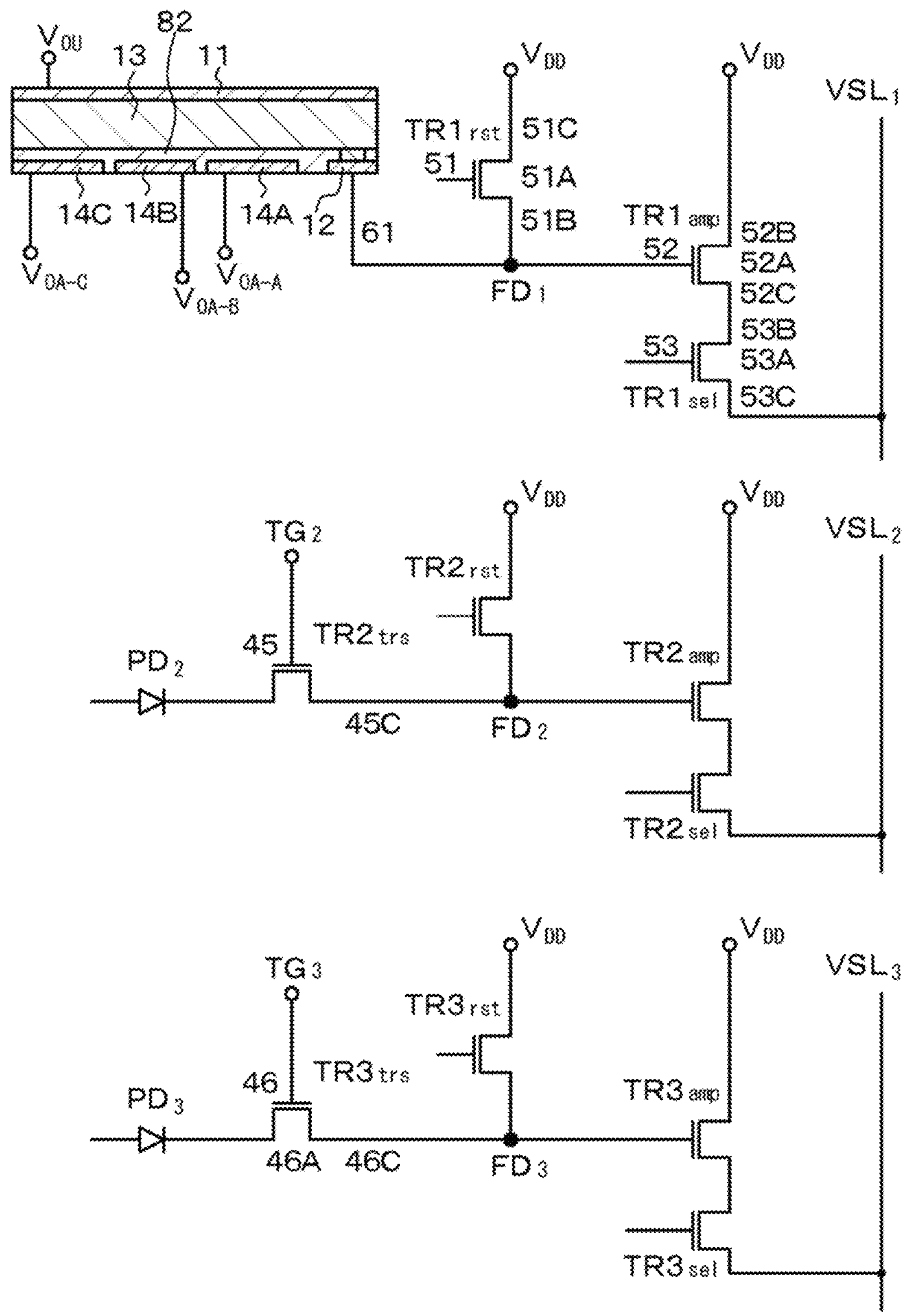
FIG. 47 is an equivalent circuit diagram of the imaging element or the stacked imaging element of the twelfth embodiment.
Figure 48:
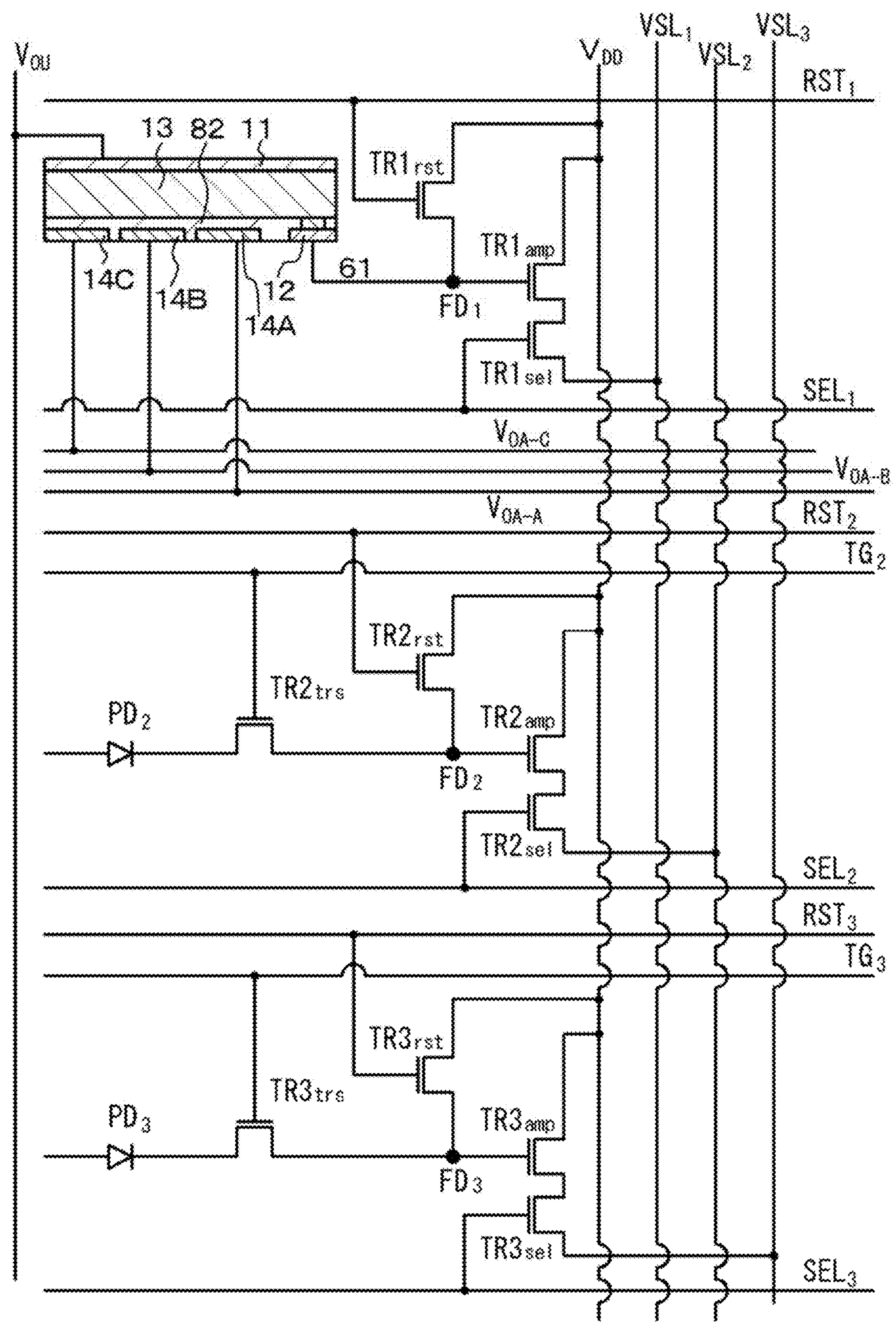
FIG. 48 is an equivalent circuit diagram of the imaging element or the stacked imaging element of the twelfth embodiment.
Figure 49:
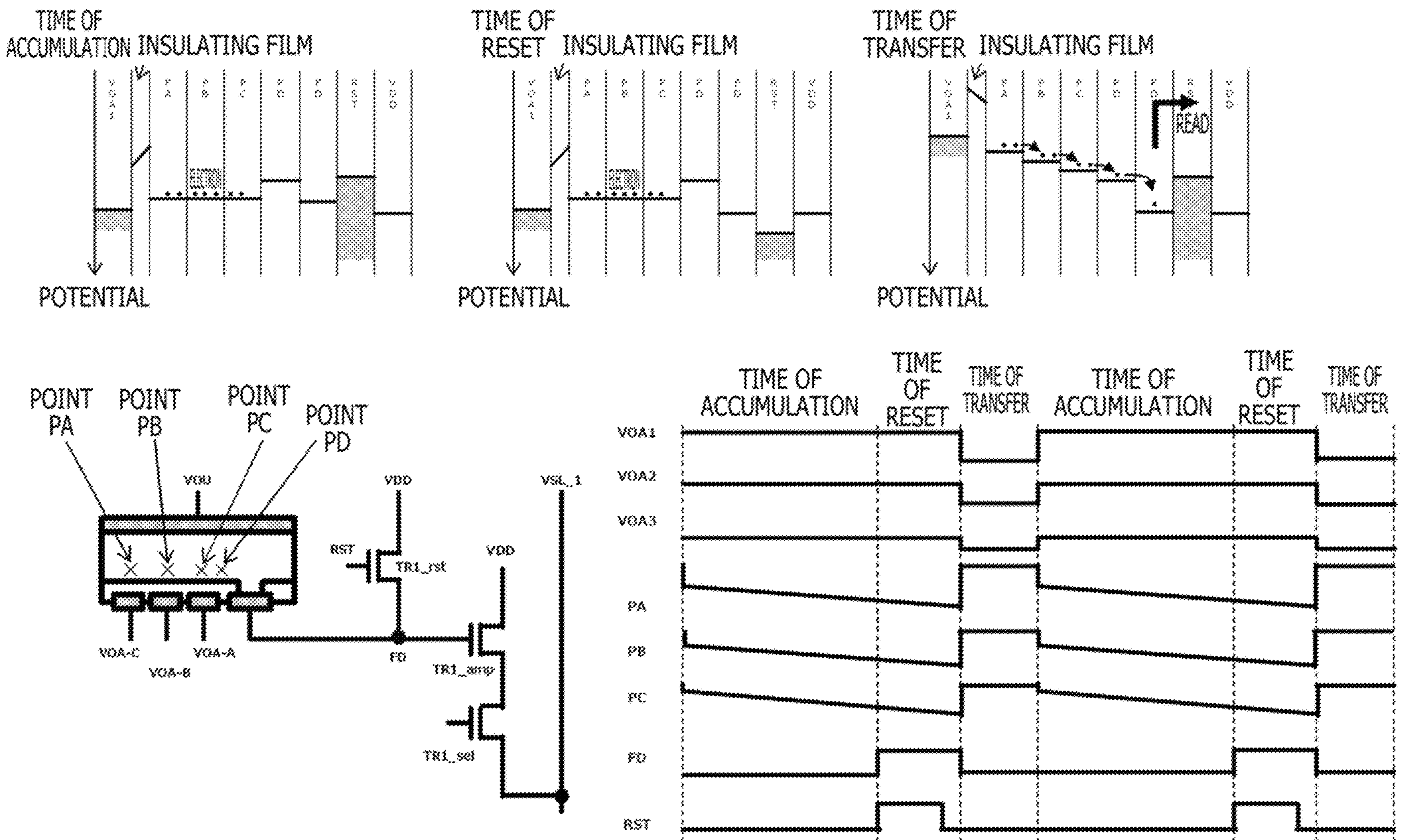
FIG. 49 is a schematic diagram of potential states of sites at time of an operation of the imaging element of the twelfth embodiment.
Figure 50:
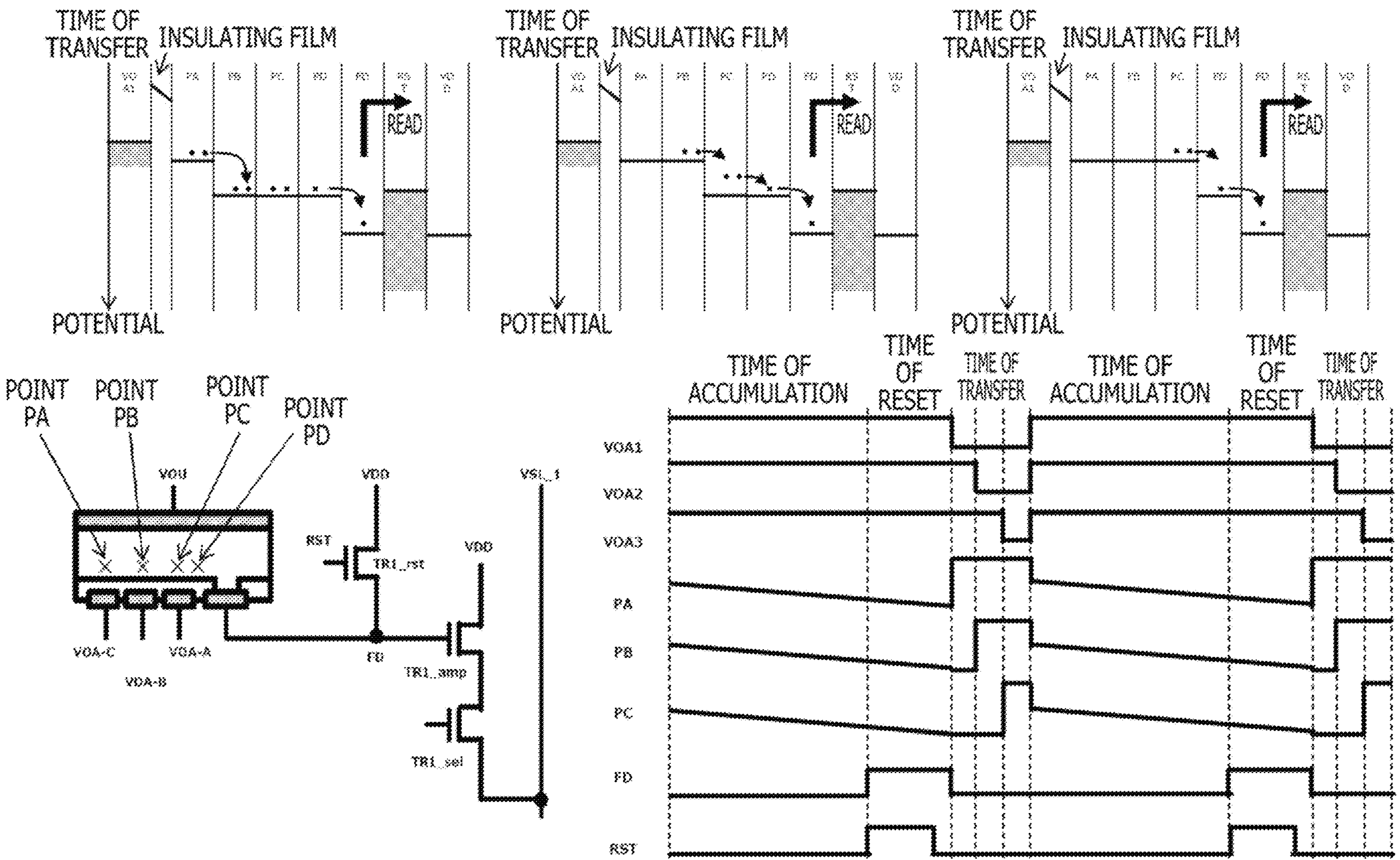
FIG. 50 is a schematic diagram of potential states of sites at time of another operation (transfer) of the imaging element of the twelfth embodiment.

FIG. 46 depicts a schematic partial cross-sectional view of part of an imaging element of the twelfth embodiment, FIGS. 47 and 48 depict equivalent circuit diagrams of the imaging element or a stacked imaging element of the twelfth embodiment, and FIGS. 49 and 50 schematically depict potential states of sites at time of an operation of the imaging element of the twelfth embodiment. In addition, FIG. 32C depicts a schematic layout plan of the second electrode, the charge accumulation electrode, and the like configuring the imaging element of the twelfth embodiment.

In the twelfth embodiment, the charge accumulation electrode 14 is configured from a plurality of charge accumulation electrode segments 14A, 14B, and 14C. While the number of charge accumulation electrode segments may be equal to or greater than 2, the number is assumed as “3” in the twelfth embodiment. Furthermore, in the imaging element or the stacked imaging element of the twelfth embodiment, the potential of the second electrode 12 is higher than that of the first electrode 11, that is, a positive potential, for example, is applied to the second electrode 12 and a negative potential, for example, is applied to the first electrode; thus, a potential applied to the charge accumulation electrode segment 14A located in a location closest to the second electrode 12 is higher than a potential applied to the charge accumulation electrode segment 14C located in a location farthest from the second electrode 12 in the charge transfer period. In this way, imparting a potential gradient to the charge accumulation electrode 14 further ensures that the electrons stopped in the photoelectric conversion layer 13 opposed to the charge accumulation electrode 14 are read to the second electrode and yet to the first floating diffusion region $FD_1$. In other words, the charges accumulated in the photoelectric conversion layer 13 are read to the control section.

In an example depicted in FIG. 49, setting (potential of charge accumulation electrode segment 14C)<(potential of charge accumulation electrode segment 14B)<(potential of charge accumulation electrode segment 14A) enables the electrons stopped in the region of the photoelectric conversion layer 13 to be simultaneously read to the first floating diffusion region $FD_1$ in the charge transfer period. On the other hand, in an example depicted in FIG. 50, changing stepwise (that is, changing step-wise or slope-wise) the potentials of the charge accumulation electrode segments 14C, 14B, and 14A in the charge transfer period ensures that the electrons stopped in a region of the photoelectric conversion layer 13 opposed to the charge accumulation electrode segment 14C are moved to a region of the photoelectric conversion layer 13 opposed to the charge accumulation electrode segment 14B, the electrons stopped in the region of the photoelectric conversion layer 13 opposed to the charge accumulation electrode segment 14B are then moved to a region of the photoelectric conversion layer 13 opposed to the charge accumulation electrode segment 14A, and the electrons stopped in the region of the photoelectric conversion layer 13 opposed to the charge accumulation electrode segment 14A are next read to the first floating diffusion region $FD_1$.

A configuration and a structure of the imaging element of the twelfth embodiment can be applied to the imaging elements described in the first to sixth embodiments.

While the present disclosure has been described above on the basis of the preferable embodiments, the present disclosure is not limited to the embodiments. The structures and configurations of the imaging elements, the stacked imaging elements, and the solid-state imaging devices described in the embodiments, manufacturing conditions, manufacturing methods, and the materials used for the imaging elements, the stacked imaging elements, and the solid-state imaging devices are exemplarily given and can be changed as appropriate. Not only the form in which one floating diffusion region is provided per imaging element but also a form in which one floating diffusion region is provided for a plurality of imaging elements can be adopted. In other words, appropriately controlling timing of the charge transfer period enables a plurality of imaging elements to share one floating diffusion region thereamong. Furthermore, in this case, the plurality of imaging elements can also share one contact hole section thereamong. The material that configures the channel formation regions of the various transistors formed above the semiconductor layer may differ from the material that configures the photoelectric conversion layers.

Figure 51:
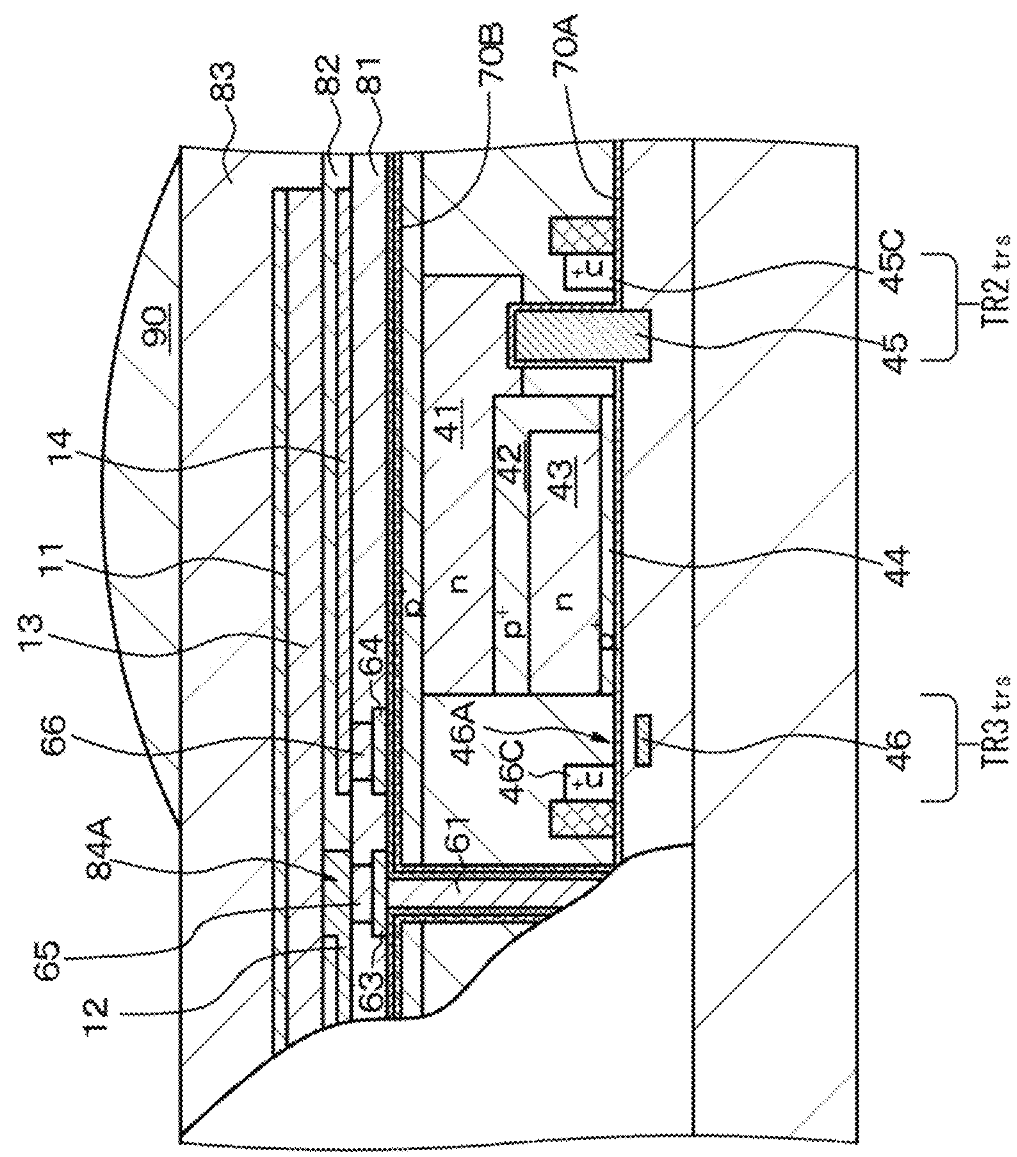
FIG. 51 is a schematic partial cross-sectional view of another modification of the imaging element or the stacked imaging element of the seventh embodiment.

As depicted in, for example, FIG. 51 that depicts the modification of the imaging element or the stacked imaging element described in the seventh embodiment, the second electrode 12 can be configured to extend within the opening portion 84A provided in the insulating film 82 and to be connected to the photoelectric conversion layer 13.

Figure 52:
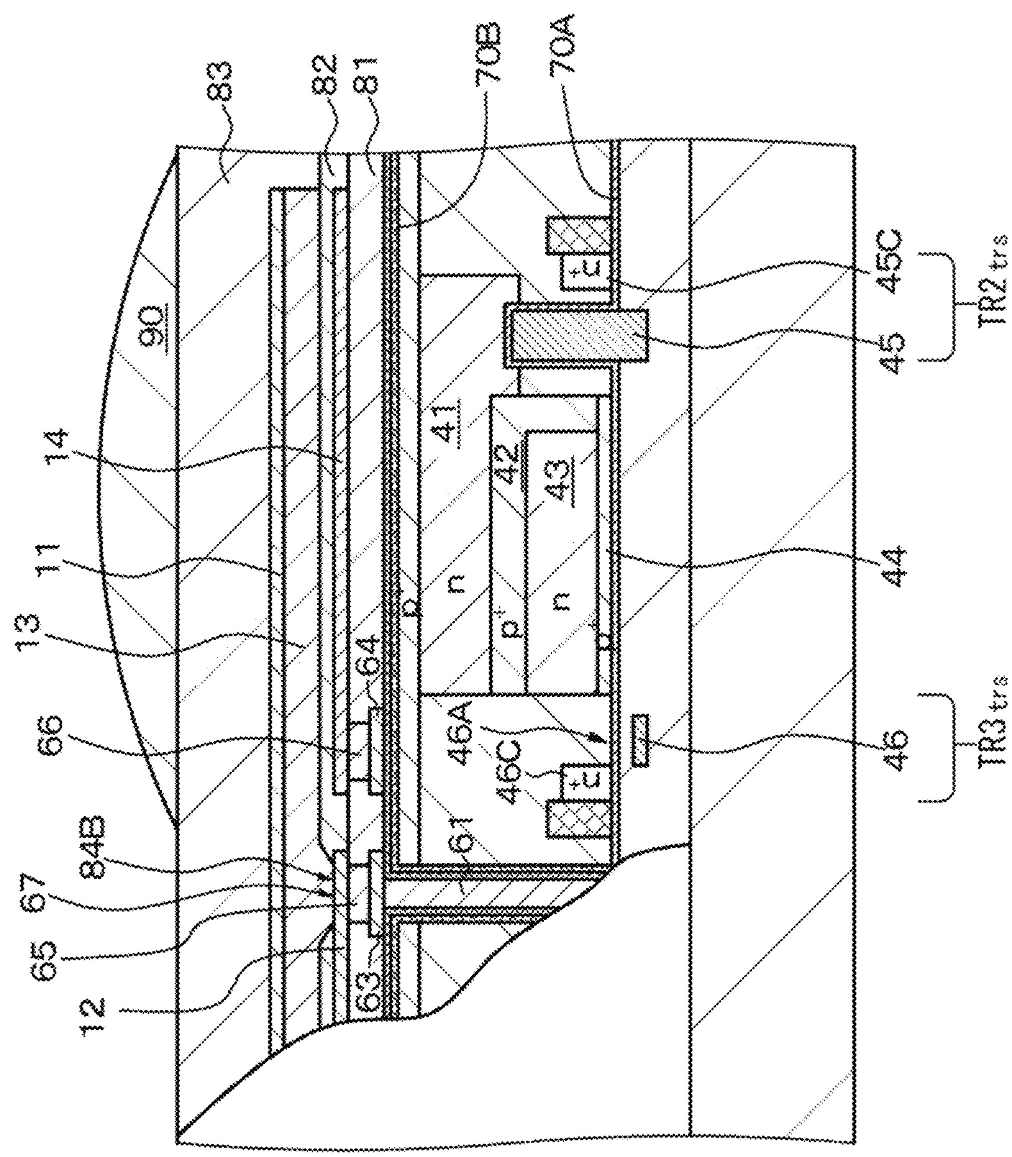
FIG. 52 is a schematic partial cross-sectional view of yet another modification of the imaging element or the stacked imaging element of the seventh embodiment.
Figure 53A:
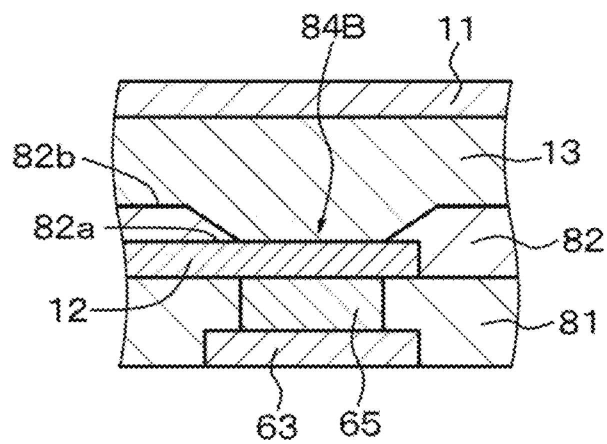
FIGS. 53A, 53B, and 53C are enlarged, schematic, partial cross-sectional views of portions of a second electrode and the like of yet another modification of the imaging element or the stacked imaging element of the seventh embodiment.
Figure 53B:
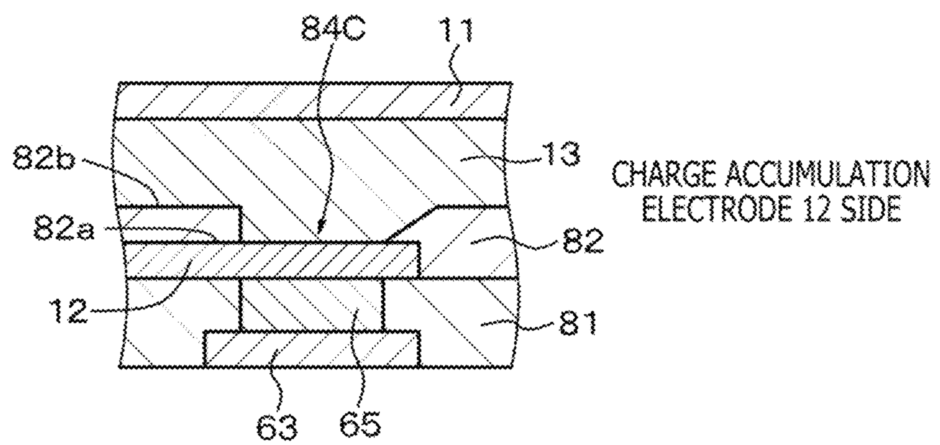
Figure 53C:
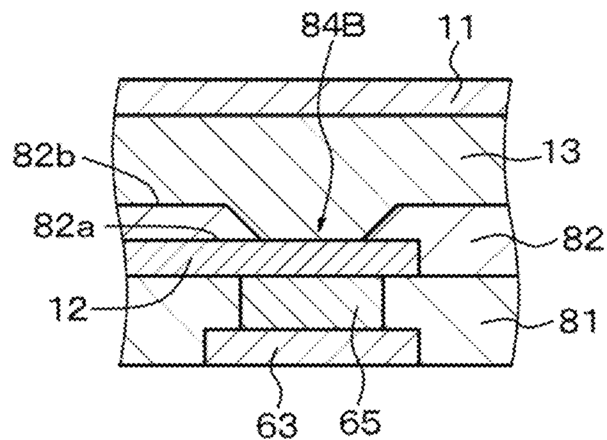

Alternatively, as, for example, FIG. 52 depicts the modification of the imaging element or the stacked imaging element described in the seventh embodiment and FIG. 53A depicts the enlarged, schematic, partial cross-sectional view of portions of the second electrode and the like, an edge portion of the top surface of the second electrode 12 is covered with the insulating film 82 and the second electrode 12 is exposed to a bottom surface of the opening portion 84B. When it is assumed that a surface of the insulating film 82 adjoining the top surface of the second electrode 12 is a first surface 82*a* and a surface of the insulating film 82 adjoining a portion of the photoelectric conversion layer 13 opposed to the charge accumulation electrode 14 is a second surface 82*b*, a side surface of the opening portion 84B has an inclination spreading from the first surface 82*a* to the second surface 82*b*. Giving the inclination to the side surface of the opening portion 84B in this way makes smoother the movement of charges from the photoelectric conversion layer 13 to the second electrode 12. While the side surface of the opening portion 84B is rotationally symmetric about an axis of the opening portion 84B in the example depicted in FIG. 53A, an opening portion 84C may be provided so that a side surface thereof having an inclination spreading from the first surface 82*a* to the second surface 82*b* is located closer to the charge accumulation electrode 14 as depicted in FIG. 53B. This makes it difficult the movement of charges from a portion of the photoelectric conversion layer 13 opposite to the charge accumulation electrode 14 across the opening portion 84C. Furthermore, while the side surface of the opening portion 84B has the inclination spreading from the first surface 82*a* to the second surface 82*b*, an edge portion of the side surface of the opening portion 84B on the second surface 82*b* may be located either outward of the edge portion of the second electrode 12 as depicted in FIG. 53A or inward of the edge portion of the second electrode 12 as depicted in FIG. 53C. Adopting the former configuration can further facilitate charge transfer, while adopting the latter configuration can reduce variations in shape at a time of forming the opening portion.

These opening portions 84B and 84C can be formed by giving an inclination to an etching mask including a resist material and formed when an opening portion in the insulating film on the basis of an etching method by subjecting the etching mask to reflowing, and by etching the insulating film 82 using this etching mask.

Figure 54:
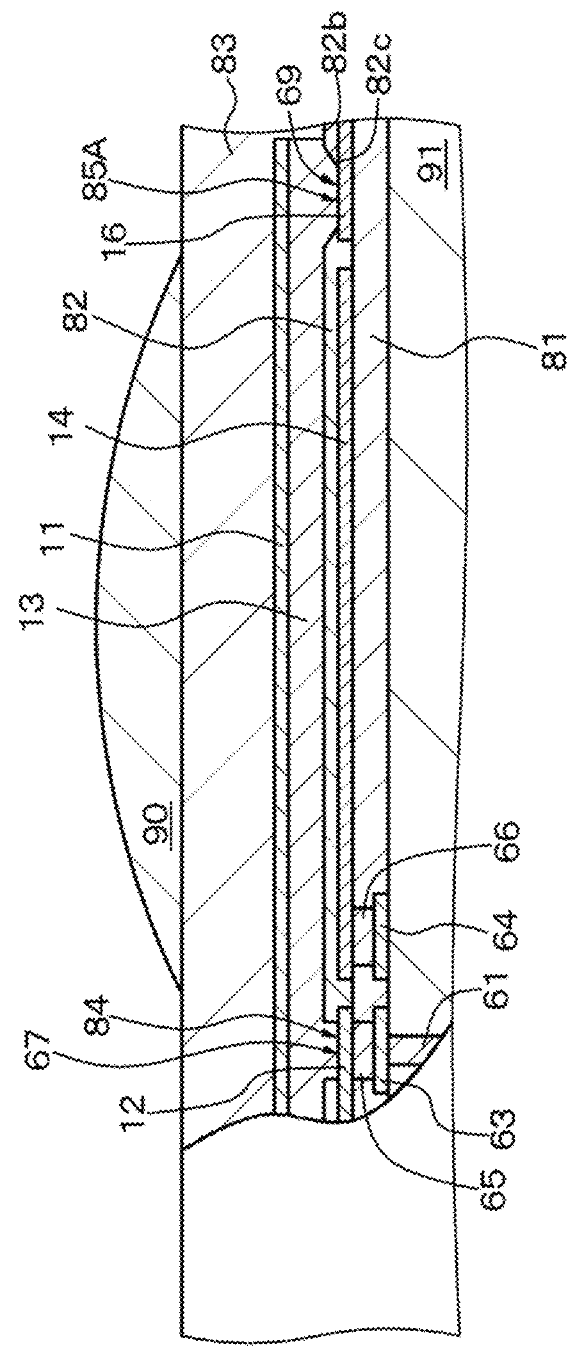
FIG. 54 is an enlarged, schematic, partial cross-sectional view of portions of a charge emitting electrode and the like of another modification of the imaging element or the stacked imaging element of the eleventh embodiment.

Alternatively, in respect to the charge emitting electrode 16 described in the eleventh embodiment, as depicted in FIG. 54, the photoelectric conversion layer 13 extends within the second opening portion 85A provided in the insulating film 82 and is connected to the charge emitting electrode 16, an edge portion of a top surface of the charge emitting electrode 16 is covered with the insulating film 82, and the charge emitting electrode 16 is exposed to a bottom surface of the second opening portion 85A. In addition, when it is assumed that a surface of the insulating film 82 adjoining the top surface of the charge emitting electrode 16 is a third surface 82*c* and the surface of the insulating film 82 adjoining the portion of the photoelectric conversion layer 13 opposed to the charge accumulation electrode 14 is the second surface 82*b*, a side surface of the second opening portion 85A has an inclination spreading from the third surface 82*c* to the second surface 82*b*.

Figure 55:
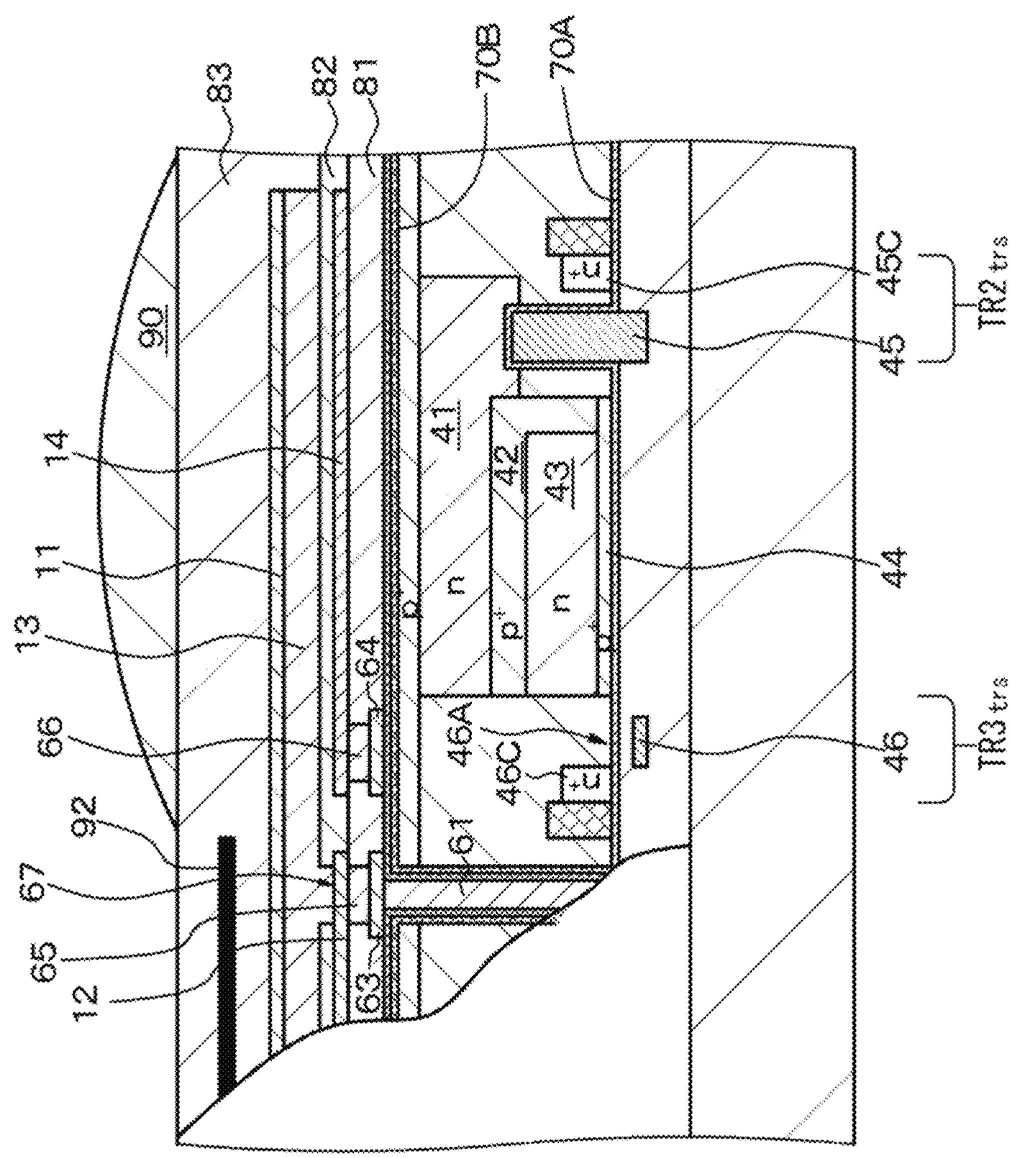
FIG. 55 is a schematic partial cross-sectional view of still another modification of the imaging element or the stacked imaging element of the seventh embodiment.

In addition, as depicted in, for example, FIG. 55 that depicts the modification of the imaging element or the stacked imaging element described in the seventh embodiment, the imaging element or the stacked imaging element can be configured such that light is incident from the first electrode 11 side and a light shielding layer 92 is formed on a light incidence side closer to the first electrode 11. It is noted that various interconnections provided closer to the light incidence side than the photoelectric conversion layer can function as the light shielding layer.

Figure 56:
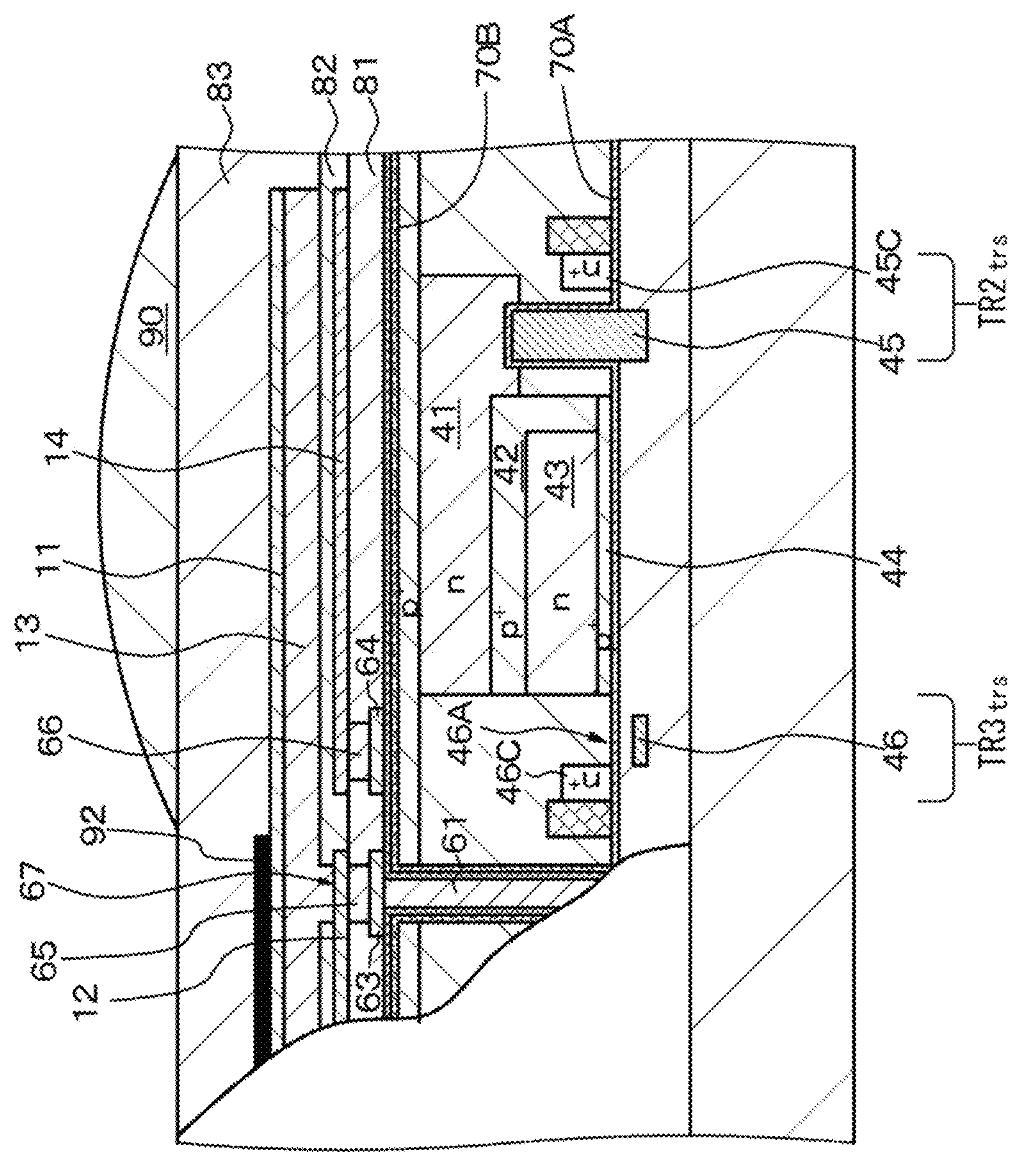
FIG. 56 is a schematic partial cross-sectional view of still another modification of the imaging element or the stacked imaging element of the seventh embodiment.
Figure 57:
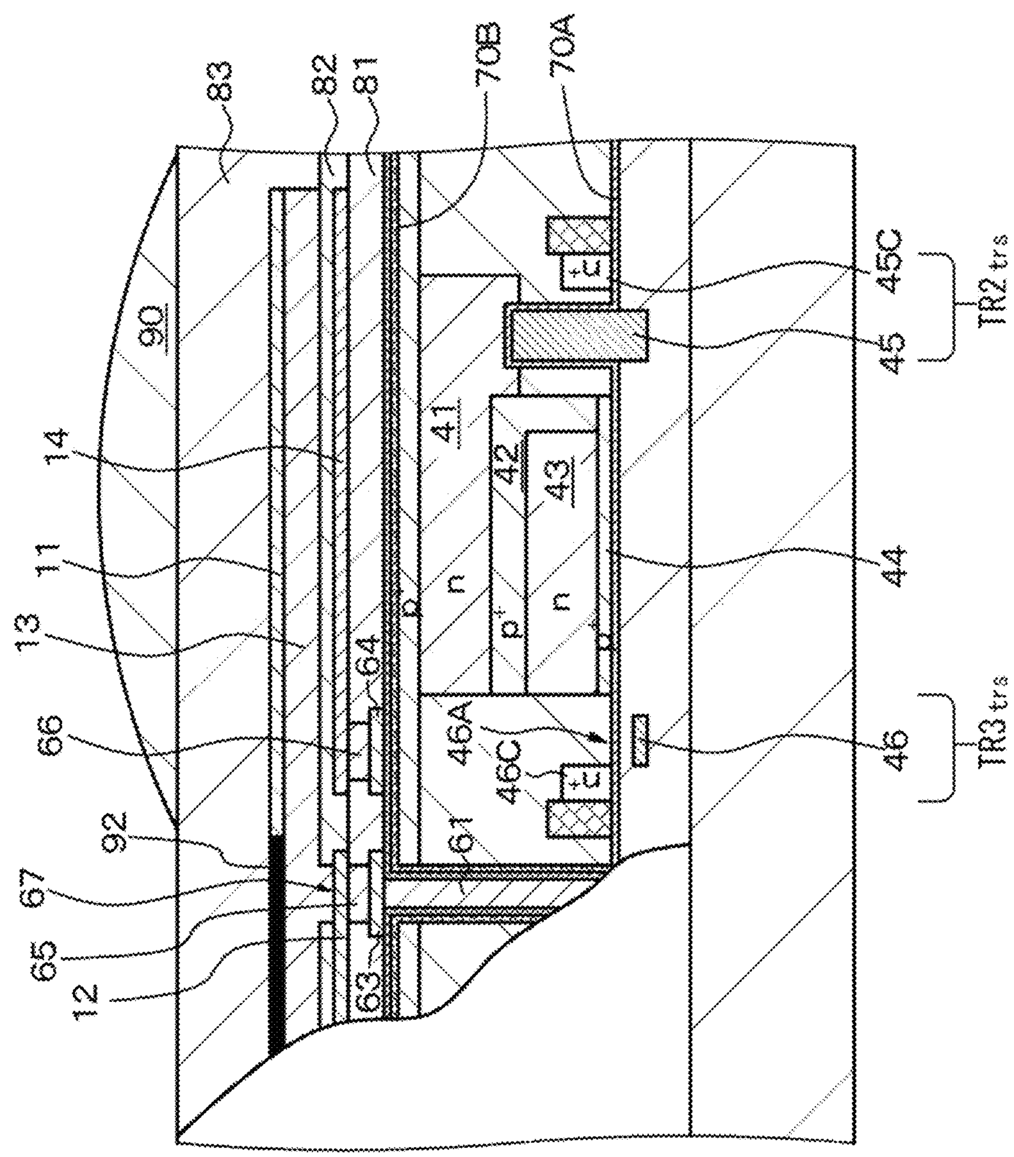
FIG. 57 is a schematic partial cross-sectional view of still another modification of the imaging element or the stacked imaging element of the seventh embodiment.

While the light shielding layer 92 is formed above the first electrode 11, that is, the light shielding layer 92 is formed on the light incidence side closer to the first electrode 11 and above the second electrode 12 in the example depicted in FIG. 55, the light shielding layer 92 may be provided on the light incidence side surface of the first electrode 11 as depicted in FIG. 56. Alternatively, the light shielding layer 92 may be formed in the first electrode 11 as depicted in FIG. 57 according to circumstances.

Figure 58:
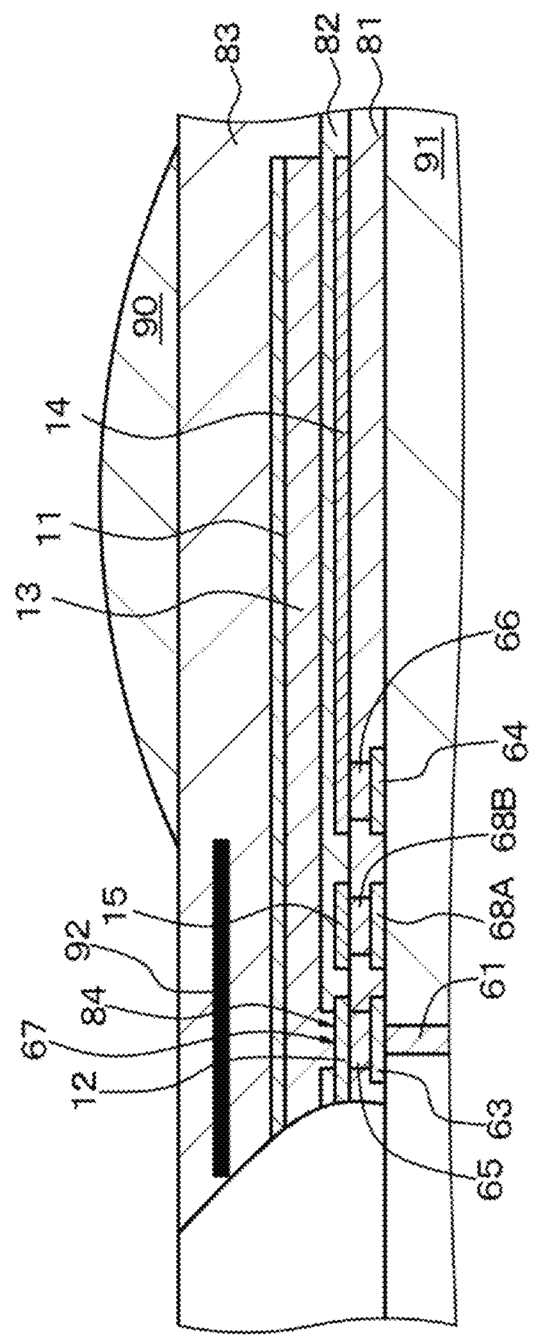
FIG. 58 is a schematic partial cross-sectional view of yet another modification of the imaging element or the stacked imaging element of the tenth embodiment.
Figure 59:
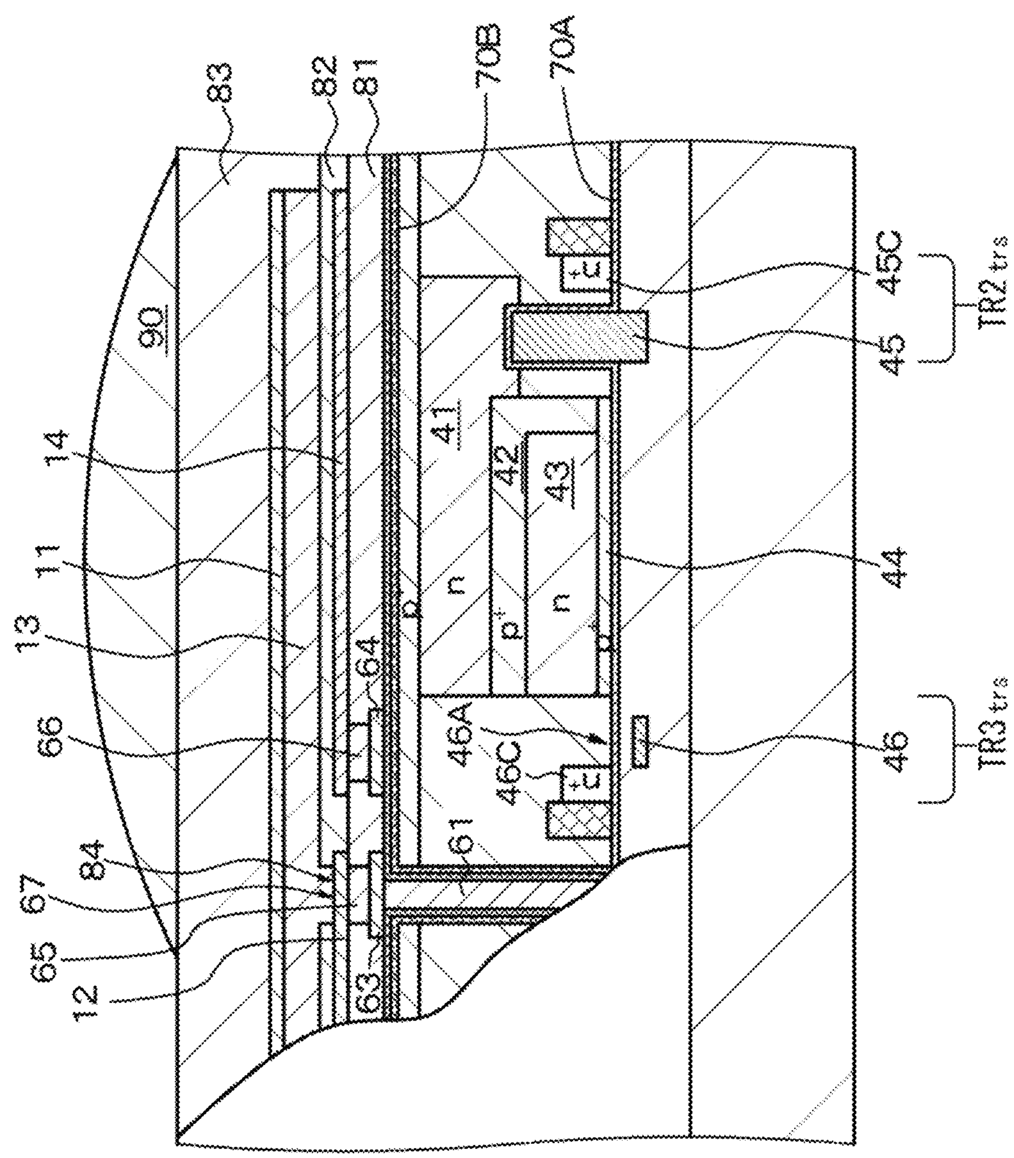
FIG. 59 is a schematic partial cross-sectional view of still another modification of the imaging element or the stacked imaging element of the seventh embodiment.

Alternatively, the imaging element or the stacked imaging element can be structured such that light is incident from the first electrode 11 side and light is not incident on the second electrode 12. Specifically, as depicted in FIG. 55, the light shielding layer 92 is formed on the light incidence side closer to the first electrode 11 and above the second electrode 12. Alternatively, as depicted in FIG. 59, the imaging element or the stacked imaging element can be structured such that the on-chip microlens 90 is provided above the charge accumulation electrode 14 and the first electrode 11, and light incident on the on-chip microlens 90 is concentrated onto the charge accumulation electrode 14 and does not reach the second electrode 12. In a case in which the transfer control electrode 15 is provided as described in the tenth embodiment, the imaging element or the stacked imaging element can be formed such that light is not incident on the second electrode 12 and the transfer control electrode 15. Specifically, as depicted in FIG. 58, the imaging element or the stacked imaging element can be structured such that the light shielding layer 92 is formed above the second electrode 12 and the transfer control electrode 15. Alternatively, the imaging element or the stacked imaging element can be structured such that the light incident on the on-chip microlens 90 does not reach the second electrode 12 and the transfer control electrode 15.

By adopting any of these configurations and structures, or providing the light shielding layer 92 or designing the on-chip microlens 90 so that the light is incident only on a portion of the photoelectric conversion layer 13 located above the charge accumulation electrode 14, the portion of the photoelectric conversion layer 13 located above the second electrode 12 (or above the second electrode 12 and the transfer control electrode 15) does not contribute to the photoelectric conversion; thus, it is possible to more reliably reset all pixels simultaneously and more easily realize a global shutter function. In other words, in a method of driving a solid-state imaging device having a plurality of imaging element having any of these configurations and structures repeats steps of:

simultaneously emitting charges in the second electrode 12 to an outside while accumulating the charges in the photoelectric conversion layer 13 in all the imaging elements; and then simultaneously transferring the charges accumulated in the photoelectric conversion layer 13 to the second electrode 12 in all the imaging elements, and sequentially reading the charges transferred to the second electrode 12 in each of the imaging elements after completion of transfer.

In addition, the imaging element or the stacked imaging element can be structured such that such a light shielding layer 92 prevents the light from being incident on the various transistors (particularly, channel formation regions) formed above the semiconductor layer, or structured such that the light incident on the on-chip microlens 90 does not reach the various transistors (particularly, channel formation regions). Furthermore, this make it possible to achieve stabilization of operations of the various transistors formed above the semiconductor layer.

Figure 60:
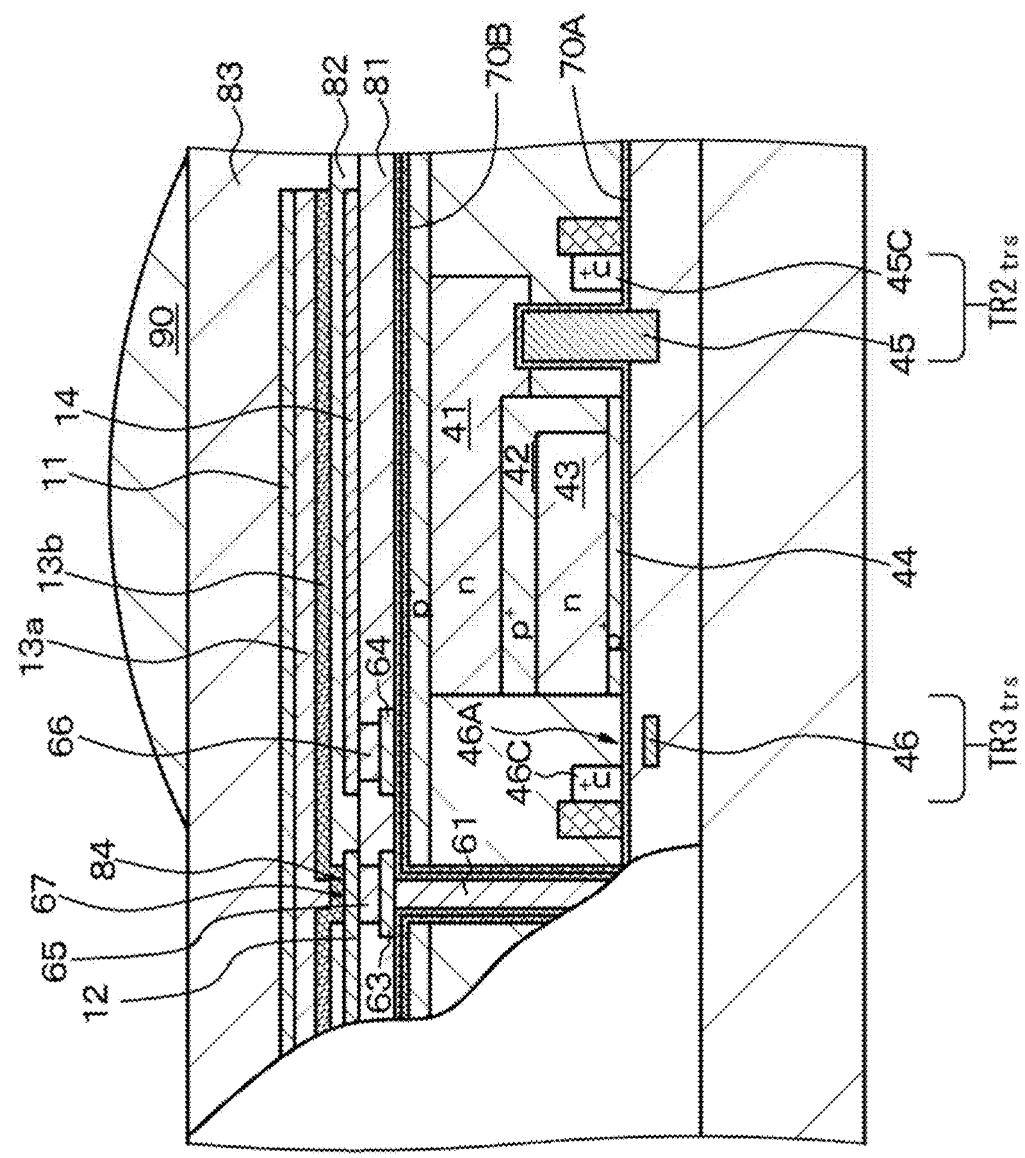
FIG. 60 is a schematic partial cross-sectional view of still another modification of the imaging element or the stacked imaging element of the seventh embodiment.
Figure 61:
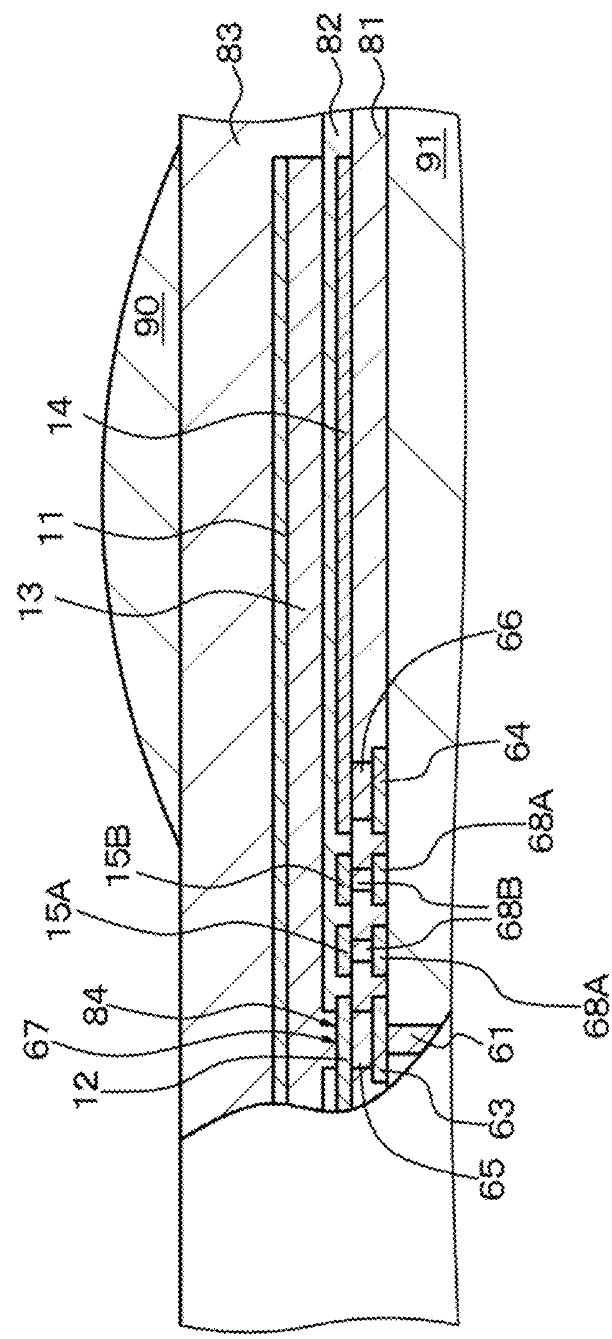
FIG. 61 is a schematic partial cross-sectional view of still another modification of the imaging element or the stacked imaging element of the tenth embodiment.
Figure 62:
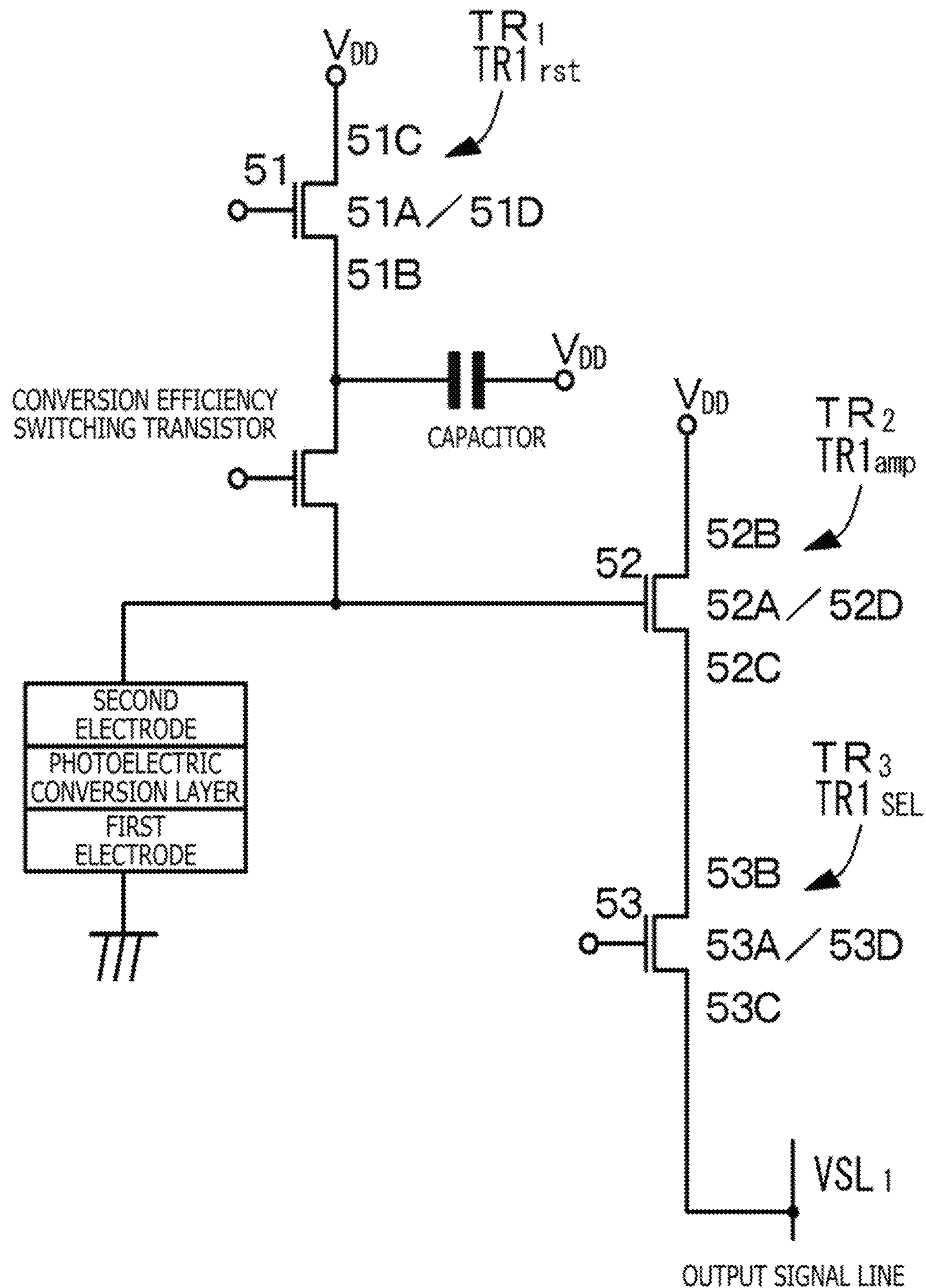
FIG. 62 is an equivalent circuit diagram of the imaging element of the present disclosure having a conversion efficiency switching transistor.

The imaging element or the stacking imaging element is not limited to the configuration with one photoelectric conversion layer. As depicted, for example, in FIG. 60 that depicts the modification of the imaging element or the stacked imaging element described in the seventh embodiment, the photoelectric conversion layer 13 can be formed into the stacked structure of a lower semiconductor layer 13*a* including, for example, IGZO and an upper photoelectric conversion layer 13*b* including the material configuring the photoelectric conversion layer 13 described in the seventh embodiment. Providing the lower semiconductor layer 13*a* in this way makes it possible to prevent recombination during charge accumulation, to increase transfer efficiency for transferring the charges accumulated in the photoelectric conversion layer 13 to the second electrode 12, and to suppress the generation of a dark current. In addition, as depicted in FIG. 62 as a modification of the tenth embodiment, a plurality of transfer control electrodes may be provided from a position closest to the second electrode 12 toward the charge accumulation electrode 14. It is noted that FIG. 61 depicts an example of providing two transfer control electrodes 15A and 15B.

Figure 63:
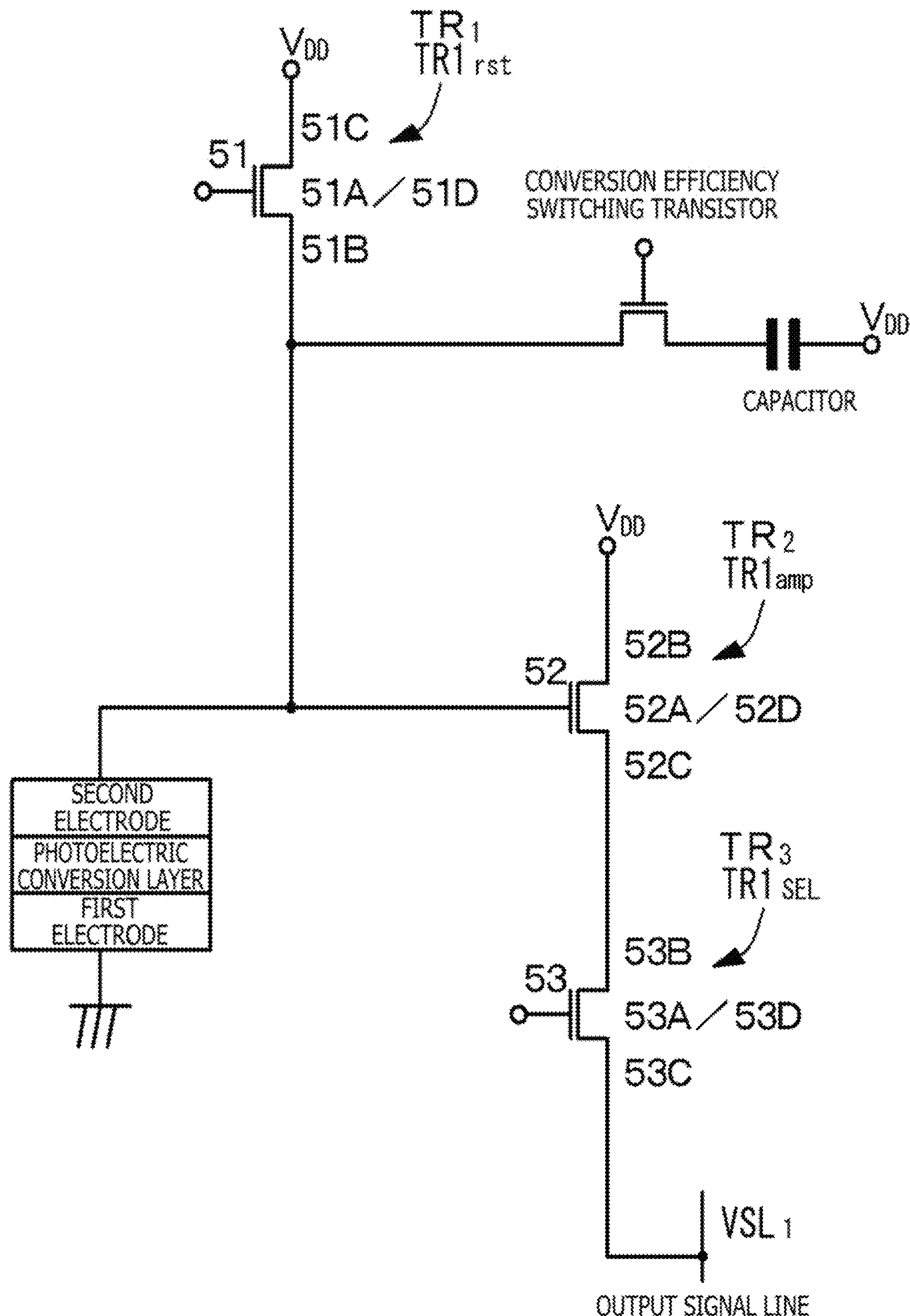
FIG. 63 is an equivalent circuit diagram of the imaging element of the present disclosure having the conversion efficiency switching transistor.

As depicted in FIGS. 62 and 63 that are equivalent circuit diagrams, the imaging element of the present disclosure may have a conversion efficiency switching transistor.

Needless to say, various modifications described above can be also applicable to the embodiments other than the seventh embodiment.

While it is assumed in the embodiments that electrons are signal charges and a conduction type of the photoelectric conversion layer formed on the semiconductor substrate is n-type, the imaging element or the stacked imaging element of the present disclosure is also applicable to a solid-state imaging device using holes as signal charges. In this case, each semiconductor region is only required to be configured with a semiconductor region of an opposite conduction type and the conduction type of the photoelectric conversion layer formed on the semiconductor substrate may be p-type.

Moreover, while the present disclosure has been described in the embodiments taking, by way of example, a case of applying the imaging element or the stacked imaging element of the present disclosure to a CMOS solid-state imaging device formed by disposing unit pixels each detecting a signal charge in response to an amount of incident light as a physical quantity in a matrix, the application of the imaging element or the stacked imaging element of the present disclosure is not limited to the CMOS solid-state imaging device and the imaging element or the stacked imaging element of the present disclosure is also applicable to a CCD solid-state imaging device. In the latter case, the signal charge is transferred by a vertical transfer register of a CCD structure in the perpendicular direction, transferred by a horizontal transfer register in the horizontal direction, and amplified, thereby outputting a pixel signal (image signal). Furthermore, the imaging element or the stacked imaging element of the present disclosure is not limited to a general column scheme solid-state imaging device formed by forming pixels in a two-dimensional matrix and arranging a column signal processing circuit per pixel column. Moreover, the selection transistor can be omitted according to circumstances.

Furthermore, the imaging element or the stacked imaging element of the present disclosure is not limited to the solid-state imaging device that detects a distribution of an amount of incident visible light and that captures the distribution as an image and is also applicable to a solid-state imaging device that captures an image of a distribution of an amount of incident infrared rays, x-rays, or particles. Moreover, in a broad sense, the imaging element or the stacked imaging element of the present disclosure is applicable to a general solid-state imaging device (physical quantity distribution sensing device), such as a fingerprint detection sensor, that senses a distribution of the other physical quantity such as a pressure and an electrostatic capacitance and that captures an image of the distribution.

Furthermore, the imaging element or the stacked imaging element of the present disclosure is not limited to the solid-state imaging device that sequentially scans unit pixels in an imaging region in units of rows and that reads a pixel signal from each unit pixel. The imaging element or the stacked imaging element of the present disclosure is also applicable to an X-Y address-type solid-state imaging device that selects an arbitrary pixel in units of pixels and that reads a pixel signal in units of pixels from the selected pixel. The solid-state imaging device may be formed as one chip, or may be formed as a module having an imaging function obtained by collectively packaging an imaging region and a drive circuit or an optical system.

Moreover, the application of the imaging element or the stacked imaging element of the present disclosure is not limited to the solid-state imaging device and the imaging element or the stacked imaging element of the present disclosure is also applicable to an imaging device. The imaging device refers herein to a camera system such as a digital still camera or a video camera or an electronic apparatus having an imaging function such as a cellular telephone. A form of a module mounted in an electronic apparatus, that is, a camera module is often handled as the imaging device.

Figure 64:
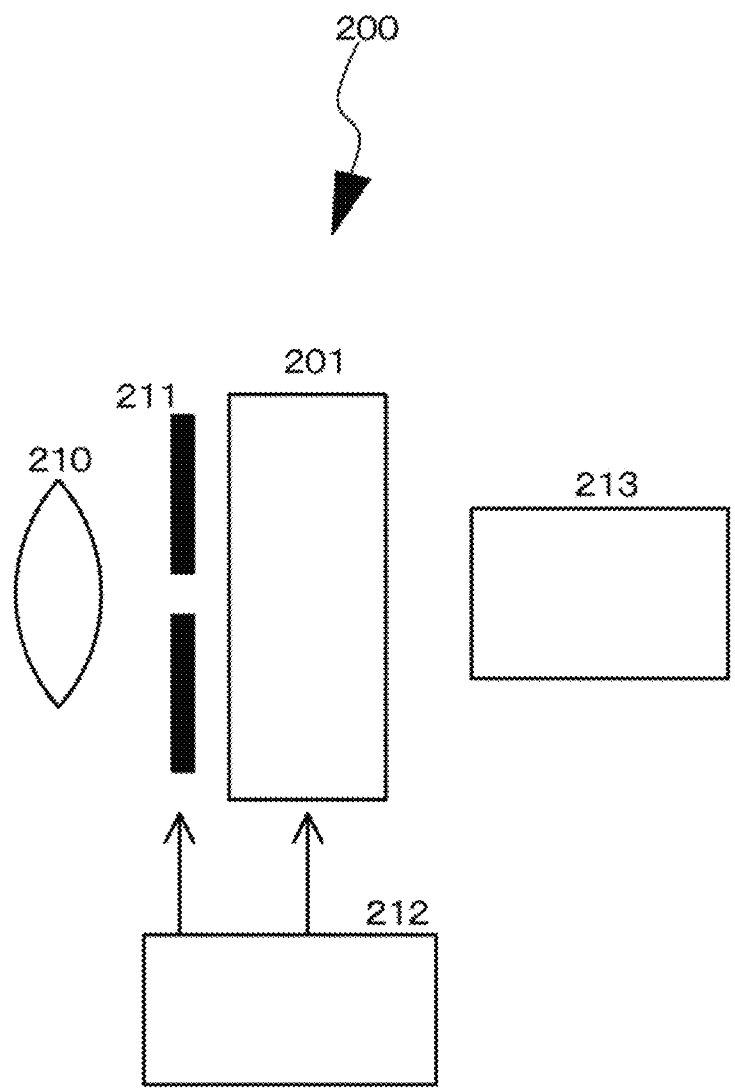
FIG. 64 is a conceptual diagram of an example of using a solid-state imaging device configured from the imaging element or the stacked imaging element of the present disclosure in an electronic apparatus (camera).

FIG. 64 depicts an example of using a solid-state imaging device 201 configured from the imaging element or the stacked imaging element of the present disclosure in an electronic apparatus (camera) 200 as a conceptual diagram. The electronic apparatus 200 has the solid-state imaging device 201, an optical lens 210, a shutter device 211, a drive circuit 212, and a signal processing circuit 213. The optical lens 210 forms image light (incident light) from a subject onto an imaging surface of the solid-state imaging device 201. Signal charges are thereby accumulated in the solid-state imaging device 201 for a certain period. The shutter device 211 controls a light irradiation period and a light shielding period for the solid-state imaging device 201. The drive circuit 212 supplies drive signals for controlling a transfer operation and the like of the solid-state imaging device 201 and a shutter operation of the shutter device 211. The solid-state imaging device 201 performs signal transfer by the drive signal (timing signals) supplied from the drive circuit 212. The signal processing circuit 213 performs various signal processes. A signal-processed video picture signal is stored in a storage medium such as a memory or output to a monitor. The solid-state imaging device 201 in such an electronic apparatus 200 can achieve miniaturization of a pixel size and improvement in transfer efficiency; thus, it is possible to obtain the electronic apparatus 200 capable of achieving improvement in pixel characteristics. The electronic apparatus 200 to which the solid-state imaging device 201 is applicable is not limited to the camera and the solid-state imaging device 201 is also applicable to an imaging device such as a digital still camera or a camera module for a mobile apparatus such as a cellular telephone.

It is noted that the present disclosure can be configured as follows.

[A01] <<Imaging Element . . . First Aspect>>

An imaging element having:

at least a photoelectric conversion section; a first transistor; and a second transistor, in which the photoelectric conversion section includes a photoelectric conversion layer that has a first surface and a second surface opposed to the first surface and on which light is incident from a first surface side;

a first electrode that is provided to adjoin the first surface of the photoelectric conversion layer; and a second electrode that is provided to adjoin the second surface of the photoelectric conversion layer, the imaging element further has a first photoelectric conversion layer extension section that extends from the photoelectric conversion layer;

a third electrode that is formed to be opposed to a second surface of the first photoelectric conversion layer extension section via an insulating film, the second surface of the first photoelectric conversion layer extension section being on a same side as a side of the second surface of the photoelectric conversion layer; and a fourth electrode that is provided to adjoin the second surface of the first photoelectric conversion layer extension section, the first transistor includes the second electrode that functions as one source/drain section, the third electrode that functions as a gate section, the fourth electrode that functions as other source/drain section and that is connected to a power supply section, and the first photoelectric conversion layer extension section that functions as a channel formation region, a gate section of the second transistor is connected to the second electrode, and one source/drain section of the second transistor is connected to the power supply section.

[A02] The imaging element according to [A01], further having:

a third transistor, in which one source/drain section of the third transistor is connected to other source/drain section of the second transistor, and other source/drain section of the third transistor is connected to a signal line.

[A03] The imaging element according to [A01] or [A02], in which the photoelectric conversion layer includes an organic photoelectric conversion material.

[A04] The imaging element according to [A01] or [A02], in which at least the first photoelectric conversion layer extension section has a stacked structure of a lower semiconductor layer and an upper photoelectric conversion layer from a second surface side.

[A05] The imaging element according to [A04], in which the photoelectric conversion section and the first photoelectric conversion layer extension section have the stacked structure of the lower semiconductor layer and the upper photoelectric conversion layer from the second surface side.

[A06] The imaging element according to [A04] or [A05], in which a semiconductor material configuring the lower semiconductor layer has band gap energy equal to or higher than 3.0 eV.

[A07] The imaging element according to any one of [A01] to [A06], in which a thickness of part of the first photoelectric conversion layer extension section is smaller than a thickness of the photoelectric conversion layer.

[A08] The imaging element according to any one of [A02] and [A03] to [A07] according to [A02], further having:

a semiconductor layer, in which the second transistor and the third transistor are formed in the semiconductor layer, the photoelectric conversion section and the first transistor are formed above the semiconductor layer, and the gate section of the second transistor is connected to the second electrode via a first contact hole section.

[A09] The imaging element according to [A08], further having:

a second photoelectric conversion layer extension section that extends from the photoelectric conversion layer;

a second electrode extension section that is formed on a second surface of the second photoelectric conversion layer extension section via the insulating film, the second surface of the second photoelectric conversion layer extension section being on the same side as the side of the second surface of the photoelectric conversion layer; and a fifth electrode and a sixth electrode that are provided to adjoin the second surface of the second photoelectric conversion layer extension section, in which the second transistor is formed above the semiconductor layer instead of being formed in the semiconductor layer, the gate section of the second transistor is configured from the second electrode extension section instead of being connected to the second electrode, the one source/drain section of the second transistor is configured from the fifth electrode, and the other source/drain section of the second transistor is configured from the sixth electrode and connected to the one source/drain section of the third transistor via a second contact hole section.

[A10] The imaging element according to [A09], in which the second photoelectric conversion layer extension section has a stacked structure of a lower semiconductor layer and an upper photoelectric conversion layer from a second surface side.

[A11] The imaging element according to [A09] or [A10], further having:

a third photoelectric conversion layer extension section that extends from the photoelectric conversion layer;

a seventh electrode that is formed to be opposed to a second surface of the third photoelectric conversion layer extension section via the insulating film, the second surface of the third photoelectric conversion layer extension section being on the same side as the side of the second surface of the photoelectric conversion layer; and an eighth electrode that is provided to adjoin the second surface of the third photoelectric conversion layer extension section, in which the third transistor is formed above the semiconductor layer instead of being formed in the semiconductor layer, the one source/drain section of the third transistor is commonly configured from the sixth electrode instead of being connected to the sixth electrode via the second contact hole section, a gate section of the third transistor is configured from the seventh electrode, and the other source/drain section of the third transistor is configured from the eighth electrode and connected to the signal line via a third contact hole section.

[A12] The imaging element according to [A11], in which the third photoelectric conversion layer extension section has a stacked structure of a lower semiconductor layer and an upper photoelectric conversion layer from a second surface side.

[A13]<<Imaging Element . . . Second Aspect>>

An imaging element having:

at least a photoelectric conversion section; a second transistor; and a third transistor, in which the photoelectric conversion section includes

- a photoelectric conversion layer that has a first surface and a second surface opposed to the first surface and on which light is incident from a first surface side;
- a first electrode that is provided to adjoin the first surface of the photoelectric conversion layer; and
- a second electrode that is provided to adjoin the second surface of the photoelectric conversion layer, the imaging element further has

- a first photoelectric conversion layer extension section that extends from the photoelectric conversion layer;
- a second electrode extension section that is formed on a second surface of the first photoelectric conversion layer extension section via an insulating film, the second surface of the first photoelectric conversion layer extension section being on a same side as a side of the second surface of the photoelectric conversion layer; and
- a third electrode and a fourth electrode that are provided to adjoin the second surface of the first photoelectric conversion layer extension section, the second transistor includes the third electrode that functions as one source/drain section and that is connected to a power supply section, the second electrode extension section that functions as a gate section, the fourth electrode that functions as other source/drain section, and the first photoelectric conversion layer extension section that functions as a channel formation region, one source/drain section of the third transistor is connected to the fourth electrode, and other source/drain section of the third transistor is connected to a signal line.

[A14] The imaging element according to [A13], further having:

a first transistor, in which one source/drain section of the first transistor is connected to the second electrode, and other source/drain section of the first transistor is connected to the power supply section.

[A15] The imaging element according to [A14], further having:

a semiconductor layer, in which the first transistor and the third transistor are formed in the semiconductor layer, the photoelectric conversion section and the second transistor are formed above the semiconductor layer, the one source/drain section of the first transistor is connected to the second electrode via a first contact hole section, and the one source/drain section of the third transistor is connected to the fourth electrode via a second contact hole section.

[A16] The imaging element according to [A15], further having:

a second photoelectric conversion layer extension section that extends from the photoelectric conversion layer;

a fifth electrode that is formed to be opposed to a second surface of the second photoelectric conversion layer extension section via the insulating film, the second surface of the second photoelectric conversion layer extension section being on the same side as the side of the second surface of the photoelectric conversion layer; and a sixth electrode that is provided to adjoin the second surface of the second photoelectric conversion layer extension section, in which the third transistor is formed above the semiconductor layer instead of being formed in the semiconductor layer, the one source/drain section of the third transistor is commonly configured from the fourth electrode instead of being connected to the fourth electrode via the second contact hole section, a gate section of the third transistor is configured from the fifth electrode, and the other source/drain section of the third transistor is configured from the sixth electrode and connected to the signal line via a third contact hole section.

[A17]<<Imaging Element . . . Third Aspect>>

An imaging element having:

at least a photoelectric conversion section; a second transistor; and a third transistor, in which the photoelectric conversion section includes

- a photoelectric conversion layer that has a first surface and a second surface opposed to the first surface and on which light is incident from a first surface side;
- a first electrode that is provided to adjoin the first surface of the photoelectric conversion layer; and
- a second electrode that is provided to adjoin the second surface of the photoelectric conversion layer, the imaging element further has

- a channel formation region that is configured from a same material as a material of the photoelectric conversion layer and that is provided to be apart from the photoelectric conversion layer;
- a fourth electrode that is formed on a surface of the channel formation region via an insulating film, the surface of the channel formation region being on a same side as a side of the second surface of the photoelectric conversion layer; and
- a third electrode and a fifth electrode that are provided to adjoin a surface of a channel formation region extension section that is on the same side as the side of the second surface of the photoelectric conversion layer, a gate section of the second transistor is connected to the second electrode, and one source/drain section of the second transistor is connected to a power supply section, other source/drain section of the second transistor is connected to the third electrode that configures one source/drain section of the third transistor, a gate section of the third transistor is configured from the fourth electrode, and the fifth electrode that configures other source/drain section of the third transistor is connected to a signal line.

[A18] The imaging element according to [A17], further having:

a first transistor, in which one source/drain section of the first transistor is connected to the second electrode, and other source/drain section of the first transistor is connected to the power supply section.

[A19] The imaging element according to [A18], further having:

a semiconductor layer, in which the first transistor and the second transistor are formed in the semiconductor layer, the photoelectric conversion section and the third transistor are formed above the semiconductor layer, the one source/drain section of the first transistor and the gate section of the second transistor are connected to the second electrode via a first contact hole section, the other source/drain section of the second transistor is connected to the third electrode via a second contact hole section, and the other source/drain section of the third transistor is connected to the signal line via a third contact hole section.

[A20] The imaging element according to any one of [A01] to [A19], in which light is incident from the first electrode side, and a light shielding layer is formed on a light incidence side closer to the first electrode.

[A21] The imaging element according to [A20], in which the light is incident from the first electrode side, and the light is not incident at least on a channel formation region of the transistor formed above the semiconductor layer.

[A22] The imaging element according to [A21], in which a light shielding layer is formed on the light incidence side closer to the first electrode and at least above the channel formation region of the transistor formed above the semiconductor layer.

[A23] The imaging element according to any one of [A01] to [A19], in which an on-chip microlens is provided above the second electrode, and light incident on the on-chip microlens is not incident at least on a channel formation region of the transistor formed above the semiconductor layer.

[B01] The imaging element according to any one of [A01] to [A23], in which the photoelectric conversion section further has a charge accumulation electrode that is disposed apart from the second electrode and that is disposed to be opposed to the photoelectric conversion layer via the insulating film.

[B02] The imaging element according to [B01], in which the second electrode extends within an opening portion provided in the insulating film and is connected to the photoelectric conversion layer.

[B03] The imaging element according to [B01], in which the photoelectric conversion layer extends within the opening portion provided in the insulating film and is connected to the second electrode.

[B04] The imaging element according to [B03], in which an edge portion of a top surface of the second electrode is covered with the insulating film, the second electrode is exposed to a bottom surface of the opening portion, and when it is assumed that a surface of the insulating film adjoining the top surface of the second electrode is a first surface and a surface of the insulating film adjoining a portion of the photoelectric conversion layer opposed to the charge accumulation electrode is a second surface, a side surface of the opening portion has an inclination spreading from the first surface to the second surface.

[B05] The imaging element according to [B04], in which the side surface of the opening portion having the inclination spreading from the first surface to the second surface is located closer to the charge accumulation electrode.

[B06] The imaging element according to any one of [B01] to [B05], further having:

a control section that is provided in the semiconductor layer and that has a drive circuit, in which the second electrode and the charge accumulation electrode are connected to the drive circuit, a potential $V_{11}$ is applied from the drive circuit to the second electrode, a potential $V_{12}$ is applied therefrom to the charge accumulation electrode, and charges are accumulated in the photoelectric conversion layer in a charge accumulation period, and a potential $V_{21}$ is applied from the drive circuit to the second electrode, a potential $V_{22}$ is applied therefrom to the charge accumulation electrode, and the charges accumulated in the photoelectric conversion layer are read to the control section by way of the second electrode in a charge transfer period.

It is noted that in a case in which the potential of the second electrode is higher than a potential of the first electrode, $$V_{12} \geq V_{11} \text{ and } V_{22} < V_{21}, \text{ and}$$

in a case in which the potential of the second electrode is lower than a potential of the first electrode, $$V_{12} \leq V_{11} \text{ and } V_{22} > V_{21}.$$

[B07] The imaging element according to any one of [B01] to [B06], further having:

a transfer control electrode that is disposed between the second electrode and the charge accumulation electrode to be apart from the second electrode and the charge accumulation electrode and that is disposed to be opposed to the photoelectric conversion layer via the insulating layer.

[B08] The imaging element according to [B07], further having:

a control section that is provided in the semiconductor layer and that has a drive circuit, in which the second electrode, the charge accumulation electrode, and the transfer control electrode are connected to the drive circuit, a potential $V_{11}$ is applied from the drive circuit to the second electrode, a potential $V_{12}$ is applied therefrom to the charge accumulation electrode, and a potential $V_{13}$ is applied to the transfer control electrode in a charge accumulation period, and charges are accumulated in the photoelectric conversion layer, and a potential $V_{21}$ is applied from the drive circuit to the second electrode, a potential $V_{22}$ is applied therefrom to the charge accumulation electrode, a potential $V_{23}$ is applied to the transfer control electrode, and the charges accumulated in the photoelectric conversion layer are read to the control section via the second electrode in a charge transfer period.

It is noted that in a case in which the potential of the second electrode is higher than a potential of the first electrode, $$V_{12} > V_{13} \text{ and } V_{22} \leq V_{23} \leq V_{21}, \text{ and}$$

in a case in which the potential of the second electrode is lower than the potential of the first electrode, $$V_{12} < V_{13} \text{ and } V_{22} \geq V_{23} \geq V_{21}.$$

[B09] The imaging element according to any one of [B01] to [B08], further having:

a charge emitting electrode that is connected to the photoelectric conversion layer and that is disposed to be apart from the second electrode and the charge accumulation electrode.

[B10] The imaging element according to [B09], in which the charge emitting electrode is disposed to surround at least the second electrode and the charge accumulation electrode.

[B11] The imaging element according to [B09] or [B10], in which the photoelectric conversion layer extends within a second opening portion provided in the insulating film and is connected to the charge emitting electrode, an edge portion of a top surface of the charge emitting electrode is covered with the insulating film, the charge emitting electrode is exposed to a bottom surface of the second opening portion, and when it is assumed that a surface of the insulating film adjoining the top surface of the charge emitting electrode is a third surface and a surface of the insulating film adjoining a portion of the photoelectric conversion layer opposed to the charge accumulation electrode is a second surface, a side surface of the second opening portion has an inclination spreading from the third surface to the second surface.

[B12] The imaging element according to any one of [B09] to [B11], further having:

a control section that is provided in the semiconductor layer and that has a drive circuit, in which the second electrode, the charge accumulation electrode, and the charge emitting electrode are connected to the drive circuit, a potential $V_{11}$ is applied from the drive circuit to the second electrode, a potential $V_{12}$ is applied therefrom to the charge accumulation electrode, a potential $V_{14}$ is applied therefrom to the charge emitting electrode, and charges are accumulated in the photoelectric conversion layer in a charge accumulation period, and a potential $V_{21}$ is applied from the drive circuit to the second electrode, a potential $V_{22}$ is applied therefrom to the charge accumulation electrode, a potential $V_{24}$ is applied therefrom to the charge emitting electrode, and the charges accumulated in the photoelectric conversion layer are read to the control section via the second electrode in a charge transfer period.

It is noted that in a case in which the potential of the second electrode is higher than a potential of the first electrode, $$V_{14}>V_{11} \text{ and } V_{24}<V_{21}, \text{ and}$$

in a case in which the potential of the second electrode is lower than the potential of the first electrode, $$V_{14}<V_{11} \text{ and } V_{24}>V_{21}.$$

[B13] The imaging element according to any one of [B01] to [B12], in which the charge accumulation electrode is configured from a plurality of charge accumulation electrode segments.

[B14] The imaging element according to [B13], in which in a case in which the potential of the second electrode is higher than the potential of the first electrode, a potential applied to the charge accumulation electrode segment located in a location closest to the second electrode is higher than a potential applied to the charge accumulation electrode segment located in a location farthest from the second electrode in the charge transfer period, and in a case in which the potential of the second electrode is lower than the potential of the first electrode, the potential applied to the charge accumulation electrode segment located in the location closest to the second electrode is lower than the potential applied to the charge accumulation electrode segment located in the location farthest from the second electrode in the charge transfer period.

[B15] The imaging element according to any one of [B01] to [B14], in which a magnitude of the charge accumulation electrode is larger than a magnitude of the second electrode.

[B16] The imaging element according to any one of [B01] to [B15], in which light is incident from the first electrode side, and a light shielding layer is formed on a light incidence side closer to the first electrode.

[B17] The imaging element according to any one of [B01] to [B15], in which light is incident from the first electrode side and the light is not incident on the second electrode.

[B18] The imaging element according to [B17], in which a light shielding layer is formed on a light incidence side closer to the first electrode and above the second electrode.

[B19] The imaging element according to [B17], in which an on-chip microlens is provided above the charge accumulation electrode and the first electrode, and light incident on the on-chip microlens is concentrated onto the charge accumulation electrode.

[C01]<<Stacked Imaging Element>>

A stacked imaging element having at least one of imaging elements according to any one of [A01] to [B19].

[D01]<<Solid-State Imaging Device . . . First Aspect>>

A solid-state imaging device having a plurality of imaging elements according to any one of [A01] to [B19].

[D02]<<Solid-State Imaging Device . . . Second Aspect>>

A solid-state imaging device having a plurality of the stacked imaging elements according to [C01].

[E01]<<Method of Driving Solid-State Imaging Device>>

A method of driving solid-state imaging device, in which the solid-state imaging device has a plurality of imaging elements structured such that:

the imaging elements each have a photoelectric conversion section formed by stacking a second electrode, a photoelectric conversion layer, and a first electrode, the photoelectric conversion section further has a charge accumulation electrode that is disposed to be apart from the second electrode and that is disposed to be opposed to the photoelectric conversion layer via an insulating film, and light is incident from the first electrode side and not incident on the second electrode, and in which the method repeats steps of:

simultaneously emitting charges in the second electrode to an outside while accumulating the charges in the photoelectric conversion layer in all the imaging elements; and then simultaneously transferring the charges accumulated in the photoelectric conversion layer to the second electrode in all the imaging elements, and sequentially reading the charges transferred to the second electrode in each of the imaging elements after completion of transfer.

REFERENCE SIGNS LIST

11 . . . First electrode, 12 . . . Second electrode, 12', 12" . . . ITO layer, 13 . . . Photoelectric conversion layer, 13*a* . . . Lower semiconductor layer, 13*b* . . . Upper photoelectric conversion layer, 14 . . . Charge accumulation electrode, 14A, 14B, 14C . . . Charge accumulation electrode segment, 15, 15A, 15B . . . Transfer control electrode (charge transfer electrode), 16 . . . Charge emitting electrode, 41 . . . n-type semiconductor region configuring second imaging element, 43 . . . n-type semiconductor region configuring third imaging element, 42, 44, 73 . . . $p^+$ layer, $FD_1$, $FD_{21}$, $FD_3$, 45C, 46C . . . Floating diffusion region (floating diffusion layer), $TR_1$ . . . First transistor (amplification transistor), $TR_2$ . . . Second transistor (reset transistor), $TR_3$ . . . Third transistor (selection transistor), $TR\mathbf{1}_{amp}$ . . . Amplification transistor, $TR\mathbf{1}_{rst}$ . . . Reset transistor, $TR\mathbf{1}_{sel}$ . . . Selection transistor, 51 . . . Gate section (third electrode) of reset transistor $TR\mathbf{1}_{rst}$, 51A . . . Channel formation region of reset transistor $TR\mathbf{1}_{rst}$, 51B . . . Source/drain section (source/drain region, source/drain electrode, second electrode) of reset transistor $TR\mathbf{1}_{rst}$, 51C . . . Source/drain section (source/drain region, source/drain electrode, fourth electrode) of reset transistor $TR\mathbf{1}_{rst}$, 51D . . . Gate insulating film of reset transistor $TR\mathbf{1}_{rst}$, 52 . . . Gate section of amplification transistor $TR\mathbf{1}_{amp}$, 52A . . . Channel formation region of amplification transistor $TR\mathbf{1}_{amp}$, 52B . . . Source/drain section (source/drain region, source/drain electrode, fifth electrode) of amplification transistor $TR\mathbf{1}_{amp}$, 52C . . . Source/drain section (source/drain region, source/drain electrode, sixth electrode) of amplification transistor $TR\mathbf{1}_{amp}$, 52D . . . Gate insulating film of amplification transistor $TR\mathbf{1}_{amp}$, 53 . . . Gate section of selection transistor $TR\mathbf{1}_{sel}$, 53A . . . Channel formation region of selection transistor $TR\mathbf{1}_{sel}$, 53B, 53C . . . Source/drain region of selection transistor $TR\mathbf{1}_{sel}$ (Source/53D . . . Gate insulating film, drain region, source/drain electrode of selection transistor $TR\mathbf{1}_{sel}$, $TR\mathbf{2}_{trs}$ . . . Transfer transistor, 45 . . . Gate insulating film of transfer transistor, $TR\mathbf{2}_{rst}$ . . . Reset transistor, $TR_{2amp}$ . . . Amplification transistor, $TR\mathbf{2}_{sel}$ . . . Selection transistor, $TR\mathbf{3}_{trs}$ . . . Transfer transistor, 46 . . . Gate section of transfer transistor, $TR\mathbf{3}_{rst}$ . . . Reset transistor, $TR\mathbf{3}_{amp}$ . . . Amplification transistor, $TR\mathbf{3}_{sel}$ . . . Selection transistor, $V_{DD}$ . . . Power supply, $RST_1$, $RST_2$, $RST_3$ . . . Reset line, $SEL_1$, $SEL_2$, $SEL_3$ . . . Selection line, 117, $VSL_1$, $VSL_2$, $VSL_3$ . . . Signal line, $TG_2$, $TG_3$ . . . Transfer gate line, $V_{OA}$, $V_{OT}$, $V_{OU}$ . . . Interconnection, 61 . . . Contact hole section, 62 . . . Interconnection layer, 63, 64, 68A . . . Pad section, 65, 68B . . . Connection hole, 66, 67, 69 . . . Connection section, 70 . . . Semiconductor layer (semiconductor substrate), 70A . . . First surface (front surface) of semiconductor substrate, 70B . . . Second surface (rear surface) of semiconductor substrate, 71 . . . Element isolation region, 72 . . . Oxide film, 74 . . . $HfO_2$ film, 75 . . . Lower-layer insulating film, 76 . . . Interlayer insulating layer, 77, 78, 81 . . . Interlayer insulating layer, 82 . . . Insulating film, 82*a* . . . First surface of insulating film, 82*b* . . . Second surface of insulating film, 82*c* . . . Third surface of insulating film, 83 . . . Protection layer, 84, 84A, 84B, 84C . . . Opening portion, 85, 85A . . . Second opening portion, 90 . . . On-chip microlens, 91 . . . Various imaging element constituent elements located below interlayer insulating layer 81, 92 . . . Light shielding layer, 100 . . . Solid-state imaging device, 101 . . . Stacked imaging element, 111 . . . Imaging region, 112 . . . Vertical drive circuit, 113 . . . Column signal processing circuit, 114 . . . Horizontal drive circuit, 115 . . . Output circuit, 116 . . . Drive control circuit, 118 . . . Horizontal signal line, 200 . . . Electronic apparatus (camera), 201 . . . Solid-state imaging device, 210 . . . Optical lens, 211 . . . Shutter device, 212 . . . Drive circuit, 213 . . . Signal processing circuit

What is claimed is:

1. A light detecting device, comprising:

a semiconductor substrate;

a first photoelectric conversion section disposed above the semiconductor substrate, the first photoelectric conversion section comprising:

a first electrode;

a second electrode; and a first photoelectric conversion layer disposed between the first electrode and the second electrode; and a second photoelectric conversion section disposed above the first photoelectric conversion section, the second photoelectric conversion section comprising:

a third electrode;

a fourth electrode;

a second photoelectric conversion layer disposed between the third electrode and the fourth electrode; and a first transistor electrically coupled to one of the third electrode and the fourth electrode.

2. The light detecting device according to claim 1, wherein the one of the third electrode and the fourth electrode is electrically coupled to one of a source and a drain of the first transistor.

3. The light detecting device according to claim 1, wherein the one of the third electrode and the fourth electrode is electrically coupled to a gate of the first transistor.

4. The light detecting device according to claim 1, wherein the second photoelectric conversion section comprises a semiconductor layer, and wherein a part of the semiconductor layer is a channel formation region of the first transistor.

5. The light detecting device according to claim 4, wherein the semiconductor layer comprises an oxide semiconductor.

6. The light detecting device according to claim 5, wherein the oxide semiconductor comprises indium, gallium, and zinc.

7. The light detecting device according to claim 1, wherein the first transistor is disposed between the first photoelectric conversion section and the other of the third electrode and the fourth electrode of the second photoelectric conversion section.

8. The light detecting device according to claim 1, further comprising a third photoelectric conversion section.

9. The light detecting device according to claim 8, wherein the first photoelectric conversion section, the second photoelectric conversion section, and the third photoelectric conversion section are stacked in this order, with the first photoelectric conversion section on a light incident side of the light detecting device.

10. The light detecting device according to claim 8, wherein the first photoelectric conversion section is of a first type, the second photoelectric conversion section is of the first type, and the third photoelectric conversion section is of a second type.

11. The light detecting device according to claim 10, wherein the third photoelectric conversion section is formed in the semiconductor substrate.

12. The light detecting device according to claim 10, wherein the first photoelectric conversion section is sensitive to blue light, the second photoelectric conversion section is sensitive to green light, and the third photoelectric conversion section is sensitive to red light.

13. The light detecting device according to claim 10, wherein control sections are provided in the semiconductor substrate.

* * * * *